US008889570B2

(12) United States Patent
Matsumura et al.

(10) Patent No.: US 8,889,570 B2
(45) Date of Patent: Nov. 18, 2014

(54) LIGHT-TRANSMITTING ELECTROMAGNETIC-SHIELDING LAMINATE AND METHOD FOR PRODUCING THE SAME, LIGHT-TRANSMITTING RADIO WAVE ABSORBER, AND ADHESIVE COMPOSITION

(75) Inventors: Takatoshi Matsumura, Tokyo (JP); Noboru Ohtani, Tokyo (JP); Yoshiyuki Masuda, Tokyo (JP); Masahiko Ishikawa, Tokyo (JP); Yoshiya Kimura, Tokyo (JP); Kyoko Nishizaki, Tokyo (JP); Yoshitaka Masuda, Tokyo (JP)

(73) Assignee: Mitsubishi Gas Chemical Company, Inc, Tokyo (JP)

( * ) Notice: Subject to any disclaimer, the term of this patent is extended or adjusted under 35 U.S.C. 154(b) by 1046 days.

(21) Appl. No.: 12/529,023

(22) PCT Filed: Mar. 11, 2008

(86) PCT No.: PCT/JP2008/054843
§ 371 (c)(1),
(2), (4) Date: Feb. 25, 2010

(87) PCT Pub. No.: WO2008/114764
PCT Pub. Date: Sep. 25, 2008

(65) Prior Publication Data
US 2010/0147578 A1     Jun. 17, 2010

(30) Foreign Application Priority Data

Mar. 16, 2007  (JP) ................ 2007-068597
Apr. 12, 2007  (JP) ................ 2007-105056
Apr. 12, 2007  (JP) ................ 2007-105057
Apr. 12, 2007  (JP) ................ 2007-105058
Apr. 12, 2007  (JP) ................ 2007-105059
May 15, 2007  (JP) ................ 2007-129180
May 15, 2007  (JP) ................ 2007-129181
May 15, 2007  (JP) ................ 2007-129182
May 15, 2007  (JP) ................ 2007-129183

(51) Int. Cl.
*D03D 9/00*      (2006.01)
*D03D 15/00*     (2006.01)
*D03D 19/00*     (2006.01)
*D04H 13/00*     (2006.01)
*H05K 9/00*      (2006.01)
*C08G 18/77*     (2006.01)
*C09J 167/07*    (2006.01)
*C09J 133/26*    (2006.01)
*C08F 265/04*    (2006.01)
*B32B 27/08*     (2006.01)
*C08F 290/06*    (2006.01)
*C08F 265/06*    (2006.01)
*C09J 175/04*    (2006.01)
*C09J 4/06*      (2006.01)
*C09J 151/00*    (2006.01)
*C08K 5/5435*    (2006.01)
*C08K 5/521*     (2006.01)

(52) U.S. Cl.
CPC  *C09J 4/06* (2013.01); *C09J 167/07* (2013.01);
*C09J 133/26* (2013.01); *C08F 265/04*
(2013.01); *B32B 27/08* (2013.01); *C08K*
*5/5435* (2013.01); *C08F 290/06* (2013.01);
*H05K 9/0096* (2013.01); *C08F 265/06*
(2013.01); *C09J 175/04* (2013.01); *C08F*
*290/061* (2013.01); *C08L 2312/08* (2013.01);
*C08K 5/521* (2013.01); *C09J 151/003*
(2013.01)
USPC .............. 442/6; 442/52; 174/388; 174/389;
524/115

(58) Field of Classification Search
USPC .............. 442/6, 52; 174/388, 389; 524/115
See application file for complete search history.

(56) References Cited

U.S. PATENT DOCUMENTS

| 5,278,009 A * | 1/1994 | Iida et al. ............... 430/7 |
| 6,287,184 B1 * | 9/2001 | Carpentier et al. ........ 451/526 |
| 6,744,480 B2 * | 6/2004 | Kaneko ................ 349/65 |
| 2002/0032251 A1 * | 3/2002 | Ha et al. ............... 522/96 |
| 2003/0186040 A1 * | 10/2003 | Oya ................... 428/304.4 |
| 2003/0205317 A1 | 11/2003 | Ha |
| 2004/0116013 A1 | 6/2004 | Yoshida et al. |
| 2006/0008665 A1 | 1/2006 | Kotsubo et al. |
| 2008/0152857 A1 | 6/2008 | Mizutani et al. |

FOREIGN PATENT DOCUMENTS

| CA | 1337223 | 4/1988 |
| JP | 4-254803 | 9/1992 |
| JP | 7-262619 | 10/1995 |

(Continued)

OTHER PUBLICATIONS

Patent Abstracts of Japan English abstract of JP 2006-316181 A.

(Continued)

*Primary Examiner* — Jeremy R Pierce
(74) *Attorney, Agent, or Firm* — Ladas & Parry LLP

(57) ABSTRACT

Disclosed is a light-transmitting electromagnetic-shielding laminate, which is characterized in that two or more layers including an electromagnetic-shielding layer are arranged in layers using a (meth)acrylate adhesive composition which contains a (meth)acrylate monomer, a (meth)acrylate oligomer and at least one member selected from the group consisting of acrylic amide derivatives, silane compounds and organophosphorus compounds. Also disclosed is a light-transmitting radio wave absorber which is characterized in that a resistive layer, a dielectric spacer and a reflective layer are arranged in layers using a (meth)acrylate adhesive composition which contains a (meth)acrylate monomer, a (meth) acrylate oligomer and at least one member selected from the group consisting of acrylic amide derivatives, silane compounds and organophosphorus compounds.

13 Claims, No Drawings

(56) References Cited

FOREIGN PATENT DOCUMENTS

| | | |
|---|---|---|
| JP | 2000-40896 A | 2/2000 |
| JP | 2002-212538 A | 7/2002 |
| JP | 2003-105043 A | 4/2003 |
| JP | 2003-329837 | 11/2003 |
| JP | 2003-337544 A | 11/2003 |
| JP | 2006-10446 A | 4/2006 |
| JP | 2006-152267 A | 6/2006 |
| JP | 2006-316181 A | 11/2006 |
| KR | 1996-0015811 | 11/1996 |
| WO | 2004/070737 A1 | 8/2004 |
| WO | 2006/044369 A1 | 4/2006 |

OTHER PUBLICATIONS

Extended European Search Report Issued in European Application No. 08722239.4 on Feb. 1, 2011.
Patent Abstracts of Japan of JP 2003-329837 dated Nov. 19, 2003.
Patent Abstracts of Japan of JP 4-254803 dated Sep. 10, 1992.
Patent Abstracts of Japan of JP 7-262619 dated Oct. 13, 1995.
Patent Abstracts of Japan English abstract of JP 2003-105043 A.
Patent Abstracts of Japan English abstract of JP 2006-152267 A.
Patent Abstracts of Japan English abstract of JP 2002/212538 A.
Patent Abstracts of Japan English abstract of JP 2000-40896 A.

* cited by examiner

LIGHT-TRANSMITTING ELECTROMAGNETIC-SHIELDING LAMINATE AND METHOD FOR PRODUCING THE SAME, LIGHT-TRANSMITTING RADIO WAVE ABSORBER, AND ADHESIVE COMPOSITION

TECHNICAL FIELD

One embodiment of the present invention is directed to a light-transmitting electromagnetic-shielding laminate and a method for producing the same. In the field of the light-transmitting electromagnetic-shielding laminate required to have good transparency and visibility, a preferable embodiment of the present invention is directed to a light-transmitting electromagnetic-shielding laminate which comprises at least two layers including an electromagnetic wave-shielding layer, and is superb in humidity resistance, water resistance, processability, adhesive force and weather resistance; and a method for producing the same. Such a light-transmitting electromagnetic-shielding laminate does not become cloudy or does not cause peeling when being exposed to a high temperature and high humidity condition or immersed in warm water for a long time; prevents long-term deterioration, such as yellowing, peeling of the laminate body, deterioration of the electromagnetic-shielding performance or the like which is caused by quality deterioration due to the environment of being exposed to wind and rain or ultraviolet of sunlight for a long time; and has a sufficient adhesive force to protect the laminate body against peeling when being processed with cutting, drilling or the like.

Another embodiment of the present invention is directed to a light-transmitting radio wave absorber. In the field of the light-transmitting radio wave absorber required to have good visibility, a preferable embodiment of the present invention is directed to a light-transmitting radio wave absorber which comprises, as indispensable elements, a resisting layer, a dielectric spacer, and a reflecting layer, and is superb in humidity resistance, water resistance, processability, adhesive force and weather resistance. Such a light-transmitting radio wave absorber does not become cloudy when being exposed to a high temperature and high humidity condition; prevents long-term deterioration, such as yellowing, peeling of the laminate body, deterioration of the radio wave absorbing performance or the like which is caused by quality deterioration due to the environment of being exposed to wind and rain or ultraviolet of sunlight for a long time; and has a sufficient adhesive force to protect the laminate body against peeling when being processed with cutting, drilling or the like.

Still another embodiment of the present invention is directed to an adhesive composition. In the field of the adhesive composition required to have good transparency or visibility, a preferable embodiment of the present invention is directed to an adhesive composition which is superb in humidity resistance, water resistance, weather resistance, processability, adhesive force, and transparency. Such an adhesive composition does not become cloudy or does not cause peeling when being exposed to a high temperature and high humidity condition or immersed in warm water for a long time; prevents long-term deterioration, such as yellowing, peeling of the laminate body, or the like which is caused by quality deterioration due to the environment of being exposed to wind and rain or ultraviolet of sunlight for a long time; and has a sufficient adhesive force to protect the laminate body against peeling when being processed with cutting, drilling or the like.

BACKGROUND ART (1) Recently, radio waves generated from electronic devices such as personal computers, mobile phones, flat panel displays such as liquid crystal displays and plasma displays, touch panels, car navigation systems, mobile information terminals, mobile game devices and the like cause malfunction and communication failure of other machines or electronic devices, which is a serious problem. In addition, it has been indicated that radio waves have a harmful effect on the human body. In order to prevent the so-called electromagnetic interference (hereinafter, referred to as the "EMI"), measures are taken by using various electromagnetic wave-shielding materials. However, light-transmitting electromagnetic wave-shielding laminate bodies are often used outdoors under severe conditions and cannot be practically used unless fulfilling various performance requirements other than the electromagnetic wave-shielding performance.

For example, there are the following problems. The car navigation systems used in vehicles, mobile phones, mobile information terminals, mobile game devices and the like need to be used in a high temperature and high humidity condition. Therefore, in the case where the layers are laminated with a usual adhesive, the adhesive itself becomes cloudy by hydrolysis, or water vapor enters an interface between the adhesive and the layers to be bonded and becomes cloudy. Therefore, the transparency and visibility cannot be obtained. Liquid crystal displays and plasma displays for advertisement, displays of vending machines and ticket machines, and the like used outdoors are yellowed or cause peeling to the laminate body thereof due to long-term deterioration by ultraviolet or rainwater. Therefore, the transparency and visibility are lowered. In addition, when the light-transmitting electromagnetic-shielding laminate is drilled or cut in order to be attached to various electronic devices, an end surface of the laminate body is peeled.

As an adhesive for lamination of a light-transmitting electromagnetic-shielding laminate, Japanese Laid-Open Patent Publications Nos. 2001-26758 and 2001-19925 describe adhesive compositions having an ethylene-vinyl acetate (EVA) copolymer adhesive composition or a copolymer of ethylene, vinyl acetate and/or a (meth)acrylate-based monomer as main components. These adhesive compositions all have inconveniences that the compositions become cloudy under a high temperature and high humidity condition and so the visibility cannot be obtained, peeling is caused to the laminate body due to rainwater, the adhesive force is weak and so an end surface of the laminate body is peeled at the time of drilling or cutting.

As an adhesive for a light-transmitting electromagnetic-shielding laminate, Japanese Laid-Open Patent Publication No. 2004-140283 describes a hotmelt-type adhesives of an ethylene-vinyl acetate (EVA) copolymer or an ethylene-acrylic acid ester copolymer. Such an adhesive has the following problems. In a high temperature and high humidity condition, the adhesive itself becomes cloudy, or water or moisture enters between the substrate and the adhesive and so condenses to become cloudy. As a result, the visibility is significantly lowered. In addition, because the adhesive force is insufficient, an end surface of the laminate body is peeled at the time of drilling or cutting.

As an adhesive for a light-transmitting electromagnetic-shielding laminate, Japanese Laid-Open Patent Publications Nos. 2006-319251 and 10-163673 describe acrylic-based, rubber-based, silicone-based, polyurethane-based, and polyester-based transparent tacky agents. Because such a tacky agent does not have a sufficient adhesive force, the following problems occur. In a high temperature and high humidity condition, water or moisture enters between the substrate and the tacky agent and so condenses to become cloudy. As a result, the visibility is significantly lowered. In addition, an end surface of the laminate body is peeled at the time of drilling or cutting.

As an adhesive for a light-transmitting electromagnetic-shielding laminate, Japanese Laid-Open Patent Publication No. 11-330778 describes an urethane-based adhesive. Although having a certain degree of adhesive force, the urethane-based adhesive becomes cloudy in a high temperature and high humidity condition, and so the visibility is significantly lowered. This publication does not disclose any detailed composition of the adhesive or any explanation or example of the processability of the adhesive.

(2) Recently, the development of wireless communication systems such as mobile phones, wireless LAN (Local Area Network), ITS (Intelligent Transport Systems) and the like has realized interactive large capacity communication. Such technologies are being rapidly spread in the daily life and industries. In ETC (Electronic Toll Collection) systems and AHS (Advanced Cruise-Assist Highway Systems) provided for the purpose of solving the traffic jam at the freeway toll gates or improving the convenience through the cashless system, DSRC (Dedicated Short-Range Communication) systems are used for performing radio wave communication between a roadside unit installed on the road and an onboard unit mounted on a vehicle. Such a system is expected to be used for payment at in gas stations, fast food stores, car parks and the like in addition to be used on the road.

Along with the spreading of these technologies, noise generation, line crossing, communication error, malfunction, information leakage and the like occur as social problems. In order to solve these problems, radio wave absorbers for absorbing unnecessary radio waves are installed. Conventional radio wave absorbers are non-light-transmitting or do not transmit sufficient light, and so are only usable in limited sites.

In airports, train stations, offices, hospitals and the like, a light-transmitting radio wave absorber, which is superb in radio wave absorbing performance and weather resistance and improves the indoor and outdoor radio wave environment, is required in order to prevent noise generation, line crossing, communication error, malfunction and information leakage without spoiling the scenic view or lighting. At the freeway tool gates, and cashiers of the gas stations, fast food stations, car parks and the like, communication failures such as line crossing, communication error, and the like need to be solved. In addition, at the toll gates, poor visibility involves a possibility of causing serious accidents such as minor collisions between vehicles. In the gas stations and car parks, poor visibility involves a possibility of causing serious accidents such as collisions between humans and vehicles. In these circumstances, a light-transmitting radio wave absorber which is superb in visibility in addition to radio wave absorbing performance and weather resistance is required.

However, light-transmitting radio wave absorbers are often used outdoors under severe conditions and cannot be practically used unless fulfilling various performance requirements. For example, there are the following problems. In the case where the layers are laminated with a usual adhesive, a radio wave absorber becomes cloudy in a high temperature and high humidity condition, and so the visibility cannot be obtained. In addition, the radio wave absorber is yellowed or causes peeling to the laminate body thereof due to long-term deterioration by ultraviolet or rainwater. Therefore, the transparency and visibility are lowered. Moreover, when the laminate body of the radio wave absorber is drilled or cut for installation, an end surface thereof is peeled.

As an adhesive for lamination of a light-transmitting radio wave absorber, Japanese Laid-Open Patent Publication No. 2003-324300 describes EVA (ethylene-vinyl acetate copolymer), PVB (polyvinylbutyral), urethane-based, and epoxy-based adhesives. These adhesives all have the inconveniences of becoming cloudy under a high temperature and high humidity condition or causing peeling to the laminate body due to rainwater. This publication also describes denatured polyethylene and denature polypropylene, but all these materials have problems in adhesive force, and so an end surface of the laminate body is peeled at the time of drilling or cutting by a jigsaw.

As an adhesive for a light-transmitting radio wave absorber, Japanese Laid-Open Patent Publications Nos. 2000-59068, 2000-174545, and 2005-85966 describe an acrylic-based tacky agent. However, in a high temperature and high humidity condition, water or moisture enters between the substrate and the tacky agent and so condenses to become cloudy. As a result, the visibility is significantly lowered. In addition, because such a tacky agent does not have a sufficient adhesive force, the problem that, for example, an end surface of the laminate body is peeled at the time of drilling or cutting by a jigsaw occurs.

As an adhesive for a light-transmitting radio wave absorber, Japanese Laid-Open Patent Publication No. 9-186486 describes a (meth)acrylic-based ultraviolet-curable adhesive. Such a usual (meth)acrylic-based ultraviolet-curable adhesive becomes cloudy in a high temperature and high humidity condition and so the visibility is lowered, and also has a weak adhesive force and so causes an end surface of the laminate body to be peeled at the time of drilling or cutting by a jigsaw. This publication does not disclose any detailed composition of the adhesive or any explanation or example of the processability of the adhesive.

(3) In today's society, a light-transmitting resin laminate material is used in various sites such as, for example, flat panel displays of liquid crystal display devices or plasma display devices; displays of touch panels, car navigation systems, mobile phones, mobile game devices and the like; optical storage mediums such as MOs (magneto-optic discs), DVDs (digital versatile discs), Blu-ray discs, and the like; optical materials such as polarizing films and lenses, etc.; construction materials such as carports, light-transmitting resin sound-proof walls, materials for windows with security equipment, and the like; and light-transmitting radio wave absorbing laminate bodies used to prevent communication errors of ETC (Electronic Toll Collection) systems and DSRC (Dedicated Short-range Communication) systems for performing radio wave communication between a roadside unit installed on the road and an onboard unit mounted on a vehicle. However, light-transmitting resin laminate bodies are often used outdoors under severe conditions and cannot be practically used unless fulfilling various performance requirements.

For example, there are the following problems. The car navigation systems used in vehicles, mobile phones, mobile game devices, DVDs, Blu-ray discs and the like need to be used in a high temperature and high humidity condition. Therefore, in the case where the layers are laminated with a usual adhesive, the adhesive itself becomes cloudy by hydrolysis, or water vapor enters an interface between the adhesive and the layers to be bonded and becomes cloudy. Therefore, the transparency and visibility cannot be obtained. Carports, light-transmitting sound-proof walls, materials for windows with security equipment, light-transmitting radio wave absorbing laminate bodies, and the like used outdoors are yellowed or cause peeling to the laminate body thereof due to long-term deterioration by ultraviolet or rainwater. Therefore, the visibility and functionality are lowered. In addition, an end surface of the laminate body is peeled at the time of drilling or cutting.

As an adhesive for an optical disc laminate body, Japanese Laid-Open Patent Publication No. 2000-186253 describes a photo-curable adhesive containing a radical polymerizable vinyl compound, a specific (meth)acrylate compound and a radical polymerization initiator. Japanese Laid-Open Patent Publication No. 2003-196884 describes an ultraviolet-curable adhesive composition containing a mono-functional (meth)acrylate including a branching alkoxyl group having a carbon number of 4 or greater and a photoinitiator. These adhesives all have problems of being hydrolyzed when immersed in warm water and so becoming cloudy to significantly lower the visibility, and having an insufficient adhesive force and so causing an end surface of the laminate body to be peeled at the time of drilling or cutting by a jigsaw. For these problems, these adhesives cannot be used as an adhesive for lamination of an light-transmitting resin laminate body.

As an adhesive for an optical element laminate body, PCT National Phase Japanese Laid-Open Patent Publication No. 2006-522856 describes a pressure-sensitive adhesive composition containing (meth)acrylamide and an alkoxysilane compound. Although the high temperature and high humidity resistance is improved, the adhesive does not have a sufficient adhesive force because of being the pressure-sensitive type, and so has a problem that an end surface of the laminate body is peeled at the time of processing. For these reasons, this adhesive cannot be used as an adhesive for lamination of an light-transmitting resin laminate body.

As an adhesive for an optical disc laminate body, Japanese Laid-Open Patent Publication No. 2006-104446 describes an adhesive composition containing bisphenol-type epoxy (meth)acrylate, di(meth)acrylate, a photoinitiator and (meth) acrylate phosphate. Although the high temperature and high humidity resistance is improved, the adhesive does not have a sufficient adhesive force, and so an end surface of the laminate body is peeled at the time of processing. In addition, there is a problem that because bisphenol type epoxy (meth) acrylate is used, the adhesive itself is yellowed to spoil the external appearance when being used outdoors at a site exposed to ultraviolet.

As an adhesive for lamination of a transparent radio wave absorber, Japanese Laid-Open Patent Publication No. 2003-324300 describes EVA (ethylene-vinyl acetate copolymer), PVB (polyvinylbutyral), urethane-based, and epoxy-based adhesives. These adhesives all have the inconveniences of becoming cloudy under a high temperature and high humidity condition or causing peeling to the laminate body due to rainwater. This publication also describes denatured polyethylene and denature polypropylene, but all these materials have problems in adhesive force, and so an end surface of the laminate body is peeled at the time of drilling or cutting by a jigsaw.

DISCLOSURE OF THE INVENTION

The present invention has an object of providing a light-transmitting electromagnetic-shielding laminate and a method for producing the same, which can solve at least one of the above-described problems of the conventional art. In the field of the light-transmitting electromagnetic-shielding laminate required to have good transparency and visibility, the present invention also has an object of providing a light-transmitting electromagnetic-shielding laminate which includes at least two layers which including an electromagnetic wave-shielding layer and is superb in humidity resistance, water resistance, weather resistance, processability, adhesive force, and transparency. Such a light-transmitting electromagnetic-shielding laminate does not become cloudy in a high temperature and high humidity condition; prevents long-term deterioration, such as yellowing, peeling of the laminate body, deterioration of the functionality or the like which is caused by quality deterioration due to the environment of being exposed to wind and rain or ultraviolet of sunlight for a long time; and has a sufficient adhesiveness to protect the laminate body against peeling when being processed with cutting, drilling or the like.

The present invention also has an object of providing a light-transmitting radio wave absorber which can solve at least one of the above-described problems of the conventional art. In the field of the light-transmitting radio wave absorber required to have good transparency and visibility, the present invention also has an object of providing a light-transmitting radio wave absorber which comprises, as indispensable elements, a resisting layer, a dielectric spacer, and a reflecting layer, and is superb in humidity resistance, water resistance, weather resistance, processability, adhesive force, and transparency. Such a light-transmitting radio wave absorber does not become cloudy in a high temperature and high humidity condition; prevents long-term deterioration, such as yellowing, peeling of the laminate body, deterioration of the functionality or the like which is caused by quality deterioration due to the environment of being exposed to wind and rain or ultraviolet of sunlight for a long time; and has a sufficient adhesiveness to protect the laminate body against peeling when being processed with cutting, drilling or the like.

The present invention also has an object of providing an adhesive composition which can solve at least one of the above-described problems of the conventional art. The present invention also has an object of providing an adhesive composition, used for a light-transmitting electromagnetic-shielding laminate required to have good transparency or visibility, which is superb in humidity resistance, water resistance, weather resistance, processability, adhesive force and transparency. Such an adhesive composition does not become cloudy in a high temperature and high humidity condition; prevents long-term deterioration, such as yellowing, peeling of the laminate body, deterioration of the functionality or the like which is caused by quality deterioration due to the environment of being exposed to wind and rain or ultraviolet of sunlight for a long time; and has a sufficient adhesiveness to protect the laminate body against peeling when being processed with cutting, drilling or the like.

As a result of active studies for solving the above-described problems, the present inventors found that the above-described problems can be solved by a light-transmitting electromagnetic-shielding laminate, wherein two or more layers including an electromagnetic wave-shielding layer are laminated by a (meth)acrylate-based adhesive composition comprising a (meth)acrylate monomer, a (meth)acrylate oligomer, and at least one selected from the group consisting of an acrylamide derivative, a silane compound and an organic phosphorus compound; and thus completed the present invention.

The present inventors found that the above-described problems can be solved by a light-transmitting radio wave absorber, wherein a resisting layer, a dielectric spacer, and a reflecting layer are laminated by a (meth)acrylate-based adhesive composition comprising a (meth)acrylate monomer, a (meth)acrylate oligomer, and at least one selected from the group consisting of an acrylamide derivative, a silane compound and an organic phosphorus compound; and thus completed the present invention.

The present inventors found that the above-described problems can be solved by a (meth)acrylate-based adhesive composition, comprising a (meth)acrylate monomer, a (meth)acrylate oligomer, an acrylamide derivative, and a silane compound and/or and an organic phosphorus compound; and thus completed the present invention.

Namely, one embodiment of the present invention is directed to a light-transmitting electromagnetic-shielding laminate, wherein two or more layers including an electromagnetic wave-shielding layer are laminated by a (meth)acrylate-based adhesive composition comprising a (meth)acrylate monomer, a (meth)acrylate oligomer, and at least one selected from the group consisting of an acrylamide derivative, a silane compound and an organic phosphorus compound.

For the above-described embodiment, the following embodiments are preferable: (1) an embodiment in which the light-transmitting electromagnetic-shielding laminate is optically transparent and visible even after being subjected to a high temperature and high humidity treatment under the conditions of 85° C. and 85% RH for 2000 hours; (2) an embodiment in which the light-transmitting electromagnetic-shielding laminate is optically transparent and visible even after being subjected to a high temperature and high humidity treatment under the conditions of 85° C. and 85% RH for 1000 hours; (3) an embodiment in which the light-transmitting electromagnetic-shielding laminate is optically transparent and visible even after being subjected to a high temperature and high humidity treatment under the conditions of 85° C. and 95% RH for 250 hours; and (4) an embodiment in which the light-transmitting electromagnetic-shielding laminate is optically transparent and visible even after being subjected to a high temperature and high humidity treatment under the conditions of 85° C. and 85% RH for 24 hours; (5) an embodiment in which the light-transmitting electromagnetic-shielding laminate is optically transparent and visible even after being immersed in warm water under the condition of 80° C. for 250 hours; (6) an embodiment in which the light-transmitting electromagnetic-shielding laminate is optically transparent and visible even after being immersed in warm water under the condition of 80° C. for 24 hours; (7) an embodiment in which the light-transmitting electromagnetic-shielding laminate has a T-peel strength equal to or greater than 5 N/25 mm width; (8) an embodiment in which the acrylamide derivative is alkylacrylamide and/or alkylmethacrylamide; (9) an embodiment in which the acrylamide derivative is at least one selected from dimethylacrylamide, isopropylacrylamide, diethylacrylamide, and 4-acrylomorpholine; (10) an embodiment in which the silane compound is at least one selected from amino functional silane, epoxy functional silane, vinyl functional silane, mercapto functional silane, methacrylate functional silane, acrylamide functional silane, and acrylate functional silane; (11) an embodiment in which the silane compound is (3-(2,3-epoxypropoxy)propyl) trimethoxysilane; (12) an embodiment in which the organic phosphorus compound is an acrylate phosphate compound; (13) an embodiment in which the light-transmitting electromagnetic-shielding laminate has an adhesive force which does not cause a peeling phenomenon at the time of drilling; (14) an embodiment in which the (meth)acrylate oligomer is at least one (meth)acrylate oligomer selected from urethane (meth)acrylate oligomer, polyester (meth)acrylate oligomer, epoxy (meth)acrylate oligomer, and polyol (meth)acrylate oligomer; (15) an embodiment in which the urethane (meth)acrylate oligomer is an alicyclic hydrocarbon compound; (16) an embodiment in which the alicyclic hydrocarbon compound is a compound derived from dicyclohexylmethaneisocyanate; (17) an embodiment in which the (meth)acrylate-based adhesive composition is a solvent-free (meth)acrylate-based adhesive composition; (18) an embodiment in which the (meth)acrylate-based adhesive composition is a photocurable (meth)acrylate-based adhesive composition which is curable by visible light, ultraviolet (UV) or electron beam (EB); (19) an embodiment in which the (meth)acrylate-based adhesive composition is a thermosetting or hotmelt-type (meth)acrylate-based adhesive composition; (20) an embodiment in which a protecting layer is provided on or both of surfaces of the electromagnetic wave-shielding layer; (21) an embodiment in which a conductive compound of the electromagnetic wave-shielding layer uses a metal compound containing at least one metal component selected from silver, copper, aluminum, nickel, carbon, ITO (indium oxide/tin oxide), tin, zinc, titanium, tungsten, and stainless steel; (22) an embodiment in which the electromagnetic wave-shielding layer is either one of a metal thin film mesh, a metal fabric mesh, a conductive fiber mesh, and a conductive printing mesh; (23) an embodiment in which the electromagnetic wave-shielding layer has an electromagnetic wave-shielding performance of 30 decibel or greater; (24) an embodiment in which a base substrate of each of the metal thin film mesh and the conductive printing mesh contains either one light-transmitting organic polymer material among a polycarbonate resin, a polyethylene terephthalate resin, and a polyester resin; (25) an embodiment in which the light-transmitting electromagnetic-shielding laminate has, on one or both of surfaces thereof, a cover film containing at least one of an antioxidant, an ultraviolet absorber, and a photostabilizer; (26) an embodiment in which the cover film is formed on an acrylic resin layer laminated by coextrusion; (27) an embodiment in which the cover film contains a thermosetting or photo-curable resin; (28) an embodiment in which the cover film contains an acrylic-based resin compound or a silicone-based resin compound; (29) an embodiment in which the light-transmitting electromagnetic-shielding laminate comprises the electromagnetic wave-shielding layer, a protecting layer, and an adhesive layer, wherein at least one of the layers contains at least one of an antioxidant, an ultraviolet absorber, and a photostabilizer; (30) an embodiment in which the light-transmitting electromagnetic-shielding laminate contains light-transmitting glass or a light-transmitting organic polymer material; and (31) an embodiment in which the light-transmitting organic polymer material contains at least one selected from a polycarbonate resin, a polyethylene terephthalate resin, and a polyester resin.

Another embodiment of the present invention is directed to a shielding material for an electronic device comprising the above-described light-transmitting electromagnetic-shielding laminate, a shielding material for a display comprising the above-described light-transmitting electromagnetic-shielding laminate, and a shielding material for a car navigation system comprising the above-described light-transmitting electromagnetic-shielding laminate.

Still another embodiment of the present invention is directed to a method for producing a light-transmitting electromagnetic-shielding laminate comprising laminating two or more layers including an electromagnetic wave-shielding layer by using a (meth)acrylate-based adhesive composition comprising a (meth)acrylate monomer, a (meth)acrylate oligomer, and at least one selected from the group consisting of an acrylamide derivative, a silane compound and an organic phosphorus compound.

Still another embodiment of the present invention is directed to a light-transmitting radio wave absorber, wherein a resisting layer, a dielectric spacer, and a reflecting layer are laminated by a (meth)acrylate-based adhesive composition comprising a (meth)acrylate monomer, a (meth)acrylate oligomer, and at least one selected from the group consisting of an acrylamide derivative, a silane compound and an organic phosphorus compound.

For the above-described embodiment, the following embodiments are preferable: (1) an embodiment in which the acrylamide derivative is alkylacrylamide and/or alkylmethacrylamide; (2) an embodiment in which the acrylamide derivative is at least one selected from dimethylacrylamide, isopropylacrylamide, diethylacrylamide, and 4-acrylomorpholine; (3) an embodiment in which the silane compound is at least one selected from amino functional silane, epoxy functional silane, vinyl functional silane, mercapto functional silane, methacrylate functional silane, acrylamide functional silane, and acrylate functional silane; (4) an embodiment in which the silane compound is (3-(2,3-epoxypropoxy)propyl)trimethoxysilane; (5) an embodiment in which the organic phosphorus compound is a (meth)acrylate phosphate compound; (6) an embodiment in which the (meth)acrylate oligomer is at least one selected from urethane (meth)acrylate oligomer, polyester (meth)acrylate oligomer, epoxy (meth)acrylate oligomer, and polyol (meth)acrylate oligomer; (7) an embodiment in which the urethane (meth)acrylate oligomer contains an alicyclic hydrocarbon compound; (8) an embodiment in which the alicyclic hydrocarbon compound is a compound derived from dicyclohexylmethaneisocyanate; (9) an embodiment in which the (meth)acrylate-based adhesive composition is a solvent-free (meth)acrylate-based adhesive composition; (10) an embodiment in which (meth)acrylate-based adhesive composition is a photo-curable (meth)acrylate-based adhesive composition which is curable by visible light, ultraviolet (UV) or electron beam (EB); (11) an embodiment in which the (meth)acrylate-based adhesive composition is a thermosetting or hotmelt-type (meth)acrylate-based adhesive composition; (12) an embodiment in which the light-transmitting radio wave absorber includes a protecting layer provided on the resisting layer and/or the reflecting layer; (13) an embodiment in which the light-transmitting radio wave absorber is a λ/4-type radio wave absorber; (14) an embodiment in which the light-transmitting radio wave absorber is a pattern-type radio wave absorber; (15) an embodiment in which a conductive pattern of a pattern layer is formed of a loop, circular, quadrangular or polygonal pattern; (16) an embodiment in which the conductive pattern of the pattern layer is formed of a loop, circular, quadrangular or polygonal pattern, and each pattern is different from an adjacent pattern in at least one of size and shape; (17) an embodiment in which the resisting layer uses a metal compound containing at least one metal component selected from silver, copper, aluminum, carbon, ITO (indium oxide/tin oxide), tin oxide, zinc oxide, and titanium nitride; (18) an embodiment in which the reflecting layer uses a metal compound containing at least one metal component selected from silver, copper, aluminum, carbon, ITO (indium oxide/tin oxide), tin oxide, zinc oxide, and titanium nitride; (19) an embodiment in which the light-transmitting radio wave absorber has, on both of surfaces thereof, a cover film containing at least selected from an antioxidant, an ultraviolet absorber, and a photostabilizer; (20) an embodiment in which the cover film is formed on an acrylic resin layer laminated by coextrusion; (21) an embodiment in which the cover film contains a thermosetting or photo-curable resin; (22) an embodiment in which the cover film contains an acrylic-based resin compound or a silicone-based resin compound; (23) an embodiment in which the light-transmitting radio wave absorber comprises a resisting layer, a dielectric spacer, a reflecting layer, a protecting layer, wherein an adhesive layer, and at least one of the layers contains at least one of an antioxidant, an ultraviolet absorber, and a photostabilizer; (24) an embodiment in which the light-transmitting radio wave absorber contains light-transmitting glass or a light-transmitting organic polymer material; (25) an embodiment in which the light-transmitting organic polymer material contains a polycarbonate resin or a polyethylene terephthalate resin; (26) an embodiment in which the light-transmitting radio wave absorber has, on both surfaces thereof sharing the reflecting layer, a dielectric spacer and a resisting layer and optionally a protecting layer, and an unnecessary radio wave is absorbed on the both surfaces; and (27) an embodiment in which the light-transmitting radio wave absorber is used for absorbing a radio wave of 5.8 GHz band.

Still another embodiment of the present invention is directed to a (meth)acrylate-based adhesive composition comprising a (meth)acrylate monomer, a (meth)acrylate oligomer, an acrylamide derivative, and a silane compound and/or and an organic phosphorus compound.

For the above-described embodiment, the following embodiments are preferable: (1) an embodiment in which the (meth)acrylate oligomer is at least one selected from urethane (meth)acrylate oligomer, polyester (meth)acrylate oligomer, epoxy (meth)acrylate oligomer, and polyol (meth)acrylate oligomer; (2) an embodiment in which the (meth)acrylate oligomer is urethane (meth)acrylate oligomer; (3) an embodiment in which the urethane (meth)acrylate oligomer contains an alicyclic hydrocarbon compound; (4) an embodiment in which the alicyclic hydrocarbon compound is a compound derived from dicyclohexylmethaneisocyanate; (5) an embodiment in which the acrylamide derivative is alkylacrylamide and/or alkylmethacrylamide; (6) an embodiment in which the acrylamide derivative is at least one selected from dimethylacrylamide, isopropylacrylamide, diethylacrylamide, and 4-acrylomorpholine; (7) an embodiment in which the silane compound is at least one selected from amino functional silane, epoxy functional silane, vinyl functional silane, mercapto functional silane, methacrylate functional silane, acrylamide functional silane, and acrylate functional silane; (8) an embodiment in which the silane compound is (3-(2,3-epoxypropoxy)propyl)trimethoxysilane; (9) an embodiment in which the organic phosphorus compound is an acrylate phosphate compound; (10) an embodiment in which the (meth)acrylate-based adhesive composition is a solvent-free (meth)acrylate-based adhesive composition; (11) an embodiment in which the (meth)acrylate-based adhesive composition is of a thermosetting or hotmelt-type; and (12) an embodiment in which the light-transmitting laminate body contains a polycarbonate resin or a polyethylene terephthalate resin.

Still another embodiment of the present invention is directed to an adhesion method, comprising curing a (meth)acrylate-based adhesive composition for a light-transmitting laminate body comprising a (meth)acrylate monomer, a (meth)acrylate oligomer, an acrylamide derivative, a silane compound and/or an organic phosphorus compound using visible light, ultraviolet (UV) or electron beam (EB).

BEST MODE FOR CARRYING OUT THE INVENTION

Hereinafter, the present invention will be described in more detail.

<Light-Transmitting Electromagnetic Wave-Shielding Laminate>

One embodiment of the present invention is directed to a light-transmitting electromagnetic-shielding laminate, wherein two or more layers including an electromagnetic wave-shielding layer are laminated by a (meth)acrylate-based adhesive composition comprising a (meth)acrylate monomer, a (meth)acrylate oligomer, and at least one selected from the group consisting of an acrylamide derivative, a silane compound and an organic phosphorus compound; and a method for producing the same. A preferable embodiment of the present invention is directed to a light-transmitting electromagnetic-shielding laminate which is superb in humidity resistance, water resistance, weather resistance, processability, adhesive force and transparency.

A light-transmitting electromagnetic-shielding laminate according to the present invention includes a laminate body having two or more layers including an electromagnetic wave-shielding layer for preventing a flow-out of an electromagnetic wave generated from an electronic device, and may include a protecting layer on one or both of the surfaces of the electromagnetic wave-shielding layer from the points of view of impact resistance, abrasion resistance, weather resistance, water resistance, protection against humidity, antifogging, anti-reflection, contamination resistance and the like. In more detail, the present invention encompasses light-transmitting electromagnetic wave-shielding laminate bodies of all the laminate types, which use an electromagnetic wave-shielding layer formed of a metal thin film mesh, a metal fabric mesh, a conductive fiber mesh, or a conductive printing mesh using a conductive compound.

The electromagnetic wave-shielding performance of the electromagnetic wave-shielding layer is preferably 30 decibel or higher. Where the electromagnetic wave-shielding performance is equal to or less than 30 decibel, the flow-out of the electromagnetic wave generated from the electronic device cannot be completely prevented, which may possibly cause malfunction or communication failure of other machines or electronic devices. In addition, invasion of an electromagnetic wave from outside the electronic device cannot be prevented, which may possibly damage the electronic device.

In order to achieve the above-described electromagnetic wave-shielding performance, it is preferable that the surface resistance ratio (sheet resistance value) of the electromagnetic wave-shielding layer is $10[\Omega/\square]$ or less. More preferably, the surface resistance ratio is $1[\Omega/\square]$ or less, and still more preferably, $0.1[\Omega/\square]$ or less.

Regarding the conductive compound used for the electromagnetic wave-shielding layer, there is no specific limitation as long as the compound has conductivity. It is preferable to use a metal compound containing at least one metal component selected from iron, gold, silver, copper, aluminum, nickel, carbon, ITO (indium oxide/tin oxide), tin, zinc, titanium, tungsten, and stainless steel. From the economic point of view, it is more preferable to use a conductive compound containing at least one metal component selected from silver, copper, aluminum, nickel, carbon, tin, and stainless steel.

A metal thin film mesh obtained by any production method is usable with no specific limitation. Examples of the method includes a method of forming a metal thin film of copper, silver, aluminum, ITO (indium oxide/tin oxide) or the like on a film or sheet surface of a light-transmitting organic polymer material by vapor deposition or sputtering; a method of bonding together such metal foils with an adhesive and then forming the metal foils into a mesh by means of etching or the like; a method of applying a plating catalyst-containing ink or paste by gravure printing, inkjet printing, screen printing or the like and then forming the ink or paste into a mesh by electroless plating or electric plating; a method of rolling a metal plate of copper, silver, aluminum or the like to form a metal foil having a predetermined thickness, and punching the metal foil into a mesh; and the like. These types of metal thin film mesh are preferably blackened on one or both of the surfaces from the points of view of water resistance, humidity resistance, corrosion resistance, rust resistance, and anti-reflection. The metal thin film mesh preferably has a line width in the range of 5 to 200 µm, a thickness in the range of 0.01 to 100 µm, and a pitch in the range of 100 to 1000 µm from the points of view of electromagnetic wave-shielding performance and transparency.

A conductive printing mesh obtained by any production method is usable with no specific limitation. The following method is one example. A metal particle compound of copper, silver, aluminum, nickel or the like or carbon is mixed with a binder of an epoxy-based, urethane-based, acrylic-based, EVA-based resin or the like to form an ink or paste. Using this ink or paste, a mesh is formed on a film or sheet surface of a light-transmitting organic polymer material by screen printing, gravure printing, offset printing or the like. The conductive printing mesh preferably has a line width in the range of 10 to 200 µm, a thickness in the range of 1 to 100 µm, and a pitch in the range of 100 to 1000 µm from the points of view of electromagnetic wave-shielding performance and transparency.

Examples of the light-transmitting organic polymer material used for the film or sheet for forming the metal thin film mesh or the conductive printing mesh include polycarbonate resin, polyethylene terephthalate resin, polyester resin, polyethersulfone resin, polyethylene naphthalate resin, polystyrene resin, polyurethane resin, polyvinyl alcohol resin, polymethyl methacrylate resin, alicyclic polyolefin resin, light-transmitting polyimide resin, polyamide resin, acrylic resin, polyacrylonitrile resin, polyvinyl chloride resin, polyvinylidene chloride resin, polypropylene resin, polyethylene resin and the like.

Among these light-transmitting organic polymer materials, polycarbonate resin, polyester resin, and polyethylene terephthalate resin are especially preferable from the points of view of transparency, impact resistance, and versatility of use.

A metal fabric mesh obtained by any production method is usable with no specific limitation. According to an example of the method, a mesh is formed by knitting metal wires of stainless steel, copper, silver, gold, iron or the like. A mesh having a smaller mesh size and a larger diameter of the metal wires has a higher electromagnetic wave-shielding performance but has a lower visibility. Therefore, the mesh size is preferably in the range of 50 to 300 mesh, and the diameter of the metal wires is preferably in the range of 10 to 200 µm. Herein, the mesh size means the mesh size defined by the Taylor sieve.

A conductive fiber mesh obtained by any production method is usable with no specific limitation. According to an example of the method, a synthetic fiber of surface-treated polyester or the like is treated with electroless plating using a conductive metal compound such as nickel, copper or the like, and then blackened. The mesh size is preferable in the range of 50 to 300 mesh, and the diameter of the fiber is preferably in the range of 10 to 100 µm.

An electromagnetic wave-shielding laminate body according to the present invention preferably includes a protecting layer on one or both of the surfaces of the electromagnetic wave-shielding layer from the points of view of impact resistance, abrasion resistance, weather resistance, water resistance, protection against humidity, antifogging, anti-reflection, contamination resistance and the like. The protecting layer may be formed of a visible and light-transmitting material, for example, light-transmitting glass, film or sheet formed of a light-transmitting organic polymer material, or cover film having any of various functions.

Any light-transmitting organic polymer material which is visible and light-transmitting is usable with no specific limitation. The "light-transmitting organic polymer material" encompasses bonded, vapor-deposited, painted, printed or processed materials, such as various metal compounds, conductive compounds, organic compounds, inorganic compounds and the like. Examples of the light-transmitting organic polymer material include polycarbonate resin, polyethylene terephthalate resin, polyester resin, polyether sulfone resin, polyethylene naphthalate resin, polystyrene resin, polyurethane resin, polyvinyl alcohol resin, polymethyl methacrylate resin, alicyclic polyolefin resin, light-transmitting polyimide resin, polyamide resin, acrylic resin, polyacrylonitrile resin, polyvinyl chloride resin, polyvinylidene chloride resin, polypropylene resin, polyethylene resin, and the like.

Among these light-transmitting organic polymer materials, polycarbonate resin and polyethylene terephthalate resin are especially preferable from the points of view of transparency, impact resistance, and versatility of use.

For the cover film, any material is usable with no specific limitation. Preferable materials include silicone resin-based compound having a high durability against long-time use and a relatively high surface hardness, and acrylic resin and polyfunctional acrylic resin, which are easy to be treated and provide a good cover film. The method for curing such a cover film varies in accordance with the properties of the resin compound used. In consideration of the productivity and convenience, it is preferable to select a thermosetting or photo-curable resin. An example of the photo-curable resin is a resin composition formed of a single or a plurality of types of resins such as mono-functional or polyfunctional acrylate monomer, oligomer or the like, to which a photoinitiator is added as a curing catalyst. Examples of the thermosetting resin include polyorganosiloxane-based resin, crosslinked acrylic-based resin, and the like. Such a resin composition is commercially available as a hard coat, and an appropriate type may be selected in consideration of the compatibility with the material of the cover film.

To such a cover film, ultraviolet absorber, photostabilizer, and antioxidant may be added, and optionally, various types of stabilizers such as organic solvent, anti-coloring agent and the like; leveling agent, defoaming agent, thickener, antistatic agent, surfactant such as antifogging agent or like may be optionally added.

For the light-transmitting electromagnetic-shielding laminate according to the present invention, it is preferable to optionally install a ground wire in order to fully provide the shielding performance thereof and prevent a leak of the electromagnetic wave. There is no specific limitation on the method for installing the ground wire. Examples of the method are as follows. According to one method, a metal particle compound of copper, silver, aluminum, nickel or the like or carbon is mixed with a binder of an epoxy-based, urethane-based, acrylic-based, EVA-based resin or the like to form a conductive paste, and this paste is applied to an outer perimeter of an end surface of the light-transmitting electromagnetic-shielding laminate. According to another method, an outer perimeter of an end surface of the light-transmitting electromagnetic-shielding laminate is covered with a conductive tape. These methods may be combined. It is preferable that at least 70% of the outer perimeter of the end surface is covered with the conductive paste or tape. The (meth)acrylate-based adhesive composition used in the present invention is preferably at least one selected from urethane (meth)acrylate-based adhesive composition, polyester (meth)acrylate-based adhesive composition, epoxy (meth)acrylate-based adhesive composition, and polyol (meth)acrylate-based adhesive composition, and more preferably urethane (meth)acrylate-based adhesive composition.

In consideration of the environmental friendliness and ease of handling, the (meth)acrylate-based adhesive composition used in the present invention is preferably a solvent-free (meth)acrylate-based adhesive composition. Preferable examples of the solvent-free (meth)acrylate-based adhesive composition include photo-curable (meth)acrylate-based adhesive composition, thermosetting (meth)acrylate-based adhesive composition, hotmelt-type (meth)acrylate-based adhesive composition, and the like. Among these, photo-curable (meth)acrylate-based adhesive composition which is curable when being irradiated with active energy is especially preferable in terms of curing time and safety. As the active energy, visible light and ultraviolet are preferable.

The (meth)acrylate-based adhesive composition used in the present invention contains a (meth)acrylate monomer, a (meth)acrylate oligomer, and at least one selected from the group consisting of an acrylamide derivative, a silane compound and an organic phosphorus compound. Hereinafter, each component will be described in detail.

[(Meth)Acrylate Monomer]

In the present invention, any of various types of (meth)acrylate monomer ((meth)acrylate-based polymerizable monomer) is usable with no specific limitation. Preferable examples of the (meth)acrylate monomer include mono-, di-, and poly(meth)acrylate compounds of aliphatic alcohol, diol and polyhydric alcohol having a carbon number of 2 to 20; poly(meth)acrylate of hydroxy-terminated compound having a carbon number of 30 or less and having an aliphatic ether bond, an ester bond or a carbonate bond branched by a polyhydric alcohol such as glycerin, trimethylol propane, pentaerythritol or the like and; compound having an alicyclic compound or an aromatic compound in the backbone thereof; and the like. Specific examples thereof include mono-functional (meth)acrylate-based polymerizable monomer having one (meth)acryloyloxy group in one molecule (hereinafter, referred to as the "mono-functional (meth)acrylate monomer"), bi-functional (meth)acrylate-based polymerizable monomer having two (meth)acryloyloxy groups in one molecule (hereinafter, referred to as the "bi-functional (meth)acrylate monomer"), and polyfunctional (meth)acrylate-based polymerizable monomer having at least three (meth)acryloyloxy groups in one molecule (hereinafter, referred to as the "polyfunctional (meth)acrylate monomer"). A single type of, or a combination of two or more types of, the (meth)acrylate monomer is usable.

Specific examples of the mono-functional (meth)acrylate monomer include tetrahydrofurfuryl(meth)acrylate, 2-hydroxyethyl(meth)acrylate, hydroxypropyl(meth)acrylate, 2-hydroxybutyl(meth)acrylate, 2-hydroxy-3-phenoxypropyl (meth)acrylate, isobutyl(meth)acrylate, t-butyl(meth)acrylate, 2-ethylhexyl(meth)acrylate, cyclohexyl(meth)acrylate, dicyclopentenyl(meth)acrylate, benzyl(meth)acrylate, isobornyl(meth)acrylate, phenoxyethyl(meth)acrylate, dicyclopentenyloxyethyl(meth)acrylate, dimethylaminoethyl (meth)acrylate, ethylcarbitol (meth)acrylate, trimethylolpropane mono(meth)acrylate, pentaerythritol mono(meth)acrylate, and phenoxypolyethyleneglycol (meth)acrylate. In addition, examples of carboxyl group-containing (meth)acrylate monomer include 2-(meth)acryloyloxyethylphthalic acid, 2-(meth)acryloyloxyethylhexahydrophthalic acid, carboxyethyl(meth)acrylate, 2-(meth)acryloyloxyethylsuccinic acid, N-(meth)acryloyloxy-N',N'-dicarboxy-p-phenylenediamine, 4-(meth)acryloyloxyethyltrimellitic acid, and the like. The mono-functional (meth)acrylate monomer is not limited to these. The "mono-functional (meth)acrylate monomer" encompasses vinyl-containing monomers such as N-vinylpyrrolidone and the like, and (meth)acryloylamino group-containing monomers such as 4-(meth)acryloylamino-1-carboxymethylpiperidine and the like.

Representative examples of the bi-functional (meth)acrylate monomer include alkyleneglycol di(meth)acrylates, polyoxyalkyleneglycol di(meth)acrylates, halogen-substituted alkyleneglycol di(meth)acrylates, di(meth)acrylate of fatty acid polyol, alkylene oxide-adduct di(meth)acrylates of bisphenol A or bisphenol F, epoxy di(meth)acrylates of bisphenol A or bisphenol F, and the like. The bi-functional (meth)acrylate monomer is not limited to these, and various other materials are usable. Specific examples of the bi-functional (meth)acrylate monomer include ethyleneglycol di(meth)acrylate, 1,3-butanediol di(meth)acrylate, 1,4-butanediol di(meth)acrylate, 1,6-hexanediol di(meth)acrylate, 1,9-nonanediol di(meth)acrylate, neopentylglycol di(meth)acrylate, trimethylolpropane di(meth)acrylate, pentaerythritol di(meth)acrylate, ditrimethylolpropane di(meth)acrylate, diethyleneglycol di(meth)acrylate, triethyleneglycol di(meth)acrylate, dipropyleneglycol di(meth)acrylate, tripropyleneglycol di(meth)acrylate, polyethyleneglycol di(meth)acrylate, polypropyleneglycol di(meth)acrylate, polytetramethyleneglycol di(meth)acrylate, hydroxypivalic acid ester neopentylglycol di(meth)acrylate, 2,2-bis[4-(meth)acryloyloxyethoxyethoxyphenyl]propane, 2,2-bis[4-(meth)acryloyloxyethoxyethoxycyclohexyl]propane, 2,2-bis[4-(meth)acryloyloxyethoxyethoxyphenyl]methane, water-added dicyclopentadienyl di(meth)acrylate, and tris(hydroxyethyl) isocyanurate di(meth)acrylates.

Representative examples of the polyfunctional (meth)acrylate monomer include poly(meth)acrylates of at least trihydric aliphatic polyol such as glycerin tri(meth)acrylate, trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol tetra(meth)acrylate, dipentaerythritol penta(meth)acrylate, dipentaerythritol hexa (meth)acrylate, and the like. Other examples of the poly(meth)acrylate monomer include poly(meth)acrylate of at least trihydric halogen-substituted polyol, glycerin alkylene oxide-adduct tri(meth)acrylate, trimethylolpropane alkylene oxide-adduct tri(meth)acrylate, 1,1,1-tris[(meth)acryloyloxyethoxyethoxy]propane, and tris(hydroxyethyl)isocyanurate tri(meth)acrylates. The poly(meth)acrylate monomer is not limited to these.

[(Meth)Acrylate Oligomer]

Preferable examples of the (meth)acrylate oligomer used in the present invention include at least bi-functional polyfunctional urethane (meth)acrylate oligomer (hereinafter, referred to as the "polyfunctional urethane (meth)acrylate oligomer"), at least bi-functional polyfunctional polyester (meth)acrylate oligomer (hereinafter, referred to as the "polyfunctional polyester (meth)acrylate oligomer"), at least bi-functional polyfunctional epoxy (meth)acrylate oligomer (hereinafter, referred to as the "polyfunctional epoxy (meth) acrylate oligomer"), at least bi-functional polyfunctional polyol (meth)acrylate oligomer (hereinafter, referred to as the "polyfunctional polyol (meth)acrylate oligomer"), and the like. A single type of, or a combination of two or more types of, the (meth)acrylate oligomer is usable.

An example of the polyfunctional urethane (meth)acrylate oligomer is a urethanization reaction product of an isocyanate compound obtained by reacting a polyol with polyisocyanate and a (meth)acrylate monomer having at least one (meth) acryloyloxy group and at least one hydroxyl group in one molecule. Among the urethane (meth)acrylate-based oligomers, urethane (meth)acrylate-based oligomers containing an alicyclic hydrocarbon compound, which is superb in water resistance, humidity resistance, weather resistance, and adhesive force, are preferable. Among these, a urethane (meth)acrylate-based oligomer using isophorone diisocyanate or dicyclohexylmethane diisocyanate as a starting material is more preferable. A urethane (meth)acrylate-based oligomer using dicyclohexylmethane diisocyanate as a starting material is especially preferable.

Examples of the (meth)acrylate monomer having at least one (meth)acryloyloxy group and at least one hydroxyl group in one molecule and used for the urethanization reaction include 2-hydroxyethyl(meth)acrylate, 2-hydroxypropyl (meth)acrylate, 2-hydroxybutyl(meth)acrylate, 2-hydroxy-3-phenoxypropyl(meth)acrylate, glycerin di(meth)acrylate, trimethylolpropane di(meth)acrylate, pentaerythritol tri(meth) acrylate, dipentaerythritol penta(meth)acrylate, and the like.

Examples of the polyisocyanate used for the urethanization reaction include di- or tri-isocyanate such as hexamethylene diisocyanate, lysine diisocyanate, isophorone diisocyanate, dicyclohexylmethane diisocyanate, tolylene diisocyanate, xylylene diisocyanate, diisocyanates obtained by adding hydrogen to aromatic isocyanate (among these diisocyanates) (e.g., diisocyanate such as hydrogen-added tolylene diisocyanate, hydrogen-added xylylene diisocyanate, or the like), triphenylmethane triisocyanate, dimethylenetriphenyl triisocyanate and the like; and polyisocyanate obtained by multimerization of diisocyanate. Among these, isophorone diisocyanate and dicyclohexylmethane diisocyanate, which are superb in water resistance, humidity resistance, and weather resistance, are preferable. Dicyclohexylmethane diisocyanate is especially preferable.

Example of the polyol generally used for the urethanization reaction include aromatic, aliphatic and alicyclic polyols, and also polyester polyol, polyether polyol, and the like. In general, examples of the aliphatic and alicyclic polyols include 1,4-butanediol, 1,6-hexanediol, neopentylglycol, ethyleneglycol, propyleneglycol, trimethylolethane, trimethylolpropane, dimethylolheptane, dimethylolpropionic acid, dimethylolbutylionic acid, glycerin, water-added bisphenol A, and the like.

Polyester polyol is obtained by dehydrogenation-condensation reaction of a polyol described above and a polybasic carboxylic acid (anhydride). Specific examples of the polybasic carboxylic acid include succinic acid (anhydride), adipic acid, maleic acid (anhydride), trimellitic acid (anhydride), hexahydrophthalic acid (anhydride), phthalic acid (anhydride), isophthalic acid, terephthalic acid, and the like. Examples of the polyether polyol include polyalkyleneglycol, and polyoxyalkylene-denatured polyol obtained by the reaction of a polyol or phenol with alkylene oxide.

As the urethane (meth)acrylate-based oligomer, many types are commercially available and easily obtainable. Examples of the urethane (meth)acrylate-based oligomer include Beam Set 575, Beam Set 551B, Beam Set 550B, Beam Set 505A-6, Beam Set 504H, Beam Set 510, Beam Set 502H, Beam Set 575CB, and Beam Set 102 (trade names of the urethane (meth)acrylate-based oligomers produced by Arakawa Chemical Industries, Ltd.); Photomer 6008 and Photomer 6210 (trade names of the urethane (meth)acrylate-based oligomers produced by San Nopco Limited); NK Oligo U-4HA, NK Oligo U-108A, NK Oligo U-1084A, NK Oligo U-200AX, NK Oligo U-122A, NK Oligo U-340A, NK Oligo U-324A, NK Oligo UA-100, and NK Oligo MA-6 (trade names of the urethane (meth)acrylate-based oligomers produced by Shin-Nakamura Chemical Co., Ltd.); Aronix M-1100, Aronix M-1200, Aronix M-1210, Aronix M-1310, Aronix M-1600, and Aronix M-1960 (trade names of the urethane (meth)acrylate-based oligomers produced by Toagose Co., Ltd.); AH-600, AT-606, and UA-306H (trade names of the urethane (meth)acrylate-based oligomers produced by Kyoseisha Chemical Co., Ltd.); Karayad UX-2201, Karayad UX-2301, Karayad UX-3204, Karayad UX-3301, Karayad UX-4101, Karayad UX-6101, and Karayad UX-7101 (trade names of the urethane (meth)acrylate-based oligomers produced by Nippon Kayaku Co., Ltd.); Shiko UV-1700B, Shiko UV-3000B, Shiko UV-3300B, Shiko UV-3520TL, Shiko UV-3510TL, Shiko UV-6100B, Shiko UV-6300B, Shiko UV-7000B, Shiko UV-7210B, Shiko UV-7550B, Shiko UV-2000B, Shiko UV-2250TL, Shiko UV-2010B, Shiko UV-2580B, and Shiko UV-2700B (trade names of the urethane (meth)acrylate-based oligomers produced by The Nippon Synthetic Chemical Industry Co., Ltd.); Artresin UN-9000PEP, Artresin UN-9200A, Artresin UN-9000H, Artresin UN-1255, Artresin UN-5200, Artresin UN-2111A, Artresin UN-330, Artresin UN-3320HA, Artresin UN-3320HB, Artresin UN-3320HC, Artresin UN-3320HS, and Artresin UN-6060P (trade names of the urethane (meth)acrylate-based oligomers produced by Negami Chemical Industrial Co., Ltd.); Laromer UA19T, Laromer LR8949, LaromerLR8987, and LaromerLR8983 (trade names of the urethane (meth)acrylate-based oligomers produced by BASF); Diabeam UK6053, Diabeam UK6055, Diabeam UK6039, Diabeam UK6038, Diabeam UK6501, DiabeamUK6074, and Diabeam UK6097 (trade names of the urethane (meth)acrylate-based oligomers produced by Mitsubishi Rayon Co., Ltd.); Ebecryl 254, Ebecryl 264, Ebecryl 265, Ebecryl 1259, Ebecryl 4866, Ebecryl 1290K, Ebecryl 5129, Ebecryl 4833, Ebecryl 2220 (trade names of the urethane (meth)acrylate-based oligomers produced by Daicel UCB Kabushik Kaisha); and the like.

The polyfunctional polyester (meth)acrylate oligomer is obtained by dehydrogenation-condensation reaction of a (meth)acrylic acid, a polybasic carboxylic acid (anhydride) and polyol. Examples of the polybasic carboxylic acid (anhydride) used for the dehydrogenation-condensation reaction include succinic acid (anhydride), adipic acid, maleic acid (anhydride), itaconic acid (anhydride), trimellitic acid (anhydride), pyromellitic acid (anhydride), hexahydrophthalic acid (anhydride), phthalic acid (anhydride), isophthalic acid, terephthalic acid, and the like. Examples of the polyol used for the dehydrogenation-condensation reaction include 1,4-butanediol, 1,6-hexanediol, diethyleneglycol, triethyleneglycol, propyleneglycol, neopentylglycol, dimethylolheptane, dimethylolpropionic acid, dimethylolbutylionic acid, trimethylolpropane, ditrimethylolpropane, pentaerythritol, dipentaerythritol, and the like.

Specific examples of the polyester (meth)acrylate-based oligomer include Aronix M-6100, Aronix M-7100, Aronix M-8030, Aronix M-8060, Aronix M-8530, and Aronix M-8050 (trade names of the polyester (meth)acrylate-based oligomers produced by Toagose Co., Ltd.); Laromer PE44F, Laromer LR8907, Laromer PE55F, Laromer PE46T, and Laromer LR8800 (trade names of the polyester (meth)acrylate-based oligomers produced by BASF); Ebecryl 80, Ebecryl 657, Ebecryl 800, Ebecryl 450, Ebecryl 1830, and Ebecryl 584 (trade names of the polyester (meth)acrylate-based oligomers produced by Daicel UCB Kabushik Kaisha); Photomer RCC13-429 and Photomer 5018 (trade names of the polyester (meth)acrylate-based oligomers produced by San Nopco Limited); and the like.

The polyfunctional epoxy (meth)acrylate oligomer is obtained by addition reaction of a polyglycidylether and a (meth)acrylic acid. Any of various types of polyfunctional epoxy (meth)acrylate oligomer is usable with no specific limitation. The epoxy (meth)acrylate oligomer has a structure obtained by adding an epoxy-based oligomer and a (meth)acrylic acid, and is available in bisphenol A-epichlorhydrin-type, denatured bisphenol A-type, amine denatured-type, phenolnovolac-epichlorhydrin-type, aliphatic type, alicyclic type and the like. Examples of the polyglycidylether include ethyleneglycoldiglycidylether, propyleneglycoldiglycidylether, tripropyleneglycoldiglycidylether, 1,6-hexanedioldiglycidylether, bisphenol A diglycidylether, and the like.

Specific examples of the epoxy (meth)acrylate oligomer include Laromer LR8986, Laromer LR8713, and Laromer EA81 (trade names of the epoxy (meth)acrylate-based oligomers produced by BASF); NK oligo EA-6310, NK oligo EA-1020, NK oligo EMA-1020, NK oligo EA-6320, NK oligo EA-7440, and NK oligo EA-6340 (trade names of the epoxy (meth)acrylate-based oligomers produced by Shin-Nakamura Chemical Co., Ltd.); Ebecryl 3700, Ebecryl 3200, and Ebecryl 600 (trade names of the epoxy (meth)acrylate-based oligomers produced Daicel UCB Kabushik Kaisha); and the like.

[Acrylamide Derivative]

The (meth)acrylate-based adhesive composition used in the present invention may contain an acrylamide derivative in addition to a (meth)acrylate monomer and a (meth)acrylate oligomer. By incorporating the acrylamide derivative as a reactive monomer to the (meth)acrylate-based adhesive composition, the humidity resistance, water resistance, adhesive force, processability and transparency are improved. Any of various acrylamide derivative is usable with no specific limitation. Examples of the acrylamide derivative include alkylacrylamide and/or alkylmethacrylamide. Specific examples of the acrylamide derivative include acrylamide, methacrylamide, diacetoneacrylamide, diacetonemethacrylamide, alkylenebisacrylamide, dimethylacrylamide, diethylacrylamide, isopropylacrylamide, 4-acrylomorpholine, and the like. Dimethylacrylamide, isopropylacrylamide, diethylacrylamide, and 4-acrylomorpholine are more preferable. These materials may be used independently or in a combination of two or more. The content thereof is usually 1 to 50% by weight, preferably 5 to 30% by weight, with respect to the total weight of the (meth)acrylate-based adhesive composition.

[Silane Compound]

The (meth)acrylate-based adhesive composition used in the present invention may contain a silane compound in addition to a (meth)acrylate monomer and a (meth)acrylate oligomer. The silane compound is used as an adhesion promoter of the (meth)acrylate-based adhesive composition, and has an effect of improving the adhesive force and also improving the humidity resistance, water resistance, weather resistance and transparency. In the present invention, any of various silane compound is usable with no specific limitation. Examples of the silane compound include amino functional silane, epoxy functional silane, vinyl functional silane, mercapto functional silane, methacrylate functional silane, acrylamide functional silane, acrylate functional silane, and the like. These materials may be used independently or in a combination of two or more. Among these silane compounds, amino functional silane, epoxy functional silane, vinyl functional silane, and mercapto functional silane are especially preferable. Specific examples of these preferable silane compounds include aminosilanes such as γ-aminopropyltriethoxysilane, γ-aminopropyltrimethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, and the like; epoxysilanes such as (3-(2,3-epoxypropoxy)propyl)trimethoxysilane, β-(3,4-epoxycyclohexyl)ethyltrimethoxysilane, γ-glycidoxypropyltrimethoxysilane, γ-glycidoxypropyltriethoxysilane, and the like; vinylsilanes such as vinyltris(β-methoxyethoxy)silane, vinyltriethoxysilane, vinyltrimethoxysilane, γ-methacryloxypropyltrimethoxysilane, and the like; hexamethyldisilazane; γ-mercaptopropyltrimethoxysilane; and the like. Among these, epoxysilanes such as (3-(2,3-epoxypropoxy)propyl)trimethoxysilane, β-(3,4-epoxycyclohexyl)ethyltrimethoxysilane, γ-glycidoxypropyltrimethoxysilane, and γ-glycidoxy)propyl)triethoxysilane are more preferable. (3-(2,3-epoxypropoxy)propyl)trimethoxysilane is especially preferable. These materials may be used independently or in a combination of two or more. The content thereof is usually 0.1 to 20% by weight, preferably 1 to 10% by weight, with respect to the total weight of the (meth)acrylate-based adhesive composition.

[Organic Phosphorus Compound]

The (meth)acrylate-based adhesive composition used in the present invention may contain an organic phosphorus compound in addition to a (meth)acrylate monomer and a (meth)acrylate oligomer. The organic phosphorus compound is used as an adhesion promoter of the (meth)acrylate-based adhesive composition to a metal compound, and has an effect of improving the adhesive force to a metal compound and also improving the humidity resistance and water resistance. In the present invention, any organic phosphorus compound is usable with no specific limitation, but (meth)acrylate phosphate is especially preferable. As the (meth)acrylate phosphate, any (meth)acrylate having a phosphoric acid ester backbone is usable. Preferable examples of the (meth)acrylate phosphate are not limited to monoester, diester, triester or the like, and include ethylene oxide-denatured phenoxylated (meth)acrylate phosphate, ethylene oxide-denatured butoxylated (meth)acrylate phosphate, ethylene oxide-denatured octyloxylated (meth)acrylate phosphate, ethylene oxide-denatured di(meth)acrylate phosphate, ethylene oxide-denatured tri(meth)acrylate phosphate, and the like. In more detail, mono[2-(meth)acryloyloxyethyl]phosphate, mono[2-(meth)acryloyloxyethyl]diphenyl phosphate, mono[2-(meth)acryloyloxypropyl]phosphate, bis[2-(meth)acryloyloxyethyl]phosphate, bis[2-(meth)acryloyloxypropyl]phosphate, tris[2-(meth)acryloyloxyethyl]phosphate and the like are preferable. These materials may be used independently or in a combination of two or more. The content thereof is usually 0.1 to 20% by weight, preferably 1 to 10% by weight, with respect to the total weight of the (meth)acrylate-based adhesive composition.

[Other Additives]

In the present invention, the photoinitiator is used in order to polymerize and cure the (meth)acrylate-based adhesive composition and increase the curing rate. In the present invention, any generally known photoinitiator is usable. Examples of the photoinitiator include 2,2-dimethoxy-1,2-diphenylethane-1-on, 2-hydroxy-2-methyl-1-phenyl-propane-1-on, 1-hydroxy-cyclohexylphenylketone, oligo[2-hydroxy-2-methyl-1-[4-(1-methylvinyl)phenyl]propanone], bis(2,4,6-trimethylbenzoyl)phenylphosphine oxide, 2,2-dimethoxy-2-phenylacetophenone, xanthone, fluorenone, benzaldehyde, fluorene, anthraquinone, triphenylamine, carbazole, 3-methylacetophenone, benzophenone, 4-chlorobenzophenone, 4,4'-dimethoxybenzophenone, 4,4'-diaminobenzophenone, benzoinethylether, benzoinpropylether, michler's ketone, benzyldimethylketal, 1-(4-isopropylphenyl)-2-hydroxy-2-methylpropane-1-on, 1-(4-dodecylphenyl)-2-hydroxy-2-methypropane-1-on, 4-(2-hydroxyethoxy)phenyl-(2-hydroxy-2-propyl)ketone, 2-methyl-1-[4-(methylthio)phenyl]-2-morpholino-propane-1-on, 2,4,6-trimethylbenzoylphenylphosphinate, 2,4,6-trimethylbenzoyldiphenylphosphine oxide, 2-benzyl-2-dimethylamino-1-(4-morpholinophenyl)-butane-1-on, bis(2,6-dimethoxybenzoyl)-2,4,4-trimethylpentylphosphine oxide, methylbenzoyl formate, thioxanthone, diethylthioxanthone, 2-isopropylthioxanthone, 2-chlorothioxanthone, and the like. Among these, 2,2-dimethoxy-1,2-diphenylethane-1-on, 2-hydroxy-2-methyl-1-phenyl-propane-1-on, 1-hydroxy-cyclohexylphenylketone, oligo[2-hydroxy-2-methyl-1-[4-(1-methylvinyl)phenyl]propanone], and bis(2,4,6-trimethylbenzoyl)phenylphosphine oxide are more preferable. These materials may be used independently or in a combination of two or more. The content thereof is usually 0.5 to 20% by weight, preferably 1 to 10% by weight, with respect to the total weight of the (meth)acrylate-based adhesive composition.

As the photoinitiator, many types are commercially available and easily obtainable. Specific examples of the photoinitiator include Irgacure 184, Irgacure 261, Irgacure 369, Irgacure 379, Irgacure 500, Irgacure 651, Irgacure 819, Irgacure 907, Irgacure 1700, Irgacure 1800, Irgacure 1850, Irgacure 2959, Irgacure CGI-403, Darocure 953, Darocure 1116, Darocure 1173, Darocure 1664, Darocure 2273, and Darocure 4265 (trade names produced by Ciba Specialty Chemicals), and the like.

As the polymerization initiator for the (meth)acrylate-based adhesive composition used in the present invention, a thermal polymerization initiator is also usable. An example of the usable polymerization initiator is selected from azo compounds such as 2,2'-azobis(isobutylonitrile) and the like; hydroperoxides such as t-butylhydroperoxide and the like; and peroxides such as benzoyl peroxide, cyclohexanone peroxide, and the like. The usable thermal polymerization initiator is not limited to these. These materials may be used independently or in a combination of two or more.

In addition to the photoinitiator, at least one type of photosensitizer may be optionally added to the (meth)acrylate-based adhesive composition to control the curing time and curing state. The photosensitizer may be selected from amine compounds, urea compounds, phosphorus compounds, nitrile compounds, benzoin compounds, carbonyl compounds, sulfur compounds, naphthalene-based compounds, condensed aromatic hydrocarbons and mixtures thereof. Specific examples of the photosensitizer include amine compounds such as triethylamine, diethylaminoethyl methacrylate, N-methyldiethanolamine, and the like; benzoin compounds such as 4-dimethylaminoethyl benzoate, 4-dimethylaminoisoamyl benzoate, benzoin, benzoinmethylether, benzoinethylether, benzoinisobutylether, benzoinoctylether, and the like; carbonyl compounds such as benzyl, diacetyl, diethoxyacetophenone, 2-hydroxy-2-methylpropiophenone, 4'-isopropyl-2-hydroxy-2-methylpropiophenone, methylanthraquinone, acetophenone, benzophenone, benzoyl methyl formate, benzyldimethylketal, 1-hydroxycyclohexylphenylketone, 2-methyl-1-(4-(methylthio)phenyl)-2-morpholino)-propene-1-on, 2,2-dimethoxy-2-phenylacetophenone, and the like; sulfur compounds such as diphenyldisulfide, dithiocarbamate, and the like; naphthalene-based compounds such as α-chloromethylnaphthalene, and the like; condensed aromatic hydrocarbons such as anthracene, and the like; and metal salts such as iron chloride, and the like. These materials may be used independently or in a combination of two or more. The content thereof is usually 0.1 to 5% by weight, preferably 0.5 to 3% by weight, with respect to the total weight of the (meth)acrylate-based adhesive composition. As the above-mentioned photosensitizer, a material which has a superb solubility in the (meth)acrylate-based adhesive composition and does not inhibit the ultraviolet transmissivity thereof is preferable. To the (meth)acrylate-based adhesive composition used in the present invention, a photostabilizer and an antioxidant may be added in order to prevent aging by hydrolysis or oxidation of the adhesive composition itself or to improve the thermal resistance, weather resistance and the like under severe conditions of being exposed to sunlight or wind and rain.

Examples of a hindered amine-based photostabilizer include bis(2,2,6,6-tetramethyl-4-piperidyl) sebacate, bis(1,2,2,6,6-pentamethyl-4-piperidyl) sebacate, bis(1,2,2,6,6-pentamethyl-4-piperidyl)-2-(3,5-di-t-butyl-4-hydroxybenzyl)-2-n-butyl malonate, 1-methyl-8-(1,2,2,6,6-pentamethyl-4-piperidyl)-sebacate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine, 4-benzoyloxy-2,2,6,6-tetramethylpiperidine, tetrakis(2,2,6,6-tetramethyl-4-piperidyl)-1,2,3,4-butane-tetracarboxylate, triethylenediamine, 8-acetyl-3-dodecyl-7,7,9,9-tetramethyl-1,3,8-triazaspiro[4,5]decane-2,4-dion, and the like.

Examples of a usable nickel-based photostabilizer include [2,2'-thiobis(4-t-octylphenolate)]-2-ethylhexylaminenickel (II), nickel complex-3,5-di-t-butyl-4-hydroxybenzyl-monoethylate phosphate, nickel-dibutyl-dithiocarbamate, and the like.

Especially, a preferable hindered amine-based photostabilizer contains only tertiary amine. Specific examples of such a preferable hindered amine-based photostabilizer include bis(1,2,2,6,6-pentamethyl-4-piperidyl)-sebacate, bis(1,2,2,6,6-pentamethyl-4-piperidyl)-2-(3,5-di-t-butyl-4-hydroxybenzyl)-2-n-butylmalonate, and a condensate of 1,2,2,6,6-pentamethyl-4-piperidinol/tridecyl alcohol and 1,2,3,4-butanetetracarboxylic acid.

A referable antioxidant is selected from phenol-based antioxidant, thiol-based antioxidant, and phosphite-based antioxidant. Examples of the phenol-based antioxidant include 1,1,3-tris(2-methyl-4-hydroxy-5-t-butylphenyl)butane, 2,2'-methylenebis(4-ethyl-6-t-butylphenol), tetrakis-[methylene-3-(3',5'-di-t-butyl-4'-hydroxyphenyl)propionate]methane, 2,6-di-t-butyl-p-cresol, 4,4'-thiobis(3-methyl-6-t-butylphenol), 4,4'-butylidene bis(3-methyl-6-t-butylphenol), 1,3,5-tris(3',5'-di-t-butyl-4'-hydroxybenzyl)-S-triazine-2,4,6-(1H,3H,5H)trione, stearyl-β-(3,5-di-t-butyl-4-hydroxyphenyl) propionate, triethyleneglycolbis[3-(3-t-butyl-5-methyl-4-hydroxyphenyl)propionate], 3,9-bis[1,1-di-methyl-2-[β-(3-t-butyl-4-hydroxy-5-methylphenyl)propionyloxy]ethyl]-2,4,8,10-tetraoxaspiro[5,5]undecane, 1,3,5-trimethyl-2,4,6-tris (3,5-di-t-butyl-4-hydroxybenzyl)benzene, and the like. A phenol-based antioxidant having a molecular weight of 550 or greater is preferable.

Examples of the thiol-based antioxidant include distearyl-3,3'-thiodipropionate, pentaerythritol-tetrakis-(β-lauryl-thiopropionate), and the like.

Examples of the phosphite-based antioxidant include tris (2,4-di-t-butylphenyl)phosphite, distearylpentaerythritoldiphosphite, di(2,6-di-t-butylphenyl)pentaerythritoldiphosphite, bis-(2,6-di-t-butyl-4-methylphenyl)-pentaerythritoldiphosphite, tetrakis(2,4-di-t-butylphenyl)-4,4'-biphenylene-diphosphonite, 2,2'-methylenebis(4,6-di-t-butylphenyl)octylphosphite, and the like.

These photostabilizers and antioxidants may be used independently or in a combination of two or more. Especially, a combination of a hindered amine-based photostabilizer and a hindered phenol-based antioxidant is preferable. The content thereof is usually 0.1 to 10% by weight, preferably 0.5 to 3% by weight, with respect to the total weight of the (meth) acrylate-based adhesive composition. As each of the above-mentioned photostabilizer and antioxidant, a material which has a superb solubility in the (meth)acrylate-based adhesive composition and does not inhibit the ultraviolet transmissivity thereof is preferable.

To the (meth)acrylate-based adhesive composition used in the present invention, a ultraviolet absorber may be added in order to prevent deterioration by sunlight or ultraviolet. Examples of the ultraviolet absorber include benzophenone-based, benzotriazole-based, phenyl salicylate-based, triazine-based ultraviolet absorbers.

Examples of the benzophenone-based ultraviolet absorber include 2,4-dihydroxy-benzophenone, 2-hydroxy-4-methoxy-benzophenone, 2-hydroxy-4-n-octoxy-benzophenone, 2-hydroxy-4-dodesiloxy-benzophenone, 2-hydroxy-4-octadesiloxy-benzophenone, 2,2'-dihydroxy-4-methoxy-benzophenone, 2,2'-dihydroxy-4,4'-dimethoxybenzophenone, 2,2',4,4'-tetrahydroxy-benzophenone, and the like.

Examples of the benzotriazole-based ultraviolet absorber include 2-(2'-hydroxy-5-methylphenyl)benzotriazole, 2-(2'-hydroxy-3',5'-di-t-butylphenyl)benzotriazole, 2-(2'-hydroxy-3'-t-butyl-5'-methylphenyl)benzotriazole, and the like.

Examples of the phenyl salicylate-based ultraviolet absorber include phenyl salicylate, 2-4-di-t-butylphenyl-3,5-di-t-butyl-4-hydroxy benzoate, and the like.

Examples of a hindered amine-based ultraviolet absorber include bis(2,2,6,6-tetramethylpiperidine-4-yl) sebacate, and the like.

Examples of the triazine-based ultraviolet absorber include 2,4-diphenyl-6-(2-hydroxy-4-methoxyphenyl)-1,3,5-triazine, 2,4-diphenyl-6-(2-hydroxy-4-ethoxyphenyl)-1,3,5-triazine, 2,4-diphenyl-(2-hydroxy-4-propoxyphenyl)-1,3,5-triazine, 2,4-diphenyl-(2-hydroxy-4-butoxyphenyl)-1,3,5-triazine, 2,4-diphenyl-6-(2-hydroxy-4-butoxyphenyl)-1,3,5-triazine, 2,4-diphenyl-6-(2-hydroxy-4-hexyloxyphenyl)-1,3,5-triazine, 2,4-diphenyl-6-(2-hydroxy-4-octyloxyphenyl)-1,3,5-triazine, 2,4-diphenyl-6-(2-hydroxy-4-dodecyloxyphenyl)-1,3,5-triazine, 2,4-diphenyl-6-(2-hydroxy-4-benzyloxyphenyl)-1,3,5-triazine, and the like.

Examples of the ultraviolet absorber include, in addition to the above-mentioned materials, compounds having a function of converting an energy of the ultraviolet into a vibrating energy in the molecules thereof and releasing the vibrating energy as a thermal energy or the like. Moreover, a material exhibiting an effect when used together with an antioxidant, a colorant or the like, or a photostabilizer called "quencher" which acts like a photoenergy converter may be used together with the ultraviolet absorber. It should be noted that when any of the above-mentioned ultraviolet absorbers is used, an ultraviolet absorber having a photo-absorbing wavelength which does not overlap the effective wavelength of the photoinitiator needs to be selected. When a usual ultraviolet blocking agent is used, a photoinitiator generating a radical with visible light is usable.

The amount of the ultraviolet absorber is usually 0.1 to 20% by weight, preferably 1 to 15% by weight, and more preferably 3 to 10% by weight, with respect to the total weight of the (meth)acrylate-based adhesive composition. When the amount of the ultraviolet absorber is larger than 20% by weight, the adhesiveness is poor, and when the ultraviolet absorber is smaller than 0.1% by weight, the effect of improving the weather resistance is poor.

To the (meth)acrylate-based adhesive composition used in the present invention, various other additives may be added. For example, defoaming agent, leveling agent, antistatic agent, surfactant, storage stabilizer, thermal polymerization inhibitor, plasticizer, wettability improving agent, adhesiveness adding agent, viscosity adding agent, and the like may be optionally added.

A method for preparing the (meth)acrylate-based adhesive composition used in the present invention is, for example, as follows. The components of a (meth)acrylate-based polymerizable oligomer, a (meth)acrylate-based polymerizable monomer, a (meth)acrylate monomer, a (meth)acrylate oligomer, an acrylamide derivative, a silane compound, an organic phosphorus compound, an initiator, a thickener, other additives, or the like are put together, mixed and solved at room temperature to 80° C., and optionally filtrated through a filter to obtain a desired adhesive composition. For preparing the adhesive composition, a known method is usable and is not limited to the above-described method. In consideration of the ease of application, it is preferable that the content ratio of each component of the adhesive composition used in the present invention is appropriately adjusted such that the adhesive composition has a viscosity of 1 to 5000 mPa at 25° C.

The (meth)acrylate-based adhesive composition used in the present invention may be applied by a known method such as use of an applicator, roll knife method, die coater method, roll coat method, bar coat method, gravure roll coat method, reverse roll coat method, dipping method, spray method, curtain flow method, screen coat method, or the like. The thickness of the adhesive is preferably 2 μm or greater and 200 μm or less.

The (meth)acrylate-based adhesive composition used in the present invention may be cured by visible light, ultraviolet (UV) or electron beam (EB). When the visible light or ultraviolet is used, a preferably used light source is, for example, low pressure mercury lamp, medium pressure mercury lamp, high pressure mercury lamp, super high pressure mercury lamp, xenon mercury lamp, xenon lamp, gallium lamp, metal halide lamp, quartz halogen lamp, tungsten lamp, ultraviolet fluorescent lamp, carbon arc lamp, electroless microwave system ultraviolet lamp, or the like.

In the light-transmitting electromagnetic-shielding laminate according to the present invention, at least one layer selected from the electromagnetic wave-shielding layer, the protecting layer and the adhesive layer which form the light-transmitting electromagnetic-shielding laminate preferably contains at least one of an ultraviolet absorber, a photostabilizer and an antioxidant, in order to prevent aging by hydrolysis or oxidation of the light-transmitting organic polymer materials themselves to be laminated, to prevent ageing by ultraviolet, or to improve the thermal resistance and weather resistance under severe conditions of being exposed to sunlight or wind and rain, or the like. It is preferable that all the layers forming the light-transmitting electromagnetic-shielding laminate each contain at least one of an ultraviolet absorber, a photostabilizer and an antioxidant, but this is costly and not very economical because the ultraviolet absorber, the photostabilizer and the antioxidant are expensive. In consideration of the cost effectiveness, it is preferable to form a cover film containing at least one of the ultraviolet absorber, photostabilizer and antioxidant on one or both of the surfaces of the light-transmitting electromagnetic-shielding laminate.

A cover film containing at least one of the ultraviolet absorber, photostabilizer and antioxidant is preferably formed of a silicone-based resin compound having a high durability against long-time use and a relatively high surface hardness, or an acrylic resin or polyfunctional acrylic resin, which is easy to be treated and provides a good cover film. The method for curing such a cover film varies in accordance with the properties of the resin compound used. In consideration of the productivity and convenience, it is preferable to select a thermosetting or photo-curable resin. An example of the photo-curable resin is a resin composition formed of a single or a plurality of types of resins such as mono-functional or polyfunctional acrylate monomer, oligomer or the like, to which a photoinitiator is added as a curing catalyst. Examples of the thermosetting resin include polyorganosiloxane-based resin, crosslinked acrylic-based resin, and the like. Such a resin composition is commercially available as a hard coat, and an appropriate type may be selected in consideration of the compatibility with the material of the cover film.

To such a cover film, in addition to the above-described ultraviolet absorber, photostabilizer, and antioxidant, various types of stabilizers such as organic solvent, anti-coloring agent and the like; leveling agent, defoaming agent, thickener, antistatic agent, surfactants such as antifogging agent and the like may be optionally added.

The cover film containing at least one of the ultraviolet absorber, photostabilizer and antioxidant may be formed on an acrylic resin layer laminated by coextrusion of a substrate and an acrylic resin in order to improve the adhesiveness of the light-transmitting electromagnetic radio wave absorber with the substrate.

An example of a photo-curable acrylic-based resin compound used for forming the cover film is an ultraviolet-curable resin composition for cover film obtained by adding a photoinitiator at 1 to 10% by weight to a photopolymerizable compound formed of 20 to 80% by weight of 1,9-nonanediol diacrylate or tris(acroxyethyl)isocyanurate and 20 to 80% by weight of another compound copolymerizable therewith.

Examples of the compound copolymerizable with 1,9-nonanediol diacrylate or tris(acroxyethyl)isocyanurate used as indispensable components include at least bi-functional polyfunctional (meth)acrylate monomer and at least bi-functional polyfunctional urethane (meth)acrylate oligomer (hereinafter, referred to as the "polyfunctional urethane (meth)acrylate oligomer"), at least bi-functional polyfunctional polyester (meth)acrylate oligomer (hereinafter, referred to as the "polyfunctional polyester (meth)acrylate oligomer"), at least bi-functional polyfunctional epoxy (meth)acrylate oligomer (hereinafter, referred to as the "polyfunctional epoxy (meth)acrylate oligomer"), and the like. A single type of, or a combination of two or more types of, the (meth)acrylate monomer or oligomer is usable.

Representative examples of the bi-functional (meth)acrylate monomer include alkyleneglycol di(meth)acrylates, polyoxyalkyleneglycol di(meth)acrylates, halogen-substituted alkyleneglycol di(meth)acrylates, di(meth)acrylate of fatty acid polyol, alkylene oxide-adduct di(meth)acrylates of bisphenol A or bisphenol F, epoxy di(meth)acrylates of bisphenol A or bisphenol F, and the like. The bi-functional (meth)acrylate monomer is not limited to these, and various other materials are usable. Specific examples of the bi-functional (meth)acrylate monomer include 2-n-butyl-2-ethyl-1,3-propanediol diacrylate, tripropyleneglycol diacrylate, tetraethyleneglycol diacrylate, polyethyleneglycol di(meth)acrylate, polypropyleneglycol diacrylate, triethyleneglycol dimethacrylate, 1,6-hexanediol dimethacrylate, neopentylglycol dimethacrylate, and the like. Examples of the at least tri-functional (meth)acrylate monomer include trimethylolpropane trimethacrylate, trimethylolpropaneethylene oxide-adduct triacrylate, glycerinpropylene oxide-adduct triacrylate, pentaerythritol tetraacrylate, and the like.

An example of the polyfunctional urethane (meth)acrylate oligomer is a urethanization reaction product of a (meth)acrylate monomer having at least one (meth)acryloyloxy group and at least one hydroxyl group in one molecule and a polyisocyanate. An example of the polyfunctional urethane (meth)acrylate oligomer is a urethanization reaction product of an isocyanate compound obtained by reacting a polyol with polyisocyanate and a (meth)acrylate monomer having at least one (meth)acryloyloxy group and at least one hydroxyl group in one molecule.

Examples of the (meth)acrylate monomer having at least one (meth)acryloyloxy group and at least one hydroxyl group in one molecule, which is used for the urethanization reaction, include 2-hydroxyethyl(meth)acrylate, 2-hydroxypropyl(meth)acrylate, 2-hydroxybutyl(meth)acrylate, 2-hydroxy-3-phenoxypropyl(meth)acrylate, glycerin di(meth)acrylate, trimethylolpropane di(meth)acrylate, pentaerythritol tri(meth)acrylate, dipentaerythritol penta(meth)acrylate, and the like.

Examples of the polyisocyanate used for the urethanization reaction include di- or tri-isocyanate such as hexamethylene diisocyanate, lysine diisocyanate, isophorone diisocyanate, dicyclohexylmethane diisocyanate, tolylene diisocyanate, xylylene diisocyanate, diisocyanate obtained by adding hydrogen to aromatic isocyanate (among these diisocyanates) (e.g., diisocyanate such as hydrogen-added tolylene diisocyanate, hydrogen-added xylylene diisocyanate, or the like), triphenylmethane triisocyanate, dimethylenetriphenyl triisocyanate and the like; and polyisocyanate obtained by multimerization of diisocyanate.

Example of the polyol used for the urethanization reaction include aromatic, aliphatic and alicyclic polyols, and also polyester polyol, polyether polyol, and the like. In general, examples of the aliphatic and alicyclic polyols include 1,4-butanediol, 1,6-hexanediol, neopentylglycol, ethyleneglycol, propyleneglycol, trimethylolethane, trimethylolpropane, dimethylolheptane, dimethylolpropionic acid, dimethylolbutylionic acid, glycerin, water-added bisphenol A, and the like.

Polyester polyol is obtained by dehydrogenation-condensation reaction of a polyol described above and a polybasic carboxylic acid (anhydride). Specific examples of the polybasic carboxylic acid include succinic acid (anhydride), adipic acid, maleic acid (anhydride), trimellitic acid (anhydride), hexahydrophthalic acid (anhydride), phthalic acid (anhydride), isophthalic acid, terephthalic acid, and the like. Examples of the polyether polyol include polyalkyleneglycol, and polyoxyalkylene-denatured polyol obtained by the reaction of a polyol or phenol with alkylene oxide.

The polyfunctional polyester (meth)acrylate oligomer is obtained by dehydrogenation-condensation reaction of a (meth)acrylic acid, a polybasic carboxylic acid (anhydride) and polyol. Examples of the polybasic carboxylic acid (anhydride) used for the dehydrogenation-condensation reaction include succinic acid (anhydride), adipic acid, maleic acid (anhydride), itaconic acid (anhydride), trimellitic acid (anhydride), pyromellitic acid (anhydride), hexahydrophthalic acid (anhydride), phthalic acid (anhydride), isophthalic acid, terephthalic acid, and the like. Examples of the polyol used for the dehydrogenation-condensation reaction include 1,4-butanediol, 1,6-hexanediol, diethyleneglycol, triethyleneglycol, propyleneglycol, neopentylglycol, dimethylolheptane, dimethylolpropionic acid, dimethylolbutylionic acid, trimethylolpropane, ditrimethylolpropane, pentaerythritol, dipentaerythritol, and the like.

The polyfunctional epoxy (meth)acrylate oligomer is obtained by addition reaction of a polyglycidylether and a (meth)acrylic acid. Examples of the polyglycidylether include ethyleneglycoldiglycidylether, propyleneglycoldiglycidylether, tripropyleneglycoldiglycidylether, 1,6-hexanedioldiglycidylether, bisphenol A diglycidylether, and the like.

As the photoinitiator used for the cover film formed of a photo-curable acrylic-based resin compound, any generally known photoinitiator is usable. Examples of such a photoinitiator include, but are not limited to, benzoin, benzophenone, benzoinethylether, benzoinisopropylether, 2,2-dimethoxy-2-phenylacetophonone, 1-hydroxycyclohexylphenylketone, 2-hydroxy-2-methyl-1-phenylpropane-1-on, azobisisobutylonitrile, benzoylperoxide, and the like.

A specific example of the cover film formed of a thermosetting silicone-based resin compound is an organopolysiloxane-based resin compound containing at least one of epoxy-containing silane coupling agent and an amino-containing silane coupling agent. In more detail, a cured layer formed of an organopolysiloxane-based resin compound obtained as follows is an example of the cover film. A resin compound formed of alkoxysilane containing 0 to 25% by weight of bi-functional alkoxysilane, 40 to 80% by weight of tri-functional alkoxysilane, and 10 to 25% by weight of tetra-functional alkoxysilane with respect to the nonvolatile content of the resin compound (JIS K6833) is mixed with 5 to 10% by weight of at least one of an epoxy-containing silane coupling agent and an amino-containing silane coupling agent; and this mixture is treated with hydrolysis and partial condensation in a solvent under the presence of an acid catalyst to form a cured layer formed of an organopolysiloxane-based resin compound.

Examples of the bi-functional alkoxysilane used for forming the organopolysiloxane-based resin compound include dimethyldimethoxysilane, dimethyldiethoxysilane, diphenyldimethoxysilane, diphenyldiethoxysilane, and the like. Examples of the tri-functional alkoxysilane used for forming the organopolysiloxane-based resin compound include methyltrimethoxysilane, methyltriethoxysilane, ethyltrimethoxysilane, ethyltriethoxysilane, phenyltrimethoxysilane, phenyltriethoxysilane, and the like. Examples of the tetra-functional alkoxysilane used for forming the organopolysiloxane-based resin compound include tetramethoxysilane, tetraethoxysilane, tetrapropoxysilane, and the like.

The mixing ratios of the alkoxysilanes are preferably as follows: 0 to 25% by weight of the bi-functional alkoxysilane, 40 to 80% by weight of the tri-functional alkoxysilane, and 10 to 25% by weight of the tetra-functional alkoxysilane with respect to the nonvolatile content of the material of the cover film (JIS K6833). When the bi-functional alkoxysilane is contained at more than 25% by weight or the tri-functional alkoxysilane is contained at more than 80%, the abrasion resistance is lowered. When the tetra-functional alkoxysilane is contained at more than 30% by weight, the adhesiveness with the substrate is poor, whereas when the tetra-functional alkoxysilane is contained at less than 10% by weight, the abrasion resistance is lowered.

A preferable example of the silane coupling agent used for forming the organopolysiloxane-based resin compound is at least one of an epoxy-containing silane coupling agent and an amino-containing silane coupling agent. The silane coupling agent is used in the range of 5 to 10% by weight with respect to the nonvolatile content of the material of the cover film (JIS K6833). When the silane coupling agent is used at less than 5% by weight, the film properties and adhesiveness are lowered, whereas when the silane coupling agent is used at more than 10% by weight, the abrasion resistance is lowered.

Examples of the epoxy-containing silane coupling agent used for forming the organopolysiloxane-based resin compound include 3-glycidoxypropylmethyldimethoxysilane, 3-glycidoxypropyltrimethoxysilane, 2-(3,4-epoxycyclohexyl)ethyltrimethoxysilane, and the like. Examples of the amino-containing silane coupling agent used for forming the organopolysiloxane-based resin compound include N-(2-aminoethyl)-3-aminopropylmethyldimethoxysilane, N-(2-aminoethyl)-3-aminopropyltrimethoxysilane, 3-aminopropyltriethoxysilane, and the like.

The organopolysiloxane-based resin compound is produced by treating the mixture of the alkoxysilane and the silane coupling agent with hydrolysis and partial condensation using lower alcohol and/or water under the presence of an acid catalyst. As the lower alcohol, methanol, ethanol, isopropanol, butanol, or the like is usable.

Together with the organopolysiloxane-based resin compound, a vinyl-containing silane coupling agent such as vinyltrimethoxysilane, vinyltriethoxysilane or the like, or a methacryloxy-containing silane coupling agent such as 3-methacryloxypropylmethyldimethoxysilane, 3-methacryloxypropyltrimethoxysilane or the like is usable in such a range that the properties of the organopolysiloxane-based resin compound are not spoiled.

To the silane coupling agent-containing organopolysiloxane-based resin compound, it is preferable to add a curing catalyst provided with a buffer solution such that a cured film is obtained at a temperature of 120 to 140° C. Examples of the curing catalyst include dimethylamine, ethanolamine acetate, dimethylaniline formate, tetraethylammonium benzoate salt, sodium acetate, sodium propionate, sodium formate, benzoyltrimethylammonium acetate salt, tetramethylammonium acetate, and the like. The amount of the curing catalyst is in the range of 0.1 to 1% by weight with respect to the nonvolatile content of the resin compound.

In order to improve the adhesiveness of the cover film, used in the present invention, containing at least one of the ultraviolet absorber, the photostabilizer and the antioxidant, a primer layer may be formed. Examples of the compound used for forming the primer layer include acrylic group-containing organic compound, condensate of acrylic group-containing silane compound, condensate of alkoxysilyl group-containing vinyl-based compound, and the like. Examples of the acrylic group-containing compound include alkylacrylates such as methyl methacrylate, 2-hydroxyethyl methacrylate, butyl methacrylate, ethyl acrylate and the like.

Examples of the acrylic group-containing silane compound include 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-acryloxypropyltriethoxysilane, 3-acryloxypropylmethyldimethoxysilane, 3-acryloxypropylmethyldiethoxysilane, 3-methacryloxymethyltrimethoxysilane, 3-methacryloxymethyltriethoxysilane, 3-methacryloxymethylmethyldimethoxysilane, 3-methacryloxymethylmethyldiethoxysilane, 3-acryloxymethyltrimethoxysilane, 3-acryloxymethyltriethoxysilane, 3-acryloxymethylmethyldimethoxysilane, 3-acryloxymethylmethyldiethoxysilane, and the like. Among these, 3-methacryloxypropyltrimethoxysilane, 3-methacryloxypropylmethyldimethoxysilane, 3-acryloxypropyltrimethoxysilane, and 3-acryloxypropylmethyldimethoxysilane are preferable in terms of the ease of handling, crosslinking density, reactivity, and the like. Examples of the alkoxysilyl group-containing vinyl monomer include vinyltrimethoxysilane, vinyltriethoxysilane, vinyltris(2-methoxyethoxy)silane, vinylmethyldimethoxysilane, vinylmethyldiethoxysilane, vinylmethylbis(2-methoxyethoxy)silane, 3-vinyloxypropyltrimethoxysilane, 3-vinyloxypropyltriethoxysilane, 3-vinyloxypropylmethyldimethoxysilane, 3-vinyloxypropylmethyldiethoxysilane, stylyltrimethoxysilane, stylyltriethoxysilane, stylylmethyldimethoxysilane, stylylmethyldiethoxysilane, and the like. Among these, vinyltrimethoxysilane, vinyltriethoxysilane, and 3-vinyloxypropyltrimethoxysilane are preferable in terms of the ease of handling, reactivity and the like.

According to the present invention, the cover film may be applied on the light-transmitting electromagnetic-shielding laminate by means of brush, roll, dipping, curtain flow coating, spray, roll coater, flow coater or the like. The thickness of the cover film layer cured by thermal curing or photocuring is 1 to 20 µm, preferably 2 to 15 µm, and more preferably 3 to 12 µm. When the thickness of the cover film layer is less than 1 µm, the effects of improving the weather resistance and the surface hardness are likely to be insufficient, and when the thickness of the cover film layer is more than 20 µm, such a thickness is disadvantageous in terms of cost and may lower the impact resistance.

<Light-Transmitting Radio Wave Absorber>

Another embodiment of the present invention is directed to a light-transmitting radio wave absorber, wherein a resisting layer, a dielectric spacer, and a reflecting layer are laminated by a (meth)acrylate-based adhesive composition comprising a (meth)acrylate monomer, a (meth)acrylate oligomer, and at least one selected from the group consisting of an acrylamide derivative, a silane compound and an organic phosphorus compound.

The light-transmitting radio wave absorber according to the present invention includes a resisting layer having a specific resistance value, a dielectric spacer, and a reflecting layer for reflecting a radio wave, and may optionally includes a protecting layer as a surface layer from the points view of impact resistance, abrasion resistance, weather resistance, water resistance, resistance against humidity, antifogging, contamination resistance and the like. In more detail, the present invention encompasses light-transmitting radio wave absorbers of all the laminate types, including a λ/4-type radio wave absorber which includes a resisting layer, a dielectric spacer, and a reflecting layer; a pattern-type radio wave absorber which includes a pattern layer having a plurality of patterns formed of a conductive material, a dielectric spacer, and a reflecting layer; and the like.

The λ/4-type radio wave absorber is a radio wave absorber, in which the distance between the resisting layer and the reflecting layer is ¼ of the absorbing wavelength (λ), and thus the radio wave can be absorbed as a whole and the reflected wave can be reduced. The pattern-type radio wave absorber is a radio wave absorber, in which a specific conductive pattern is formed on the resisting layer, and thus the entire thickness is smaller than that of the λ/4-type radio wave absorber and also a high radio wave absorbing performance of a wide wavelength range with respect to a wide angle range of incident wave is exhibited.

The conductive pattern in the pattern layer of the pattern-type radio wave absorber is loop, circular, quadrangular polygonal or the like. It is preferable that each pattern is different from an adjacent pattern in at least one of the size and the shape. A conductive pattern acts as an antenna, and so the conductive patterns which are different in the size or the shape are advantageous in receiving a wide range of radio wave. At the time of receiving, the electromagnetic wave leaks to the dielectric spacer, and the electromagnetic wave is converted into heat by the dielectric loss component of the dielectric layer and is consumed. Therefore, the pattern-type radio wave absorber can be thin and lightweight, which can provide a wide range of reflection attenuation characteristic not realized conventionally.

It is preferable that at least one loop pattern in the pattern layer of the pattern-type radio wave absorber has a protrusion (e.g., linear pattern) in a part of the track of the loop pattern. By adjusting the size, shape or location of the protrusion (e.g., linear pattern), the frequency (wavelength) and the band can be easily adjusted to provide a high reflection attenuation characteristic. Thus, a high performance radio wave absorber capable of effectively absorbing the radio wave which is the target of the absorption can be easily provided.

An assembly of a plurality of loop patterns having different shapes or sizes in the pattern layer is used as one unit, and a plurality of units can be located at a predetermined interval. In this manner, a radio wave absorber which is thin and lightweight but has a large area size and can provide a wide range of reflection attenuation characteristic can be easily realized.

The surface resistivity of the conductor forming the pattern layer is in the range of $1[\Omega/\square]$ to $30[\Omega/\square]$. As the material of the conductor forming the pattern, a metal compound containing at least one metal component selected from silver, copper, aluminum, carbon, ITO (indium oxide/tin oxide), tin oxide, zinc oxide, and titanium nitride is usable.

The reflecting layer is a low resistance conductor having a surface resistivity (sheet resistance value) of $30[\Omega/\square]$ or less. As the material of the conductor forming the reflecting layer, a metal compound containing at least one metal component selected from silver, copper, aluminum, carbon, ITO (indium oxide/tin oxide), tin oxide, zinc oxide, and titanium nitride is usable.

The reflecting layer is a lattice-shaped conductive layer formed of a lattice pattern, and is formed of an optically transparent material. The width of the track of the lattice-shaped conductive layer is preferably 200 μm or less, and more preferably 100 μm or less. It is also preferable that the interval between the centers of the tracks is 1/16 or less of the effective wavelength (λg) of the electromagnetic wave.

In the light-transmitting radio wave absorber, the pattern layer, the dielectric spacer, the reflecting layer, and the protecting layer are formed of at least one light-transmitting material selected from light-transmitting glass and a light-transmitting organic polymer.

Any light-transmitting organic polymer material which is visible and light-transmitting is usable with no specific limitation. The "light-transmitting organic polymer material" encompasses bonded, vapor-deposited, painted, printed or processed materials, such as various metal compounds, conductive compounds, organic compounds, inorganic compounds and the like. Examples of the light-transmitting organic polymer material include polycarbonate resin, polyethylene terephthalate resin, polyester resin, polyether sulfone resin, polyethylene naphthalate resin, polystyrene resin, polyurethane resin, polyvinyl alcohol resin, polymethyl methacrylate resin, alicyclic polyolefin resin, light-transmitting polyimide resin, polyamide resin, acrylic resin, polyacrylonitrile resin, polyvinyl chloride resin, polypropylene resin, polyethylene resin, and the like.

Among these light-transmitting organic polymer materials, polycarbonate resin and polyethylene terephthalate resin are especially preferable from the points of view of transparency, impact resistance, and versatility of use.

The light-transmitting radio wave absorber according to the present invention may include a dielectric spacer and a resisting layer, and optionally a protecting layer on both surfaces thereof sharing the reflecting layer. Such a light-transmitting radio wave absorber can absorb unnecessary radio wave from both surfaces.

The light-transmitting radio wave absorber according to the present invention is usable for absorbing a radio wave of a general frequency band of 5.8 GHz used for DSRC, and also usable for absorbing a radio wave of frequency bands of 60 GHz and 76 GHz. The light-transmitting radio wave absorber according to the present invention is also usable for absorbing a radio wave of a frequency band of 800 MHz to 3 GHz used for mobile phones and wireless data communication.

For the (meth)acrylate-based adhesive composition for the light-transmitting radio wave absorber, substantially the same materials as those described above as usable for the light-transmitting electromagnetic-shielding laminate are usable. According to the present invention, at least layer one selected from the resisting layer, the dielectric spacer, the reflecting layer, the protecting layer and the adhesive layer which form the light-transmitting radio wave absorber preferably contains at least one of an ultraviolet absorber, a photostabilizer and an antioxidant, in order to prevent aging by hydrolysis or oxidation of the light-transmitting organic polymer materials themselves to be laminated, to prevent deterioration by ultraviolet, and to improve the thermal resistance and weather resistance under severe conditions of being exposed to sunlight or wind and rain, or the like. It is preferable that all the layers forming the light-transmitting radio wave absorber each contain at least one of an ultraviolet absorber, a photostabilizer and an antioxidant, but this is costly and not very economical because the ultraviolet absorber, the photostabilizer and the antioxidant are expensive. In consideration of the cost effectiveness, it is preferable to form a cover film containing at least one of the ultraviolet absorber, photostabilizer and antioxidant on both of the surfaces of the light-transmitting radio wave absorber.

The cover film containing at least one of the ultraviolet absorber, photostabilizer and antioxidant is preferably formed of a silicone resin-based compound having a high durability against long-time use and a relatively high surface hardness, or an acrylic resin or polyfunctional acrylic resin, which is easy to be treated and provides a good cover film. The method for curing such a cover film varies in accordance with the properties of the resin compound used. In consideration of the productivity and convenience, it is preferable to select a thermosetting or photo-curable resin. An example of the photo-curable resin is a resin composition formed of a single or a plurality of types of resins such as mono-functional or polyfunctional acrylate monomer, oligomer or the like, to which a photoinitiator is added as a curing catalyst. Examples of the thermosetting resin include polyorganosiloxane-based resin, crosslinked acrylic-based resin, and the like. Such a resin composition is commercially available as a hard coat, and an appropriate type may be selected in consideration of the compatibility with the material of the cover film.

To such a cover film, in addition to the above-described ultraviolet absorber, photostabilizer, and antioxidant, various types of stabilizers such as organic solvent, anti-coloring agent and the like; leveling agent, defoaming agent, thickener, antistatic agent, surfactant such as antifogging agent or the like may be optionally added.

The cover film containing at least one of the ultraviolet absorber, photostabilizer and antioxidant may be formed on an acrylic resin layer laminated by coextrusion of a substrate and an acrylic resin in order to improve the adhesiveness of the light-transmitting radio wave absorber with the substrate.

For the cover film formed of a photo-curable acrylic-based resin compound, substantially the same materials as those described above as usable for the light-transmitting electromagnetic-shielding laminate are usable.

According to the present invention, the cover film may be applied on the light-transmitting radio wave absorber by means of brush, roll, dipping, curtain flow coating, spray, roll coater, flow coater or the like. The thickness of the cover film layer cured by thermal curing or photocuring is 1 to 20 μm, preferably 2 to 15 μm, and more preferably 3 to 12 μm. When the thickness of the cover film layer is less than 1 μm, the effects of improving the weather resistance and the surface hardness are likely to be insufficient, and when the thickness of the cover film layer is more than 20 μm, such a thickness is disadvantageous in terms of cost and may lower the impact resistance.

<(Meth)Acrylate-Based Adhesive Composition for Light-Transmitting Laminate Body>

Still another embodiment of the present invention is directed to a (meth)acrylate-based adhesive composition, for a light-transmitting laminate body, which contains a (meth)acrylate monomer, a (meth)acrylate oligomer, an acrylamide derivative, and a silane compound and/or and an organic phosphorus compound.

As the (meth)acrylate-based adhesive composition for a light-transmitting laminate body, any (meth)acrylate-based adhesive composition described above regarding the light-transmitting electromagnetic-shielding laminate and having the structure of the adhesive composition according to the present invention, namely, the structure containing a (meth)acrylate monomer, a (meth)acrylate oligomer, an acrylamide derivative, and a silane compound and/or and an organic phosphorus compound is usable.

There is no specific limitation on the light-transmitting laminate body material for which the adhesive composition according to the present invention is preferably usable. The adhesive composition according to the present invention is preferably usable to any light-transmitting organic polymer material. The "light-transmitting laminate body material" encompasses bonded, vapor-deposited, painted, printed or processed materials, such as various metal compounds, conductive compounds, organic compounds, inorganic compounds and the like. Examples of the light-transmitting laminate body material include polycarbonate resin, polyethylene terephthalate resin, polyester resin, polyether sulfone resin, polyethylene naphthalate resin, polystyrene resin, polyurethane resin, polyvinyl alcohol resin, polymethyl methacrylate resin, alicyclic polyolefin resin, light-transmitting polyimide resin, polyamide resin, acrylic resin, polyacrylonitrile resin, polyvinyl chloride resin, polypropylene resin, polyethylene resin, and the like. The present invention is preferably usable to a light-transmitting resin laminate body obtained by laminating at least one light-transmitting organic polymer material selected from these.

Among these light-transmitting organic polymer materials, polycarbonate resin and polyethylene terephthalate resin are especially preferable from the points of view of transparency, impact resistance, and versatility of use.

EXAMPLES

Hereinafter, specific embodiments and effects of a light-transmitting electromagnetic-shielding laminate according to one embodiment of the present invention will be specifically described by way of examples and comparative examples.

The present invention is not limited to these specific embodiments or examples in any way. The evaluation results described in the examples and the comparative examples were obtained by the following tests.

(Electromagnetic Wave-Shielding Performance Test)

The electromagnetic wave-shielding performance in a frequency range of 100 MHz to 1 GHz was measured using an electromagnetic wave-shielding performance measuring device (produced by Advantest Corporation).

[Electromagnetic Wave-Shielding Performance Evaluation]

A sample exhibiting an electromagnetic wave-shielding performance of 30 dB or greater at the frequencies of 100 MHz and 1 GHz was evaluated as good (○), and a sample exhibiting an electromagnetic wave-shielding performance of less than 30 dB was evaluated as poor (x).

(Humidity Resistance Test)

A sample was put into a constant temperature and humidity chamber of 85° C. and 85% RH and cooled back to room temperature after being treated for a predetermined time period (1000 hours, 2000 hours). The transparency was visually evaluated.

[Visual Evaluation]

○: Good transparency, no change
Δ: Slightly cloudy, visible
x: Cloudy, not visible (Water Resistance Test)

A sample was put into a warm bath of 80° C. and cooled back to room temperature after being treated for a predetermined time period (24 hours). The transparency was visually evaluated.

[Visual Evaluation]

○: Good transparency, no change
Δ: Slightly cloudy, visible
x: Cloudy, not visible (Adhesive Force Test)

The adhesive force of a sample was measured in conformity to the T-peel strength test (JIS K6854-3). Specifically, an electromagnetic wave-shielding layer (PC film, PET film or PE film; thickness: 100 μm each) was sandwiched between protecting layers (PC sheet; thickness: 1.0 mm) and bonded with each of various adhesive compositions to produce a test piece having a width of 25 mm and a length of 200 mm. The peel strength [N/25 mm width] was measured by a tensile tester at a peeling rate of 10 mm/min. The adhesive force of each of the electromagnetic wave-shielding layer and the protecting layers (top and bottom surfaces) was measured, and a smaller value was described as the data in the examples and the comparative examples.

(Processability Test)

An electromagnetic wave-shielding layer (PC film, PET film or PE film; thickness: 100 μm each) was sandwiched between protecting layers (PC sheet; thickness: 1.0 mm) and bonded with each of various adhesive compositions to produce a test piece having a width of 25 mm and a length of 200 mm. Four holes having a diameter of 13.5 mm were made by a table-top drilling machine, and the processing state was visually evaluated.

[Visual Evaluation]

○: The processed surface is not peeled.
Δ: The processed surface is slightly peeled.
x: The processed surface is peeled.

(Method for Preparing an Adhesive)

The components of a (meth)acrylate monomer, a (meth)acrylate oligomer, an acrylamide derivative, a silane compound, an organic phosphorus compound, a photoinitiator and the like were put into a container at each of compositions shown in Table 1, and mixed and heated at 60° C. for 1 hour.

Thus, a desired adhesive composition was obtained. The components used for the adhesive composition are as follows.
[Components of the Adhesive Composition]

Urethane (meth)acrylate-based polymerizable oligomer: dicyclohexylmethanediisocyanate-derived alicyclic hydrocarbon compound-containing urethane (meth)acrylate-based oligomer (Meth)acrylate-based polymerizable monomer: isobornyl acrylate (produced by Osaka Organic Chemical Industry Ltd.)

Acrylamide derivative: dimethylacrylamide (produced by Kabushiki Kaisha Kojinsha)

Silane compound (3-(2,3-epoxypropoxy)propyl)trimethoxysilane (produced by Shin-Etsu Chemical Co., Ltd.)

Organic phosphorus compound: acrylate phosphate (produced by Nippon Kayaku Co., Ltd.)

Photoinitiator: Irgacure 651 (trade name; produced by Ciba Specialty Chemicals)

(Method for Producing a Light-Transmitting Electromagnetic-Shielding Laminate Using a Light-Transmitting Adhesive)

Each of various adhesive compositions was applied on an electromagnetic wave-shielding layer (PC film, PET film or PE film; thickness: 100 μm each) by a roll coater, and a protecting layer (PC sheet; thickness: 1.0 mm) was provided thereon by a laminator while being defoamed. This sample was irradiated with a high pressure mercury lamp (500 W) for 90 seconds and was sufficiently cured at a radiation amount of 1 J/cm$^2$. In substantially the same manner, a protecting layer (PC sheet; thickness: 1.0 mm) was laminated on a rear surface of the electromagnetic wave-shielding layer (PC film, PET film or PE film; thickness: 100 μm each).

The resultant substance was kept still in a constant temperature and humidity chamber (23° C., 50% RH) for 24 hours and then cut into a piece having a width of 25 mm and a length of 200 mm. This was used as a sample for evaluation.
[Materials]
(Electromagnetic Wave-Shielding Layer)

A PC film, a PE film, or a PET film (thickness: 100 μm each) produced as a mesh using each of various conductive compounds and having a surface resistance value of 1[Ω/□] or less.
(Conductive Compound Mesh)

AgC conductive printing mesh: line: 100 μm; pitch: 500 μm; surface resistance: 0.5Ω/□

Copper compound thin film mesh: line: 20 μm; pitch: 180 μm; surface resistance: 0.1Ω/□

Silver compound thin film mesh: line: 20 μm; pitch: 180 μm; surface resistance: 0.1Ω/□

Aluminum compound thin film mesh: line: 20 μm; pitch: 180 μm; surface resistance: 0.1Ω/□
(Base Substrate)

PC film: Polycarbonate film (thickness: 100 μm) produced by MGC Filsheet Co., Ltd.

PE film: Polyester film (thickness: 100 μm)

PET film: Easily adhesive polyethylene terephthalate (thickness: 100 μm) produced by Toyobo Co., Ltd.
(Protecting Layer)

PC sheet: Polycarbonate sheet (thickness: 1.0 mm) produced by MGC Filsheet Co., Ltd.
(Method for Producing a Light-Transmitting Electromagnetic-Shielding Laminate Using a Hotmelt-Type Adhesive)

A hotmelt-type adhesive sheet was sandwiched between an electromagnetic wave-shielding layer (PC film; thickness: 100 μm) and a protecting layer (PC sheet; thickness: 1.0 mm) and pressed at 135° C. for 30 minutes.

The resultant substance was kept still in a constant temperature and humidity chamber (23° C., 50% RH) for 24 hours and then cut into a piece having a width of 25 mm and a length of 200 mm. This was used as a sample for evaluation.
[Hotmelt (HM)-Type Adhesive]

Ethylene vinyl acetate (EVA)-based HM-type adhesive: Elphan OH-501 produced by Nihon Matai, Co., Ltd.

Polyamide-based HM-type adhesive: Elphan NT-120 produced by Nihon Matai, Co., Ltd.

Polyurethane-based HM-type adhesive: Kurangile S-1700 produced by Kurabo Industries, Ltd.

Polyester-based HM-type adhesive: Kuranbetter G-6 produced by Kurabo Industries, Ltd.

Polyolefin-based HM-type adhesive: Kuranbetter A-1510 produced by Kurabo Industries, Ltd.
(Method for Producing a Light-Transmitting Electromagnetic-Shielding Laminate Using a Pressure-Sensitive Adhesive)

A pressure-sensitive adhesive sheet was sandwiched between an electromagnetic wave-shielding layer (PC film; thickness: 100 μm) and a protecting layer (PC sheet; thickness: 1.0 mm) and pressed for 5 minutes.

The resultant substance was kept still in a constant temperature and humidity chamber (23° C., 50% RH) for 24 hours and then cut into a piece having a width of 25 mm and a length of 200 mm. This was used as a sample for evaluation.
[Pressure-Sensitive Adhesive]

Acrylic-based pressure-sensitive adhesive sheet: CS-9621 produced by Nitto Denko Corporation Example 1

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations, the following was found. In the "electromagnetic wave-shielding performance test", the sample exhibited a good electromagnetic wave-shielding performance. In the "adhesive force test", the sample had an adhesive force of 15.8 N. In the "processability test", peeling did not occur. In the "humidity resistance test", the sample became slightly cloudy after being treated for 2000 hours, which is a good result. In the "water resistance test" also, the sample did not become cloudy after 24 hours, which means that the transparency was good.

Example 2

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for an electromagnetic wave-shielding layer of a silver compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 1, the following was found. The sample exhibited a good electromagnetic wave-shielding performance. The sample had an adhesive force of 14.0 N. In the processability test, peeling did not occur. In the humidity resistance test, the sample became slightly cloudy after being treated for 2000 hours, which is a good result. In the water resistance test also, the sample did not become cloudy after 24 hours, which means that the transparency was good.

Example 3

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for an electromagnetic wave-shielding layer of an aluminum compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 1, the following was found. The sample exhibited a good electromagnetic wave-shielding performance. The sample had an adhesive force of 12.6 N. In the processability test, peeling did not occur. In the humidity resistance test, the sample became slightly cloudy after being treated for 2000 hours, which is a good result. In the water resistance test also, the sample did not become cloudy after 24 hours, which means that the transparency was good.

Example 4

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 1, the following was found. The sample exhibited a good electromagnetic wave-shielding performance. The sample had an adhesive force of 10.0 N. In the processability test, peeling did not occur. In the humidity resistance test, the sample did not become cloudy after being treated for 1000 hours, which is a good result. In the water resistance test also, the sample did not become cloudy after 24 hours, which means that the transparency was good.

Example 5

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive" The obtained adhesive composition was used for an electromagnetic wave-shielding layer of a copper compound thin film mesh (PE film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 1, the following was found. The sample exhibited a good electromagnetic wave-shielding performance. The sample had an adhesive force of 8.0 N. In the processability test, peeling did not occur. In the humidity resistance test, the sample did not become cloudy after being treated for 1000 hours, which is a good result. In the water resistance test also, the sample did not become cloudy after 24 hours, which means that the transparency was good.

Example 6

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PET film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 1, the following was found. The sample exhibited a good electromagnetic wave-shielding performance. The sample had an adhesive force of 6.4 N. In the processability test, peeling did not occur. In the humidity resistance test, the sample did not become cloudy after being treated for 1000 hours, which is a good result. In the water resistance test also, the sample did not become cloudy after 24 hours, which means that the transparency was good.

Comparative Example 1

41.1% by weight of urethane (meth)acrylate-based polymerizable oligomer, 54.9% by weight of (meth)acrylate-based polymerizable monomer, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 1. The sample exhibited a good electromagnetic wave-shielding performance. The sample had an adhesive force of 1.1 N. In the processability test, peeling occurred. In the humidity resistance test, the sample became cloudy after being treated for 24 hours. In the water resistance test also, the sample became cloudy after being treated for 24 hours.

Comparative Example 2

An ethylene vinyl acetate (EVA)-based hotmelt-type adhesive was sandwiched between an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a hotmelt-type adhesive".

Various evaluations were performed in substantially the same manner as in Example 1. The sample exhibited a good electromagnetic wave-shielding performance. The sample had an adhesive force of 7.1 N. In the processability test, peeling did not occur. In the humidity resistance test, the sample became cloudy after being treated for 24 hours. In the water resistance test also, the sample became cloudy after being treated for 24 hours.

Comparative Example 3

A polyamide-based hotmelt-type adhesive was sandwiched between an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a hotmelt-type adhesive".

Various evaluations were performed in substantially the same manner as in Example 1. The sample exhibited a good electromagnetic wave-shielding performance. The sample had an adhesive force of 2.3 N. In the processability test, the processed surface was peeled. In the humidity resistance test, the sample became cloudy after being treated for 1000 hours. In the water resistance test also, the sample became cloudy after being treated for 24 hours.

Comparative Example 4

A polyurethane-based hotmelt-type adhesive was sandwiched between an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a hotmelt-type adhesive".

Various evaluations were performed in substantially the same manner as in Example 1. The sample exhibited a good electromagnetic wave-shielding performance. The sample had an adhesive force of 91.7 N. In the processability test, peeling did not occur. In the humidity resistance test, the sample became cloudy after being treated for 24 hours. In the water resistance test also, the sample became cloudy after being treated for 24 hours.

Comparative Example 5

A polyester-based hotmelt-type adhesive was sandwiched between an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a hotmelt-type adhesive".

Various evaluations were performed in substantially the same manner as in Example 1. The sample exhibited a good electromagnetic wave-shielding performance. The sample had an adhesive force of 107.3 N. In the processability test, peeling did not occur. In the humidity resistance test, the sample became cloudy after being treated for 24 hours. In the water resistance test also, the sample became cloudy after being treated for 24 hours.

Comparative Example 6

A polyolefin-based hotmelt-type adhesive was sandwiched between an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a hotmelt-type adhesive".

Various evaluations were performed in substantially the same manner as in Example 1. The sample exhibited a good electromagnetic wave-shielding performance. The sample had an adhesive force of 2.5 N. In the processability test, the processed surface was peeled. In the humidity resistance test, the sample became cloudy after being treated for 1000 hours. In the water resistance test also, the sample became cloudy after being treated for 24 hours.

Comparative Example 7

An acrylic-based pressure-sensitive adhesive sheet was sandwiched between an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a pressure-sensitive adhesive".

Various evaluations were performed in substantially the same manner as in Example 1. The sample exhibited a good electromagnetic wave-shielding performance. The sample had an adhesive force of 5.8 N. In the processability test, the processed surface was peeled. In the humidity resistance test, the sample became cloudy after being treated for 1000 hours. In the water resistance test also, the sample became cloudy after being treated for 24 hours.

The structures and measurement results of the samples in Examples 1 through 6 and Comparative Examples 1 through 7 are shown in Tables 1 and 2.

TABLE 1

| | Adhesive type | | Composition of (meth)acrylate adhesive (% by weight) | | | | Structure of light-transmitting electromagnetic-shielding laminate | | | |
|---|---|---|---|---|---|---|---|---|---|---|
| | | | | | | | Film or sheet substrate | | | |
| | Curing method | Main component | Urethane (meth)acrylate polymerizable oligomer | (Meth)acrylate polymerizable monomer | Acryl-amide derivative | Photo-initiator | Protecting layer | Shielding layer | Protecting layer | Conductive compound |
| Ex. 1 | Light curing adhesive | Acrylic-based | 30.4 | 40.6 | 25.0 | 4.0 | PC | PC | PC | AgC paste |
| Ex. 2 | Light curing adhesive | Acrylic-based | 30.4 | 40.6 | 25.0 | 4.0 | PC | PC | PC | Silver compound |
| Ex. 3 | Light curing adhesive | Acrylic-based | 30.4 | 40.6 | 25.0 | 4.0 | PC | PC | PC | Aluminum compound |
| Ex. 4 | Light curing adhesive | Acrylic-based | 30.4 | 40.6 | 25.0 | 4.0 | PC | PC | PC | Copper compound |
| Ex. 5 | Light curing adhesive | Acrylic-based | 30.4 | 40.6 | 25.0 | 4.0 | PC | PE | PC | Copper compound |
| Ex. 6 | Light curing adhesive | Acrylic-based | 30.4 | 40.6 | 25.0 | 4.0 | PC | PET | PC | Copper compound |
| Comparative Ex. 1 | Light curing adhesive | Acrylic-based | 41.1 | 54.9 | | 4.0 | PC | PC | PC | AgC paste |
| Comparative Ex. 2 | Hotmelt-type adhesive | EVA-based | | | | | PC | PC | PC | AgC paste |
| Comparative Ex. 3 | Hotmelt-type adhesive | Polyamide-based | | | | | PC | PC | PC | AgC paste |
| Comparative Ex. 4 | Hotmelt-type adhesive | Polyurethane-based | | | | | PC | PC | PC | AgC paste |
| Comparative Ex. 5 | Hotmelt-type adhesive | Polyester-based | | | | | PC | PC | PC | AgC paste |
| Comparative Ex. 6 | Hotmelt-type adhesive | Polyolefin-based | | | | | PC | PC | PC | AgC paste |
| Comparative Ex. 7 | Pressure-sensitive adhesive | Acrylic-based | | | | | PC | PC | PC | AgC paste |

TABLE 2

| | Adhesive type | | Shielding performance | Humidity resistance test 85° C.-85% RH | | | Water resistance test Treated in water of 80° C. | Adhesive force T-peel strength | Processability test |
|---|---|---|---|---|---|---|---|---|---|
| | Curing method | Main component | Good/poor | 24 h | 1000 h | 2000 h | 24 h | N/25 mm | Drilling Peel or not |
| Ex. 1 | Light curing adhesive | Acrylic-based | ○ | ○ | ○ | ○ | Δ | ○ | 15.8 | ○ |
| Ex. 2 | Light curing adhesive | Acrylic-based | ○ | ○ | ○ | ○ | Δ | ○ | 14.0 | ○ |
| Ex. 3 | Light curing adhesive | Acrylic-based | ○ | ○ | ○ | ○ | Δ | ○ | 12.6 | ○ |
| Ex. 4 | Light curing adhesive | Acrylic-based | ○ | ○ | ○ | ○ | X | ○ | 10.0 | ○ |
| Ex. 5 | Light curing adhesive | Acrylic-based | ○ | ○ | ○ | ○ | X | ○ | 8.0 | ○ |
| Ex. 6 | Light curing adhesive | Acrylic-based | ○ | ○ | ○ | ○ | X | ○ | 6.4 | ○ |
| Comparative Ex. 1 | Light curing adhesive | Acrylic-based | ○ | X | X | X | X | 1.1 | X |
| Comparative Ex. 2 | Hotmelt-type adhesive | EVA-based | ○ | X | X | X | X | 7.1 | ○ |
| Comparative Ex. 3 | Hotmelt-type adhesive | Polyamide-based | ○ | ○ | X | X | X | 2.3 | X |
| Comparative Ex. 4 | Hotmelt-type adhesive | Polyurethane-based | ○ | X | X | X | X | 91.7 | ○ |
| Comparative Ex. 5 | Hotmelt-type adhesive | Polyester-based | ○ | X | X | X | X | 107.3 | ○ |
| Comparative Ex. 6 | Hotmelt-type adhesive | Polyolefin-based | ○ | ○ | X | X | X | 2.5 | X |
| Comparative Ex. 7 | Pressure-sensitive adhesive | Acrylic-based | ○ | ○ | X | X | X | 5.8 | X |

Example 7

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 µm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations, the following was found. In the "electromagnetic wave-shielding performance test", the sample exhibited a good electromagnetic wave-shielding performance. In the "processability test", peeling did not occur. In the "humidity resistance test", the sample did not become cloudy after being treated for 24 hours, which is a good result. In the "water resistance test" also, the sample did not become cloudy after 24 hours, which means that the transparency was good.

Example 8

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a silver compound thin film mesh (PC film; thickness: 100 µm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 7, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 9

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of an aluminum compound thin film mesh (PC film; thickness: 100 µm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 7, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 10

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PC film; thickness: 100 µm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 7, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 11

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PE film; thickness: 100 µm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 7, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 12

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PET film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 7, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

The structures and measurement results of the samples in Examples 7 through 12 and Comparative Examples 1 through 7 are shown in Tables 3 and 4.

TABLE 3

| | Adhesive type | | Composition of (meth)acrylate adhesive (% by weight) | | | | Structure of light-transmitting electromagnetic-shielding laminate | | | |
|---|---|---|---|---|---|---|---|---|---|---|
| | | | Urethane (meth)acrylate polymerizable oligomer | (Meth)acrylate polymerizable monomer | Silane compound | Photo-initiator | Film or sheet substrate | | | |
| | Curing method | Main component | | | | | Protecting layer | Shielding layer | Protecting layer | Conductive compound |
| Ex. 7 | Light curing adhesive | Acrylic-based | 36.9 | 49.1 | 10.0 | 4.0 | PC | PC | PC | AgC paste |
| Ex. 8 | Light curing adhesive | Acrylic-based | 36.9 | 49.1 | 10.0 | 4.0 | PC | PC | PC | Silver compound |
| Ex. 9 | Light curing adhesive | Acrylic-based | 36.9 | 49.1 | 10.0 | 4.0 | PC | PC | PC | Aluminum compound |
| Ex. 10 | Light curing adhesive | Acrylic-based | 36.9 | 49.1 | 10.0 | 4.0 | PC | PC | PC | Copper compound |
| Ex. 11 | Light curing adhesive | Acrylic-based | 36.9 | 49.1 | 10.0 | 4.0 | PC | PE | PC | Copper compound |
| Ex. 12 | Light curing adhesive | Acrylic-based | 36.9 | 49.1 | 10.0 | 4.0 | PC | PET | PC | Copper compound |
| Comparative Ex. 1 | Light curing adhesive | Acrylic-based | 41.1 | 54.9 | | 4.0 | PC | PC | PC | AgC paste |
| Comparative Ex. 2 | Hotmelt-type adhesive | EVA-based | | | | | PC | PC | PC | AgC paste |
| Comparative Ex. 3 | Hotmelt-type adhesive | Polyamide-based | | | | | PC | PC | PC | AgC paste |
| Comparative Ex. 4 | Hotmelt-type adhesive | Polyurethane-based | | | | | PC | PC | PC | AgC paste |
| Comparative Ex. 5 | Hotmelt-type adhesive | Polyester-based | | | | | PC | PC | PC | AgC paste |
| Comparative Ex. 6 | Hotmelt-type adhesive | Polyolefin-based | | | | | PC | PC | PC | AgC paste |
| Comparative Ex. 7 | Pressure-sensitive adhesive | Acrylic-based | | | | | PC | PC | PC | AgC paste |

TABLE 4

| | Adhesive type | | Shielding performance | Humidity resistance test 85° C.-85% RH | Water resistance test Treated in water of 80° C. | Processability test Drilling |
|---|---|---|---|---|---|---|
| | Curing method | Main component | Good/poor | 24 h | 24 h | Peel or not |
| Ex. 7 | Light curing adhesive | Acrylic-based | ○ | ○ | ○ | ○ |
| Ex. 8 | Light curing adhesive | Acrylic-based | ○ | ○ | ○ | ○ |
| Ex. 9 | Light curing adhesive | Acrylic-based | ○ | ○ | ○ | ○ |
| Ex. 10 | Light curing adhesive | Acrylic-based | ○ | ○ | ○ | ○ |
| Ex. 11 | Light curing adhesive | Acrylic-based | ○ | ○ | ○ | ○ |
| Ex. 12 | Light curing adhesive | Acrylic-based | ○ | ○ | ○ | ○ |
| Comparative Ex. 1 | Light curing adhesive | Acrylic-based | ○ | x | x | x |
| Comparative Ex. 2 | Hotmelt-type adhesive | EVA-based | ○ | x | x | ○ |
| Comparative Ex. 3 | Hotmelt-type adhesive | Polyamide-based | ○ | ○ | x | x |
| Comparative Ex. 4 | Hotmelt-type adhesive | Polyurethane-based | ○ | x | x | ○ |
| Comparative Ex. 5 | Hotmelt-type adhesive | Polyester-based | ○ | x | x | ○ |

TABLE 4-continued

| | Adhesive type | | Shielding performance | Humidity resistance test 85° C.-85% RH | Water resistance test Treated in water of 80° C. | Processability test Drilling |
|---|---|---|---|---|---|---|
| | Curing method | Main component | Good/poor | 24 h | 24 h | Peel or not |
| Comparative Ex. 6 | Hotmelt-type adhesive | Polyolefin-based | ○ | ○ | x | x |
| Comparative Ex. 7 | Pressure-sensitive adhesive | Acrylic-based | ○ | ○ | x | x |

Example 13

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations, the following was found. In the "electromagnetic wave-shielding performance test", the sample exhibited a good electromagnetic wave-shielding performance. In the "processability test", peeling did not occur. In the "humidity resistance test", the sample did not become cloudy after being treated for 24 hours, which is a good result. In the "water resistance test" also, the sample did not become cloudy after 24 hours, which means that the transparency was good.

Example 14

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a silver compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 13, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 15

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of an aluminum compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 13, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 16

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 13, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 17

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PE film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 13, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

Example 18

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PET film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations in substantially the same manner as in Example 13, the following was found. The sample exhibited a good electromagnetic wave-shielding performance. In the processability test, peeling did not occur. In the humidity resistance test, the sample did not become cloudy after being treated for 24 hours, which is a good result. In the water resistance test also, the sample did not become cloudy after 24 hours, which means that the transparency was good.

The structures and measurement results of the samples in Examples 13 through 18 and Comparative Examples 1 through 7 are shown in Tables 5 and 6.

TABLE 5

| | Adhesive type | | Composition of (meth)acrylate adhesive (% by weight) | | | | Structure of light-transmitting electromagnetic-shielding laminate | | | |
|---|---|---|---|---|---|---|---|---|---|---|
| | | | Urethane (meth)acrylate polymerizable oligomer | (Meth)acrylate polymerizable monomer | Organic phosphorus compound | Photo-initiator | Film or sheet substrate | | | |
| | Curing method | Main component | | | | | Protecting layer | Shielding layer | Protecting layer | Conductive compound |
| Ex. 13 | Light curing adhesive | Acrylic-based | 39.0 | 52.0 | 5.0 | 4.0 | PC | PC | PC | AgC paste |
| Ex. 14 | Light curing adhesive | Acrylic-based | 39.0 | 52.0 | 5.0 | 4.0 | PC | PC | PC | Silver compound |
| Ex. 15 | Light curing adhesive | Acrylic-based | 39.0 | 52.0 | 5.0 | 4.0 | PC | PC | PC | Aluminum compound |
| Ex. 16 | Light curing adhesive | Acrylic-based | 39.0 | 52.0 | 5.0 | 4.0 | PC | PC | PC | Copper compound |
| Ex. 17 | Light curing adhesive | Acrylic-based | 39.0 | 52.0 | 5.0 | 4.0 | PC | PE | PC | Copper compound |
| Ex. 18 | Light curing adhesive | Acrylic-based | 39.0 | 52.0 | 5.0 | 4.0 | PC | PET | PC | Copper compound |
| Comparative Ex. 1 | Light curing adhesive | Acrylic-based | 41.1 | 54.9 | | 4.0 | PC | PC | PC | AgC paste |
| Comparative Ex. 2 | Hotmelt-type adhesive | EVA-based | | | | | PC | PC | PC | AgC paste |
| Comparative Ex. 3 | Hotmelt-type adhesive | Polyamide-based | | | | | PC | PC | PC | AgC paste |
| Comparative Ex. 4 | Hotmelt-type adhesive | Polyurethane-based | | | | | PC | PC | PC | AgC paste |
| Comparative Ex. 5 | Hotmelt-type adhesive | Polyester-based | | | | | PC | PC | PC | AgC paste |
| Comparative Ex. 6 | Hotmelt-type adhesive | Polyolefin-based | | | | | PC | PC | PC | AgC paste |
| Comparative Ex. 7 | Pressure-sensitive adhesive | Acrylic-based | | | | | PC | PC | PC | AgC paste |

TABLE 6

| | Adhesive type | | Shielding performance | Humidity resistance test 85° C.-85% RH | Water resistance test Treated in water of 80° C. | Processability test Drilling |
|---|---|---|---|---|---|---|
| | Curing method | Main component | Good/poor | 24 h | 24 h | Peel or not |
| Ex. 13 | Light curing adhesive | Acrylic-based | ○ | ○ | ○ | ○ |
| Ex. 14 | Light curing adhesive | Acrylic-based | ○ | ○ | ○ | ○ |

TABLE 6-continued

|  | Adhesive type | | Shielding performance | Humidity resistance test 85° C.-85% RH | Water resistance test Treated in water of 80° C. | Processability test Drilling |
|---|---|---|---|---|---|---|
|  | Curing method | Main component | Good/poor | 24 h | 24 h | Peel or not |
| Ex. 15 | Light curing adhesive | Acrylic-based | ○ | ○ | ○ | ○ |
| Ex. 16 | Light curing adhesive | Acrylic-based | ○ | ○ | ○ | ○ |
| Ex. 17 | Light curing adhesive | Acrylic-based | ○ | ○ | ○ | ○ |
| Ex. 18 | Light curing adhesive | Acrylic-based | ○ | ○ | ○ | ○ |
| Comparative Ex. 1 | Light curing adhesive | Acrylic-based | ○ | x | x | x |
| Comparative Ex. 2 | Hotmelt-type adhesive | EVA-based | ○ | x | x | ○ |
| Comparative Ex. 3 | Hotmelt-type adhesive | Polyamide-based | ○ | ○ | x | x |
| Comparative Ex. 4 | Hotmelt-type adhesive | Polyurethane-based | ○ | x | x | ○ |
| Comparative Ex. 5 | Hotmelt-type adhesive | Polyester-based | ○ | x | x | ○ |
| Comparative Ex. 6 | Hotmelt-type adhesive | Polyolefin-based | ○ | ○ | x | x |
| Comparative Ex. 7 | Pressure-sensitive adhesive | Acrylic-based | ○ | ○ | x | x |

On samples of Examples 19 through 31 described below and Comparative Example 1 through 7 described above, humidity resistance tests 1 and 2 and a water resistance test were performed as described below. The other tests were performed as described above on these samples.

(Humidity Resistance Test-1)

A sample was put into a constant temperature and humidity chamber of 85° C. and 85% RH and cooled back to room temperature after being treated for a predetermined time period (24 hours, 1000 hours, 2000 hours). The transparency was visually evaluated.

[Visual Evaluation]
○: Good transparency, no change
Δ: Slightly cloudy, visible
x: Cloudy, not visible (Humidity Resistance Test-2)

A sample was put into a constant temperature and humidity chamber of 85° C. and 95% RH and cooled back to room temperature after being treated for 250 hours. The transparency was visually evaluated.

[Visual Evaluation]
○: Good transparency, no change
Δ: Slightly cloudy, visible
x: Cloudy, not visible (Water Resistance Test)

A sample was put into a warm bath of 80° C. and cooled back to room temperature after being treated for a predetermined time period (24 hours, 250 hours, 500 hours). The transparency was visually evaluated.

[Visual Evaluation]
○: Good transparency, no change
Δ: Slightly cloudy, visible
x: Cloudy, not visible Example 19

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

As a result of performing various evaluations, the following was found. In the "electromagnetic wave-shielding performance test", the sample exhibited a good electromagnetic wave-shielding performance. In the "adhesive force test", the sample had an adhesive force of 86.4 N. In the "processability test", peeling did not occur. In the "humidity resistance tests-1 and -2", the sample did not become cloudy after being treated respectively for 2000 hours and 250 hours, which is a good result. In the "water resistance test" also, the sample did not become cloudy after 250 hours, which means that the transparency was good.

Example 20

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a silver compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 78.8 N. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 21

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of an aluminum compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 70.9 N. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 22

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 20.0 N. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 23

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PE film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 15.0 N. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 24

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PET film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 10.5 N. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 25

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 63.0 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 26

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a silver compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 56.0 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 27

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of an aluminum compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 50.4 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 28

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 18.0 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 29

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PE film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 13.5 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 30

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for an electromagnetic wave-shielding layer of a copper compound thin film mesh (PET film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 9.5 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 31

32.1% by weight of urethane (meth)acrylate-based polymerizable oligomer, 42.9% by weight of (meth)acrylate-based polymerizable monomer, 20.0% by weight of acrylamide derivative, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 77.7 N. In the processability test, peeling did not occur. In the humidity resistance test-1, the sample became slightly cloudy after being treated for 1000 hours, which is a good result. In the humidity resistance test-2, the sample became cloudy after being treated for 250 hours; but in the water resistance test, the sample did not become cloudy after 24 hours, which means that the transparency was good.

Example 32

38.6% by weight of urethane (meth)acrylate-based polymerizable oligomer, 51.4% by weight of (meth)acrylate-based polymerizable monomer, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for an electromagnetic wave-shielding layer of an AgC conductive printing mesh (PC film; thickness: 100 μm) and a protecting layer (PC sheet; thickness: 1.0 mm) to produce a sample in accordance with the "method for producing a light-transmitting electromagnetic-shielding laminate using a light-transmitting adhesive".

Various evaluations were performed in substantially the same manner as in Example 19. The sample exhibited a good electromagnetic wave-shielding performance. The sample had an adhesive force of 18.0 N. In the processability test, peeling did not occur. In the humidity resistance test-1, the sample became slightly cloudy after being treated for 1000 hours, which is a good result. In the humidity resistance test-2, the sample became cloudy after being treated for 250 hours; but in the water resistance test, the sample did not become cloudy after 24 hours, which means that the transparency was good.

The structures and measurement results of the samples in Examples 19 through 32 and Comparative Examples 1 through 7 are shown in Tables 7 and 8.

TABLE 7

| | Adhesive type | | Composition of (meth)acrylate adhesive (% by weight) | | | |
|---|---|---|---|---|---|---|
| | Curing method | Main component | Urethane (meth)acrylate polymerizable oligomer | (Meth)acrylate polymerizable monomer | Acrylamide derivative | Silane compound |
| Ex. 19 | Light curing adhesive | Acrylic-based | 30.0 | 40.0 | 20.0 | 5.0 |
| Ex. 20 | Light curing adhesive | Acrylic-based | 30.0 | 40.0 | 20.0 | 5.0 |
| Ex. 21 | Light curing adhesive | Acrylic-based | 30.0 | 40.0 | 20.0 | 5.0 |
| Ex. 22 | Light curing adhesive | Acrylic-based | 30.0 | 40.0 | 20.0 | 5.0 |
| Ex. 23 | Light curing adhesive | Acrylic-based | 30.0 | 40.0 | 20.0 | 5.0 |
| Ex. 24 | Light curing adhesive | Acrylic-based | 30.0 | 40.0 | 20.0 | 5.0 |
| Ex. 25 | Light curing adhesive | Acrylic-based | 30.4 | 40.6 | 20.0 | 5.0 |
| Ex. 26 | Light curing adhesive | Acrylic-based | 30.4 | 40.6 | 20.0 | 5.0 |
| Ex. 27 | Light curing adhesive | Acrylic-based | 30.4 | 40.6 | 20.0 | 5.0 |
| Ex. 28 | Light curing adhesive | Acrylic-based | 30.4 | 40.6 | 20.0 | 5.0 |
| Ex. 29 | Light curing adhesive | Acrylic-based | 30.4 | 40.6 | 20.0 | 5.0 |
| Ex. 30 | Light curing adhesive | Acrylic-based | 30.4 | 40.6 | 20.0 | 5.0 |
| Ex. 31 | Light curing adhesive | Acrylic-based | 32.1 | 42.9 | 20.0 | |
| Ex. 32 | Light curing adhesive | Acrylic-based | 38.6 | 51.4 | | 5.0 |

TABLE 7-continued

| | | | | |
|---|---|---|---|---|
| Comparative Ex. 1 | Light curing adhesive | Acrylic-based | 41.1 | 54.9 |
| Comparative Ex. 2 | Hotmelt-type adhesive | EVA-based | | |
| Comparative Ex. 3 | Hotmelt-type adhesive | Polyamide-based | | |
| Comparative Ex. 4 | Hotmelt-type adhesive | Polyurethane-based | | |
| Comparative Ex. 5 | Hotmelt-type adhesive | Polyester-based | | |
| Comparative Ex. 6 | Hotmelt-type adhesive | Polyolefin-based | | |
| Comparative Ex. 7 | Pressure-sensitive adhesive | Acrylic-based | | |

| | Composition of (meth)acrylate adhesive (% by weight) | | Structure of light-transmitting electromagnetic-shielding laminate | | | |
|---|---|---|---|---|---|---|
| | Organic phosphorus compound | Photo-initiator | Film or sheet substrate | | | Conductive compound |
| | | | Protecting layer | Shielding layer | Protecting layer | |
| Ex. 19 | 1.0 | 4.0 | PC | PC | PC | AgC paste |
| Ex. 20 | 1.0 | 4.0 | PC | PC | PC | Silver compound |
| Ex. 21 | 1.0 | 4.0 | PC | PC | PC | Aluminum compound |
| Ex. 22 | 1.0 | 4.0 | PC | PC | PC | Copper compound |
| Ex. 23 | 1.0 | 4.0 | PC | PE | PC | Copper compound |
| Ex. 24 | 1.0 | 4.0 | PC | PET | PC | Copper compound |
| Ex. 25 | | 4.0 | PC | PC | PC | AgC paste |
| Ex. 26 | | 4.0 | PC | PC | PC | Silver compound |
| Ex. 27 | | 4.0 | PC | PC | PC | Aluminum compound |
| Ex. 28 | | 4.0 | PC | PC | PC | Copper compound |
| Ex. 29 | | 4.0 | PC | PE | PC | Copper compound |
| Ex. 30 | | 4.0 | PC | PET | PC | Copper compound |
| Ex. 31 | 1.0 | 4.0 | PC | PC | PC | AgC paste |
| Ex. 32 | 1.0 | 4.0 | PC | PC | PC | AgC paste |
| Comparative Ex. 1 | | 4.0 | PC | PC | PC | AgC paste |
| Comparative Ex. 2 | | | PC | PC | PC | AgC paste |
| Comparative Ex. 3 | | | PC | PC | PC | AgC paste |
| Comparative Ex. 4 | | | PC | PC | PC | AgC paste |
| Comparative Ex. 5 | | | PC | PC | PC | AgC paste |
| Comparative Ex. 6 | | | PC | PC | PC | AgC paste |
| Comparative Ex. 7 | | | PC | PC | PC | AgC paste |

TABLE 8

| | Adhesive type | | Shielding performance | Humidity resistance test - 1 85° C.-85% RH | | | Humidity resistance test - 2 85° C.-95% RH | Water resistance test Treated in water of 80° C. | | | Adhesive force T-peel strength | Processa-bility test Drilling |
|---|---|---|---|---|---|---|---|---|---|---|---|---|
| | Curing method | Main component | Good/poor | 24 h | 1000 h | 2000 h | 250 h | 24 h | 250 h | 500 h | N/25 mm | Peel or not |
| Ex. 19 | Light curing adhesive | Acrylic-based | ○ | ○ | ○ | ○ | ○ | ○ | ○ | Δ | 86.4 | ○ |
| Ex. 20 | Light curing adhesive | Acrylic-based | ○ | ○ | ○ | ○ | ○ | ○ | ○ | Δ | 78.8 | ○ |

TABLE 8-continued

| | Adhesive type | | Shielding performance | Humidity resistance test - 1 85° C.-85% RH | | | Humidity resistance test - 2 85° C.-95% RH | Water resistance test Treated in water of 80° C. | | | Adhesive force T-peel strength | Processa- bility test Drilling |
|---|---|---|---|---|---|---|---|---|---|---|---|---|
| | Curing method | Main component | Good/poor | 24 h | 1000 h | 2000 h | 250 h | 24 h | 250 h | 500 h | N/25 mm | Peel or not |
| Ex. 21 | Light curing adhesive | Acrylic-based | ○ | ○ | ○ | ○ | ○ | ○ | ○ | Δ | 70.9 | ○ |
| Ex. 22 | Light curing adhesive | Acrylic-based | ○ | ○ | ○ | ○ | ○ | ○ | ○ | x | 20.0 | ○ |
| Ex. 23 | Light curing adhesive | Acrylic-based | ○ | ○ | ○ | ○ | ○ | ○ | ○ | x | 15.0 | ○ |
| Ex. 24 | Light curing adhesive | Acrylic-based | ○ | ○ | ○ | ○ | ○ | ○ | ○ | x | 10.5 | ○ |
| Ex. 25 | Light curing adhesive | Acrylic-based | ○ | ○ | ○ | ○ | Δ | x | ○ | x | x | 63.0 | ○ |
| Ex. 26 | Light curing adhesive | Acrylic-based | ○ | ○ | ○ | ○ | Δ | x | ○ | x | x | 56.0 | ○ |
| Ex. 27 | Light curing adhesive | Acrylic-based | ○ | ○ | ○ | ○ | Δ | x | ○ | x | x | 50.4 | ○ |
| Ex. 28 | Light curing adhesive | Acrylic-based | ○ | ○ | ○ | ○ | Δ | x | ○ | x | x | 18.0 | ○ |
| Ex. 29 | Light curing adhesive | Acrylic-based | ○ | ○ | ○ | ○ | Δ | x | ○ | x | x | 13.5 | ○ |
| Ex. 30 | Light curing adhesive | Acrylic-based | ○ | ○ | ○ | ○ | Δ | x | ○ | x | x | 9.5 | ○ |
| Ex. 31 | Light curing adhesive | Acrylic-based | ○ | ○ | ○ | Δ | x | x | ○ | x | x | 77.7 | ○ |
| Ex. 32 | Light curing adhesive | Acrylic-based | ○ | ○ | ○ | Δ | x | x | ○ | x | x | 18.0 | ○ |
| Comparative Ex. 1 | Light curing adhesive | Acrylic-based | ○ | x | x | x | x | x | x | x | 1.1 | x |
| Comparative Ex. 2 | Hotmelt-type adhesive | EVA-based | ○ | x | x | x | x | x | x | x | 7.1 | ○ |
| Comparative Ex. 3 | Hotmelt-type adhesive | Polyamide- based | ○ | ○ | x | x | x | x | x | x | 2.3 | x |
| Comparative Ex. 4 | Hotmelt-type adhesive | Polyurethane- based | ○ | x | x | x | x | x | x | x | 91.7 | ○ |
| Comparative Ex. 5 | Hotmelt-type adhesive | Polyester- based | ○ | x | x | x | x | x | x | x | 107.3 | ○ |
| Comparative Ex. 6 | Hotmelt-type adhesive | Polyolefin- based | ○ | ○ | x | x | x | x | x | x | 2.5 | x |
| Comparative Ex. 7 | Pressure- sensitive adhesive | Acrylic-based | ○ | ○ | x | x | x | x | x | x | 5.8 | x |

Hereinafter, specific embodiments and effects of a light-transmitting radio wave absorber according to another embodiment of the present invention will be specifically described by way of examples and comparative examples. The present invention is not limited to these specific embodiments or examples in any way. The evaluation results described in the examples and the comparative examples were obtained by the following tests.

(Radio Wave Absorbing Performance Test)

A horn antenna for transmission was located at a predetermined angle with respect to a sample, and a radio wave having a frequency of 5.8 GHz was output toward the sample. Next, the radio wave reflected by the sample was received by a horn antenna for receiving, and a value obtained as a result of an analysis by a network analyzer was set as the radio wave absorbing performance of the sample. The radio wave absorbing performance was measured while the incidence angle of the radio wave was changed every 10 degrees in the range of 10 to 80 degrees.

[Radio Wave Absorbing Performance Evaluation]

A sample exhibiting a radio wave absorbing performance of a reflectance attenuation ratio of 20 dB or greater in the incidence angle range of 10 to 45 degrees and a reflectance attenuation ratio of 15 dB or greater in the incidence angle range of 45 to 80 degrees was evaluated as good (○), and a sample not fulfilling such a radio wave absorbing performance was evaluated as poor (x).

(Humidity Resistance Test)

A sample was put into a constant temperature and humidity chamber of 85° C. and 85% RH and cooled back to room temperature after being treated for a predetermined time period (24 hours, 1000 hours, 2000 hours). The transparency was visually evaluated.

[Visual Evaluation]

○: Good transparency, no change
Δ: Slightly cloudy, visible
x: Cloudy, not visible (Water resistance Test)

A sample was put into a warm bath of 80° C. and cooled back to room temperature after being treated for a predetermined time period (24 hours). The transparency was visually evaluated.

[Visual Evaluation]

○: Good transparency, no change
Δ: Slightly cloudy, visible
x: Cloudy, not visible (Adhesive Force Test)

The adhesive force of a sample was measured in conformity to the 180-degree peel strength test (JIS K6854-2). Specifically, a resisting layer (PC sheet; thickness: 0.5 mm or PET film; thickness: 100 μm), a dielectric spacer (PC sheet; thickness: 4.0 mm), and a reflecting layer (PC sheet; thickness: 0.5 mm or PET film; thickness: 100 μm) were bonded together with each of various adhesive compositions to produce a test piece having a width of 25 mm and a length of 200 mm. The peel strength [N/25 mm width] was measured by a tensile tester at a peeling rate of 100 mm/min. The adhesive force of each of the resisting layer and the reflecting layer was measured, and a smaller value was described as the data in the examples and the comparative examples.

(Processability Test)

A resisting layer (PC sheet; thickness: 0.5 mm or PET film; thickness: 100 μm), a dielectric spacer (PC sheet; thickness: 4.0 mm), and a reflecting layer (PC sheet; thickness: 0.5 mm or PET film; thickness: 100 μm) were bonded together with each of various adhesive compositions to produce a test piece having a width of 25 mm and a length of 200 mm. Four holes having a diameter of 13.5 mm were made by a table-top drilling machine, and the processing state was visually evaluated.

[Visual Evaluation]

○: The processed surface is not peeled.

Δ: The processed surface is slightly peeled.

x: The processed surface is peeled.

(Method for Preparing an Adhesive)

The components of a (meth)acrylate monomer, a (meth)acrylate oligomer, an acrylamide derivative, a silane compound, an organic phosphorus compound, a photoinitiator and the like were put into a container at each of compositions shown in Table 9, and mixed and heated at 60° C. for 1 hour. Thus, a desired adhesive composition was obtained. The components used for the adhesive composition are as follows.

[Components of the Adhesive Composition]

Urethane (meth)acrylate-based polymerizable oligomer: dicyclohexylmethanediisocyanate-derived alicyclic hydrocarbon compound-containing urethane (meth)acrylate-based oligomer (Meth)acrylate-based polymerizable monomer: isobornyl acrylate (produced by Osaka Organic Chemical Industry Ltd.)

Acrylamide derivative: dimethylacrylamide (produced by Kabushiki Kaisha Kojinsha)

Silane compound: (3-(2,3-epoxypropoxy)propyl)trimethoxysilane (produced by Shin-Etsu Chemical Co., Ltd.)

Organic phosphorus compound: acrylate phosphate (produced by Nippon Kayaku Co., Ltd.)

Photoinitiator: Irgacure 651 (trade name; produced by Ciba Specialty Chemicals)

(Method for Producing a Light-Transmitting Radio Wave Absorber Using a Light-Transmitting Adhesive)

Each of various adhesive compositions was applied on a dielectric spacer (PC sheet; thickness: 4.0 mm) by a roll coater, and a resisting layer (PC sheet; thickness: 0.5 mm or PET film; thickness: 100 μm) was provided thereon by a laminator while being defoamed. This sample was irradiated with a high pressure mercury lamp (500 W) for 90 seconds and was sufficiently cured at a radiation amount of 1 J/cm$^2$. In substantially the same manner, a reflecting layer (PC sheet; thickness: 0.5 mm or PET film; thickness: 100 μm) was laminated on a rear surface of the dielectric spacer (PC sheet; thickness: 0.5 mm).

The resultant substance was kept still in a constant temperature and humidity chamber (23° C., 50% RH) for 24 hours and then cut into a piece having a width of 25 mm and a length of 200 mm. This was used as a sample for evaluation.

[Materials]

Resisting layer: PC sheet (thickness: 0.5 mm) or PET film (thickness: 100 μm) having a loop pattern formed of an AgC conductive paste or a silver compound and having a surface resistance value of 20[Ω/□]

Dielectric spacer: PC sheet (thickness: 4.0 mm)

Reflecting layer: PC sheet (thickness: 0.5 mm) or PET film (thickness: 100 μm) having a mesh pattern formed of an AgC conductive paste or a copper compound and having a surface resistance value of 1[Ω/□] or less PC sheet: Polycarbonate sheet (thickness: 0.5 mm) produced by MGC Filsheet Co., Ltd.

PC sheet: Polycarbonate sheet (thickness: 4.0 mm) produced by MGC Filsheet Co., Ltd.

PET film: Easily adhesive polyethylene terephthalate (thickness: 100 μm) produced by Toyobo Co., Ltd.

(Method for Producing a Light-Transmitting Radio Wave Absorber Using a Hotmelt-Type Adhesive)

A hotmelt-type adhesive sheet was sandwiched between a resisting layer (PC sheet; thickness: 0.5 mm or PET film; thickness: 100 μm), a dielectric spacer (PC sheet; thickness: 4.0 mm), and a reflecting layer (PC sheet; thickness: 0.5 mm or PET film; thickness: 100 μm) and pressed at 135° C. for 30 minutes.

The resultant substance was kept still in a constant temperature and humidity chamber (23° C., 50% RH) for 24 hours and then cut into a piece having a width of 25 mm and a length of 200 mm. This was used as a sample for evaluation.

[Hotmelt (HM)-Type Adhesive]

Ethylene vinyl acetate (EVA)-based HM-type adhesive: Elphan OH-501 produced by Nihon Matai, Co., Ltd.

Polyamide-based HM-type adhesive: Elphan NT-120 produced by Nihon Matai, Co., Ltd.

Polyurethane-based HM-type adhesive: Kurangile S-1700 produced by Kurabo Industries, Ltd.

Polyester-based HM-type adhesive: Kuranbetter G-6 produced by Kurabo Industries, Ltd.

Polyolefin-based HM-type adhesive: Kuranbetter A-1510 produced by Kurabo Industries, Ltd.

(Method for Producing a Light-Transmitting Radio Wave Absorber Using a Pressure-Sensitive Adhesive)

A pressure-sensitive adhesive sheet was sandwiched between a resisting layer (PC sheet; thickness: 0.5 mm or PET film; thickness: 100 μm), a dielectric spacer (PC sheet; thickness: 4.0 mm), and a reflecting layer (PC sheet; thickness: 0.5 mm or PET film; thickness: 100 μm) and pressed for 5 minutes.

The resultant substance was kept still in a constant temperature and humidity chamber (23° C., 50% RH) for 24 hours and then cut into a piece having a width of 25 mm and a length of 200 mm. This was used as a sample for evaluation.

[Pressure-Sensitive Adhesive]

Acrylic-based pressure-sensitive adhesive sheet: CS-9621 produced by Nitto Denko Corporation Example 33

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed. In the "radio wave absorbing performance test", the sample exhibited a good radio wave absorbing performance. In the "adhesive force test", the sample had an adhesive force of 15.8 N. In the "processability test", peeling did not occur. In the "humidity resistance test", the sample became slightly cloudy after being treated for 2000 hours, which is a good result. In the "water resistance test" also, the sample did not become cloudy after being treated for 24 hours, which means that the transparency was good.

Example 34

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using a copper compound paste to produce a sample in accordance with the "method for producing a light-transmitting radio wave absorber using a light-transmitting adhesive".

Various evaluations were performed in substantially the same manner as in Example 33. The sample exhibited a good radio wave absorbing performance. The sample had an adhesive force of 10.0 N (reflecting layer: copper compound mesh). In the processability test, peeling did not occur. In the humidity resistance test, the sample did not become cloudy after being treated for 1000 hours, which is a good result. In the water resistance test also, the sample did not become cloudy after being treated for 24 hours, which means that the transparency was good.

Example 35

30.4% by weight of urethane (meth)acrylate-based polymerizable oligomer, 40.6% by weight of (meth)acrylate-based polymerizable monomer, 25.0% by weight of acrylamide derivative, and 4.0% by weight of photoinitiator were put into a container, and an adhesive composition was prepared in accordance with the "method for preparing an adhesive". The obtained adhesive composition was used for a resisting layer (PC) using a silver compound, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 33. The sample exhibited a good radio wave absorbing performance. The sample had an adhesive force of 14.0 N (resisting layer: silver compound loop pattern). In the processability test, peeling did not occur. In the humidity resistance test, the sample did not become cloudy after being treated for 2000 hours, which is a good result. In the water resistance test also, the sample did not become cloudy after being treated for 24 hours, which means that the transparency was good.

Comparative Example 8

41.1% by weight of urethane (meth)acrylate-based polymerizable oligomer, 54.9% by weight of (meth)acrylate-based polymerizable monomer, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 33. The sample exhibited a good radio wave absorbing performance. The sample had an adhesive force of 1.1 N. In the processability test, peeling occurred. In the humidity resistance test, the sample became cloudy after being treated for 24 hours. In the water resistance test also, the sample became cloudy after being treated for 24 hours.

Comparative Example 9

An ethylene vinyl acetate (EVA)-based hotmelt-type adhesive was sandwiched between a resisting layer (PC) using an AgC paste, a dielectric spacer (PC), and a reflecting layer (PC) using an AgC paste to produce a sample in accordance with the "method for producing a light-transmitting radio wave absorber using a hotmelt-type adhesive".

Various evaluations were performed in substantially the same manner as in Example 33. The sample exhibited a good radio wave absorbing performance. The sample had an adhesive force of 7.1 N. In the processability test, peeling did not occur. In the humidity resistance test, the sample became cloudy after being treated for 24 hours. In the water resistance test also, the sample became cloudy after being treated for 24 hours.

Comparative Example 10

A polyamide-based hotmelt-type adhesive was sandwiched between a resisting layer (PC) using an AgC paste, a dielectric spacer (PC), and a reflecting layer (PC) using an AgC paste to produce a sample in accordance with the "method for producing a light-transmitting radio wave absorber using a hotmelt-type adhesive".

Various evaluations were performed in substantially the same manner as in Example 33. The sample exhibited a good radio wave absorbing performance. The sample had an adhesive force of 2.3 N. In the processability test, the processed surface was peeled. In the humidity resistance test, the sample became cloudy after being treated for 1000 hours. In the water resistance test also, the sample became cloudy after being treated for 24 hours.

Comparative Example 11

A polyurethane-based hotmelt-type adhesive was sandwiched between a resisting layer (PC) using an AgC paste, a dielectric spacer (PC), and a reflecting layer (PC) using an AgC paste to produce a sample in accordance with the "method for producing a light-transmitting radio wave absorber using a hotmelt-type adhesive".

Various evaluations were performed in substantially the same manner as in Example 33. The sample exhibited a good radio wave absorbing performance. The sample had an adhesive force of 91.7 N. In the processability test, peeling did not occur. In the humidity resistance test, the sample became cloudy after being treated for 24 hours. In the water resistance test also, the sample became cloudy after being treated for 24 hours.

Comparative Example 12

A polyester-based hotmelt-type adhesive was sandwiched between a resisting layer (PC) using an AgC paste, a dielectric spacer (PC), and a reflecting layer (PC) using an AgC paste to produce a sample in accordance with the "method for producing a light-transmitting radio wave absorber using a hotmelt-type adhesive".

Various evaluations were performed in substantially the same manner as in Example 33. The sample exhibited a good radio wave absorbing performance. The sample had an adhesive force of 107.3 N. In the processability test, peeling did not occur. In the humidity resistance test, the sample became cloudy after being treated for 24 hours. In the water resistance test also, the sample became cloudy after being treated for 24 hours.

Comparative Example 13

A polyolefin-based hotmelt-type adhesive was sandwiched between a resisting layer (PC) using an AgC paste, a dielectric spacer (PC), and a reflecting layer (PC) using an AgC paste to produce a sample in accordance with the "method for producing a light-transmitting radio wave absorber using a hotmelt-type adhesive".

Various evaluations were performed in substantially the same manner as in Example 33. The sample exhibited a good radio wave absorbing performance. The sample had an adhesive force of 2.5 N. In the processability test, the processed surface was peeled. In the humidity resistance test, the sample became cloudy after being treated for 1000 hours. In the water resistance test also, the sample became cloudy after being treated for 24 hours.

Comparative Example 14

An acrylic-based pressure-sensitive adhesive sheet was sandwiched between a resisting layer (PC) using an AgC paste, a dielectric spacer (PC), and a reflecting layer (PC) using an AgC paste to produce a sample in accordance with the "method for producing a light-transmitting radio wave absorber using a pressure-sensitive adhesive".

Various evaluations were performed in substantially the same manner as in Example 33. The sample exhibited a good radio wave absorbing performance. The sample had an adhesive force of 5.8 N. In the processability test, the processed surface was peeled. In the humidity resistance test, the sample became cloudy after being treated for 1000 hours. In the water resistance test also, the sample became cloudy after being treated for 24 hours.

The structures and measurement results of the samples in Examples 33 through 35 and Comparative Examples 8 through 14 are shown in Tables 9 and 10.

TABLE 9

| | Adhesive type | | Composition of (meth)acrylate adhesive (% by weight) | | | |
|---|---|---|---|---|---|---|
| | | | Urethane (meth)acrylate | (Meth)acrylate | | |
| | Curing method | Main component | polymerizable oligomer | polymerizable monomer | Acrylamide derivative | Photo-initiator |
| Ex. 33 | Light curing adhesive | Acrylic-based | 30.4 | 40.6 | 25.0 | 4.0 |
| Ex. 34 | Light curing adhesive | Acrylic-based | 30.4 | 40.6 | 25.0 | 4.0 |
| Ex. 35 | Light curing adhesive | Acrylic-based | 30.4 | 40.6 | 25.0 | 4.0 |
| Comparative Ex. 8 | Light curing adhesive | Acrylic-based | 41.1 | 54.9 | | 4.0 |
| Comparative Ex. 9 | Hotmelt-type adhesive | EVA-based | | | | |
| Comparative Ex. 10 | Hotmelt-type adhesive | Polyamide-based | | | | |
| Comparative Ex. 11 | Hotmelt-type adhesive | Polyurethane-based | | | | |
| Comparative Ex. 12 | Hotmelt-type adhesive | Polyester-based | | | | |
| Comparative Ex. 13 | Hotmelt-type adhesive | Polyolefin-based | | | | |
| Comparative Ex. 14 | Pressure-sensitive adhesive | Acrylic-based | | | | |

| | Structure of pattern-type radio wave absorber | | | | |
|---|---|---|---|---|---|
| | Substrate | | | Conductive compound | |
| | Resisting layer | Dielectric spacer | Reflecting layer | Resisting layer | Reflecting layer |
| Ex. 33 | PC | PC | PC | AgC paste | AgC paste |
| Ex. 34 | PC | PC | PC | AgC paste | Copper compound |
| Ex. 35 | PC | PC | PC | Silver compound | AgC paste |

TABLE 9-continued

| | | | | | |
|---|---|---|---|---|---|
| Comparative Ex. 8 | PC | PC | PC | AgC paste | AgC paste |
| Comparative Ex. 9 | PC | PC | PC | AgC paste | AgC paste |
| Comparative Ex. 10 | PC | PC | PC | AgC paste | AgC paste |
| Comparative Ex. 11 | PC | PC | PC | AgC paste | AgC paste |
| Comparative Ex. 12 | PC | PC | PC | AgC paste | AgC paste |
| Comparative Ex. 13 | PC | PC | PC | AgC paste | AgC paste |
| Comparative Ex. 14 | PC | PC | PC | AgC paste | AgC paste |

TABLE 10

| | Adhesive type | | Radio wave absorbing performance 5.6 GHz | Humidity resistance test 85° C.-85% RH | | | Water resistance test Treated in water of 80° C. | Adhesive force 180-degree peel strength | Processability test Drilling |
|---|---|---|---|---|---|---|---|---|---|
| | Curing method | Main component | Good/poor | 24 h | 1000 h | 2000 h | 24 h | N/25 mm | Peel or not |
| Ex. 33 | Light curing adhesive | Acrylic-based | ○ | ○ | ○ | ○ | Δ | ○ | 15.8 | ○ |
| Ex. 34 | Light curing adhesive | Acrylic-based | ○ | ○ | ○ | ○ | x | ○ | 10.0 (reflecting layer) | ○ |
| Ex. 35 | Light curing adhesive | Acrylic-based | ○ | ○ | ○ | ○ | Δ | ○ | 14.0 (resisting layer) | ○ |
| Comparative Ex. 8 | Light curing adhesive | Acrylic-based | ○ | x | x | x | x | 1.1 | x |
| Comparative Ex. 9 | Hotmelt-type adhesive | EVA-based | ○ | x | x | x | x | 7.1 | ○ |
| Comparative Ex. 10 | Hotmelt-type adhesive | Polyamide-based | ○ | ○ | x | x | x | 2.3 | x |
| Comparative Ex. 11 | Hotmelt-type adhesive | Polyurethane-based | ○ | x | x | x | x | 91.7 | ○ |
| Comparative Ex. 12 | Hotmelt-type adhesive | Polyester-based | ○ | x | x | x | x | 107.3 | ○ |
| Comparative Ex. 13 | Hotmelt-type adhesive | Polyolefin-based | ○ | ○ | x | x | x | 2.5 | x |
| Comparative Ex. 14 | Pressure-sensitive adhesive | Acrylic-based | ○ | ○ | x | x | x | 5.8 | x |

Example 36

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

As a result of performing various evaluations, the following was found. In the "radio wave absorbing performance test", the sample exhibited a good radio wave absorbing performance. In the processability test by the "adhesive force test", peeling did not occur. In the "humidity resistance test" and the "water resistance test", the sample did not become cloudy after being treated for 24 hours, which means that the transparency was good.

Example 37

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using a copper compound to produce a sample in accordance with the "method for producing a light-transmitting radio wave absorber using a light-transmitting adhesive".

Various evaluations were performed in substantially the same manner as in Example 36. The sample exhibited a good radio wave absorbing performance. In the processability test, peeling did not occur. In the humidity resistance test and the water resistance test, the sample did not become cloudy after being treated for 24 hours, which means that the transparency was good.

Example 38

36.9% by weight of urethane (meth)acrylate-based polymerizable oligomer, 49.1% by weight of (meth)acrylate-based polymerizable monomer, 10.0% by weight of silane compound, and 4.0% by weight of photoinitiator were put into a container, and an adhesive composition was prepared in accordance with the "method for preparing an adhesive". The obtained adhesive composition was used for a resisting layer (PC) using a silver compound, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 36. The sample exhibited a good radio wave absorbing performance. In the processability test, peeling did not occur. In the humidity resistance test and the water resistance test, the sample did not become cloudy after being treated for 24 hours, which means that the transparency was good.

The structures and measurement results of the samples in Examples 36 through 38 and Comparative Examples 8 through 14 are shown in Tables 11 and 12.

TABLE 11

| | Adhesive type | | Composition of (meth)acrylate adhesive (% by weight) | | | |
|---|---|---|---|---|---|---|
| | Curing method | Main component | Urethane (meth)acrylate polymerizable oligomer | (Meth)acrylate polymerizable monomer | Silane compound | Photo-initiator |
| Ex. 36 | Light curing adhesive | Acrylic-based | 36.9 | 49.1 | 10.0 | 4.0 |
| Ex. 37 | Light curing adhesive | Acrylic-based | 36.9 | 49.1 | 10.0 | 4.0 |
| Ex. 38 | Light curing adhesive | Acrylic-based | 36.9 | 49.1 | 10.0 | 4.0 |
| Comparative Ex. 8 | Light curing adhesive | Acrylic-based | 41.1 | 54.9 | | 4.0 |
| Comparative Ex. 9 | Hotmelt-type adhesive | EVA-based | | | | |
| Comparative Ex. 10 | Hotmelt-type adhesive | Polyamide-based | | | | |
| Comparative Ex. 11 | Hotmelt-type adhesive | Polyurethane-based | | | | |
| Comparative Ex. 12 | Hotmelt-type adhesive | Polyester-based | | | | |
| Comparative Ex. 13 | Hotmelt-type adhesive | Polyolefin-based | | | | |
| Comparative Ex. 14 | Pressure-sensitive adhesive | Acrylic-based | | | | |

| | Structure of pattern-type radio wave absorber | | | | |
|---|---|---|---|---|---|
| | Substrate | | | Conductive compound | |
| | Resisting layer | Dielectric spacer | Reflecting layer | Resisting layer | Reflecting layer |
| Ex. 36 | PC | PC | PC | AgC paste | AgC paste |
| Ex. 37 | PC | PC | PC | AgC paste | Copper compound |
| Ex. 38 | PC | PC | PC | Silver compound | AgC paste |
| Comparative Ex. 8 | PC | PC | PC | AgC paste | AgC paste |
| Comparative Ex. 9 | PC | PC | PC | AgC paste | AgC paste |
| Comparative Ex. 10 | PC | PC | PC | AgC paste | AgC paste |
| Comparative Ex. 11 | PC | PC | PC | AgC paste | AgC paste |
| Comparative Ex. 12 | PC | PC | PC | AgC paste | AgC paste |
| Comparative Ex. 13 | PC | PC | PC | AgC paste | AgC paste |
| Comparative Ex. 14 | PC | PC | PC | AgC paste | AgC paste |

TABLE 12

| | Adhesive type | | Radio wave absorbing performance 5.6 GHz | Humidity resistance test 85° C.-85% RH | Water resistance test Treated in water of 80° C. | Processability test Drilling |
|---|---|---|---|---|---|---|
| | Curing method | Main component | Good/poor | 24 h | 24 h | Peel or not |
| Ex. 36 | Light curing adhesive | Acrylic-based | ○ | ○ | ○ | ○ |
| Ex. 37 | Light curing adhesive | Acrylic-based | ○ | ○ | ○ | ○ |
| Ex. 38 | Light curing adhesive | Acrylic-based | ○ | ○ | ○ | ○ |
| Comparative Ex. 8 | Light curing adhesive | Acrylic-based | ○ | x | x | x |
| Comparative Ex. 9 | Hotmelt-type adhesive | EVA-based | ○ | x | x | ○ |
| Comparative Ex. 10 | Hotmelt-type adhesive | Polyamide-based | ○ | ○ | x | x |
| Comparative Ex. 11 | Hotmelt-type adhesive | Polyurethane-based | ○ | x | x | ○ |
| Comparative Ex. 12 | Hotmelt-type adhesive | Polyester-based | ○ | x | x | ○ |
| Comparative Ex. 13 | Hotmelt-type adhesive | Polyolefin-based | ○ | ○ | x | x |
| Comparative Ex. 14 | Pressure-sensitive adhesive | Acrylic-based | ○ | ○ | x | x |

Example 39

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed. In the "radio wave absorbing performance test", the sample exhibited a good radio wave absorbing performance. In the "processability test", peeling did not occur. In the "humidity resistance test" and the "water resistance test", the sample did not become cloudy after being treated for 24 hours, which means that the transparency was good.

Example 40

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using a copper compound to produce a sample in accordance with the "method for producing a light-transmitting radio wave absorber using a light-transmitting adhesive".

Various evaluations were performed in substantially the same manner as in Example 1. The sample exhibited a good radio wave absorbing performance. In the processability test, peeling did not occur. In the humidity resistance test and the water resistance test, the sample did not become cloudy after being treated for 24 hours, which means that the transparency was good.

Example 41

39.0% by weight of urethane (meth)acrylate-based polymerizable oligomer, 52.0% by weight of (meth)acrylate-based polymerizable monomer, 5.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using a silver compound, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 1. The sample exhibited a good radio wave absorbing performance. In the processability test, peeling did not occur. In the humidity resistance test and the water resistance test, the sample did not become cloudy after being treated for 24 hours, which means that the transparency was good.

The structures and measurement results of the samples in Examples 39 through 41 and Comparative Examples 8 through 14 are shown in Tables 13 and 14.

TABLE 13

| | Adhesive type | | Composition of (meth)acrylate adhesive (% by weight) | | | |
|---|---|---|---|---|---|---|
| | Curing method | Main component | Urethane (meth)acrylate polymerizable oligomer | (Meth)acrylate polymerizable monomer | Organic phosphorus compound | Photo-initiator |
| Ex. 39 | Light curing adhesive | Acrylic-based | 39.0 | 52.0 | 5.0 | 4.0 |
| Ex. 40 | Light curing adhesive | Acrylic-based | 39.0 | 52.0 | 5.0 | 4.0 |
| Ex. 41 | Light curing adhesive | Acrylic-based | 39.0 | 52.0 | 5.0 | 4.0 |
| Comparative Ex. 8 | Light curing adhesive | Acrylic-based | 41.1 | 54.9 | | 4.0 |
| Comparative Ex. 9 | Hotmelt-type adhesive | EVA-based | | | | |
| Comparative Ex. 10 | Hotmelt-type adhesive | Polyamide-based | | | | |
| Comparative Ex. 11 | Hotmelt-type adhesive | Polyurethane-based | | | | |
| Comparative Ex. 12 | Hotmelt-type adhesive | Polyester-based | | | | |
| Comparative Ex. 13 | Hotmelt-type adhesive | Polyolefin-based | | | | |
| Comparative Ex. 14 | Pressure-sensitive adhesive | Acrylic-based | | | | |

| | Structure of pattern-type radio wave absorber | | | | |
|---|---|---|---|---|---|
| | Substrate | | | Conductive compound | |
| | Resisting layer | Dielectric spacer | Reflecting layer | Resisting layer | Reflecting layer |
| Ex. 39 | PC | PC | PC | AgC paste | AgC paste |
| Ex. 40 | PC | PC | PC | AgC paste | Copper compound |
| Ex. 41 | PC | PC | PC | Silver compound | AgC paste |
| Comparative Ex. 8 | PC | PC | PC | AgC paste | AgC paste |
| Comparative Ex. 9 | PC | PC | PC | AgC paste | AgC paste |
| Comparative Ex. 10 | PC | PC | PC | AgC paste | AgC paste |
| Comparative Ex. 11 | PC | PC | PC | AgC paste | AgC paste |
| Comparative Ex. 12 | PC | PC | PC | AgC paste | AgC paste |
| Comparative Ex. 13 | PC | PC | PC | AgC paste | AgC paste |
| Comparative Ex. 14 | PC | PC | PC | AgC paste | AgC paste |

TABLE 14

| | Adhesive type | | Radio wave absorbing performance 5.6 GHz | Humidity resistance test 85° C.-85% RH | Water resistance test Treated in water of 80° C. | Processability test Drilling |
|---|---|---|---|---|---|---|
| | Curing method | Main component | Good/poor | 24 h | 24 h | Peel or not |
| Ex. 39 | Light curing adhesive | Acrylic-based | ○ | ○ | ○ | ○ |
| Ex. 40 | Light curing adhesive | Acrylic-based | ○ | ○ | ○ | ○ |
| Ex. 41 | Light curing adhesive | Acrylic-based | ○ | ○ | ○ | ○ |
| Comparative Ex. 8 | Light curing adhesive | Acrylic-based | ○ | x | x | x |
| Comparative Ex. 9 | Hotmelt-type adhesive | EVA-based | ○ | x | x | ○ |
| Comparative Ex. 10 | Hotmelt-type adhesive | Polyamide-based | ○ | ○ | x | x |

TABLE 14-continued

|  | Adhesive type | | Radio wave absorbing performance 5.6 GHz | Humidity resistance test 85° C.-85% RH | Water resistance test Treated in water of 80° C. | Processability test Drilling |
|---|---|---|---|---|---|---|
|  | Curing method | Main component | Good/poor | 24 h | 24 h | Peel or not |
| Comparative Ex. 11 | Hotmelt-type adhesive | Polyurethane-based | ○ | x | x | ○ |
| Comparative Ex. 12 | Hotmelt-type adhesive | Polyester-based | ○ | x | x | ○ |
| Comparative Ex. 13 | Hotmelt-type adhesive | Polyolefin-based | ○ | ○ | x | x |
| Comparative Ex. 14 | Pressure-sensitive adhesive | Acrylic-based | ○ | ○ | x | x |

On samples of Examples 42 through 51 described below and Comparative Example 8 through 14 described above, humidity resistance tests 1 and 2 and a water resistance test were performed as described below. The other tests were performed as described above on these samples.

(Humidity Resistance Test-1)

A sample was put into a constant temperature and humidity chamber of 85° C. and 85% RH and cooled back to room temperature after being treated for a predetermined time period (24 hours, 1000 hours, 2000 hours). The transparency was visually evaluated.

[Visual Evaluation]
○: Good transparency, no change
Δ: Slightly cloudy, visible
x Cloudy, not visible (Humidity Resistance Test-2)

A sample was put into a constant temperature and humidity chamber of 85° C. and 95% RH and cooled back to room temperature after being treated for 250 hours. The transparency was visually evaluated.

[Visual Evaluation]
○: Good transparency, no change
Δ: Slightly cloudy, visible
x: Cloudy, not visible (Water Resistance Test)

A sample was put into a warm bath of 80° C. and cooled back to room temperature after being treated for a predetermined time period (24 hours, 250 hours, 500 hours). The transparency was visually evaluated.

[Visual Evaluation]
○: Good transparency, no change
Δ: Slightly cloudy, visible
x: Cloudy, not visible Example 42

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed. In the "radio wave absorbing performance test", the sample exhibited a good radio wave absorbing performance. In the "adhesive force test", the sample had an adhesive force of 86.4 N. In the "processability test", peeling did not occur. In the "humidity resistance tests-1 and -2", the sample did not become cloudy after being treated respectively for 2000 hours and 250 hours, which is a good result. In the "water resistance test" also, the sample did not become cloudy after 250 hours, which means that the transparency was good.

Example 43

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using a copper compound to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 15.0 N (reflecting layer: copper compound mesh). In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 44

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using a silver compound, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 78.8 N (resisting layer: silver compound loop pattern). In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 45

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PET) using an AgC paste, a dielectric spacer (PC), and a reflecting layer (PET) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had a maximum adhesive force of 20.0 N, at which the PET film was broken. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 250 hours, which means that the transparency was good.

Example 46

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 63.0 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 47

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using a copper compound to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 12.0 N (reflecting layer: copper compound mesh). In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 48

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for a resisting layer (PC) using a silver compound, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 56.0 N (resisting layer: silver compound loop pattern). In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 49

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive". The obtained adhesive composition was used for a resisting layer (PET) using an AgC paste, a dielectric spacer (PC), and a reflecting layer (PET) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had a maximum adhesive force of 20.0 N, at which the PET film was broken. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after 24 hours, which means that the transparency was good.

Example 50

32.1% by weight of urethane (meth)acrylate-based polymerizable oligomer, 42.9% by weight of (meth)acrylate-based polymerizable monomer, 20.0% by weight of acrylamide derivative, 1.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 77.7 N. In the processability test, peeling did not occur. In the humidity resistance test-1, the sample became slightly cloudy after being treated for 1000 hours, which is a good result. In the humidity resistance test-2, the sample became cloudy after being treated for 250 hours; but in the water resistance test, the sample did not become cloudy after 24 hours, which means that the transparency was good.

Example 51

38.6% by weight of urethane (meth)acrylate-based polymerizable oligomer, 51.4% by weight of (meth)acrylate-based polymerizable monomer, 5.0% by weight of silane compound, 1.0% by weight of organic phosphorus compound, and 4.0% by weight of photoinitiator were put into a container, and an adhesive composition was prepared in accordance with the "method for preparing an adhesive". The obtained adhesive composition was used for a resisting layer (PC) using an AgC paste, a dielectric spacer (PC), and a reflecting layer (PC) using an AgC paste to produce a sample in accordance with the "method for producing a light-transmitting radio wave absorber using a light-transmitting adhesive".

Various evaluations were performed in substantially the same manner as in Example 42. The sample exhibited a good radio wave absorbing performance. The sample had an adhesive force of 18.0 N. In the processability test, peeling did not occur. In the humidity resistance test-1, the sample became slightly cloudy after being treated for 1000 hours, which is a good result. In the humidity resistance test-2, the sample became cloudy after being treated for 250 hours; but in the water resistance test, the sample did not become cloudy after 24 hours, which means that the transparency was good.

The structures and measurement results of the samples in Examples 42 through 51 and Comparative Examples 8 through 14 are shown in Tables 15 and 16.

TABLE 15

| | Adhesive type | | Composition of (meth)acrylate adhesive (% by weight) | | | | | |
|---|---|---|---|---|---|---|---|---|
| | Curing method | Main component | Urethane (meth)acrylate polymerizable oligomer | (Meth)acrylate polymerizable monomer | Acrylamide derivative | Silane compound | Organic phosphorus compound | Photo-initiator |
| Ex. 42 | Light curing adhesive | Acrylic-based | 30.0 | 40.0 | 20.0 | 5.0 | 1.0 | 4.0 |
| Ex. 43 | Light curing adhesive | Acrylic-based | 30.0 | 40.0 | 20.0 | 5.0 | 1.0 | 4.0 |
| Ex. 44 | Light curing adhesive | Acrylic-based | 30.0 | 40.0 | 20.0 | 5.0 | 1.0 | 4.0 |
| Ex. 45 | Light curing adhesive | Acrylic-based | 30.0 | 40.0 | 20.0 | 5.0 | 1.0 | 4.0 |
| Ex. 46 | Light curing adhesive | Acrylic-based | 30.4 | 40.6 | 20.0 | 5.0 | | 4.0 |
| Ex. 47 | Light curing adhesive | Acrylic-based | 30.4 | 40.6 | 20.0 | 5.0 | | 4.0 |
| Ex. 48 | Light curing adhesive | Acrylic-based | 30.4 | 40.6 | 20.0 | 5.0 | | 4.0 |
| Ex. 49 | Light curing adhesive | Acrylic-based | 30.4 | 40.6 | 20.0 | 5.0 | | 4.0 |
| Ex. 50 | Light curing adhesive | Acrylic-based | 32.1 | 42.9 | 20.0 | | 1.0 | 4.0 |
| Ex. 51 | Light curing adhesive | Acrylic-based | 38.6 | 51.4 | | 5.0 | 1.0 | 4.0 |
| Comparative Ex. 8 | Light curing adhesive | Acrylic-based | 41.1 | 54.9 | | | | 4.0 |
| Comparative Ex. 9 | Hotmelt-type adhesive | EVA-based | | | | | | |
| Comparative Ex. 10 | Hotmelt-type adhesive | Polyamide-based | | | | | | |
| Comparative Ex. 11 | Hotmelt-type adhesive | Polyurethane-based | | | | | | |
| Comparative Ex. 12 | Hotmelt-type adhesive | Polyester-based | | | | | | |
| Comparative Ex. 13 | Hotmelt-type adhesive | Polyolefin-based | | | | | | |

TABLE 15-continued

| | | | 
|---|---|---|
| Comparative Ex. 14 | Pressure-sensitive adhesive | Acrylic-based |

| | | Structure of pattern-type radio wave absorber | | | | |
|---|---|---|---|---|---|---|
| | | Substrate | | | Conductive compound | |
| | | Resisting layer | Dielectric spacer | Reflecting layer | Resisting layer | Reflecting layer |
| | Ex. 42 | PC | PC | PC | AgC paste | AgC paste |
| | Ex. 43 | PC | PC | PC | AgC paste | Copper compound |
| | Ex. 44 | PC | PC | PC | Silver compound | AgC paste |
| | Ex. 45 | Easily adhesive PET | PC | Easily adhesive PET | AgC paste | AgC paste |
| | Ex. 46 | PC | PC | PC | AgC paste | AgC paste |
| | Ex. 47 | PC | PC | PC | AgC paste | Copper compound |
| | Ex. 48 | PC | PC | PC | Silver compound | AgC paste |
| | Ex. 49 | Easily adhesive PET | PC | Easily adhesive PET | AgC paste | AgC paste |
| | Ex. 50 | PC | PC | PC | AgC paste | AgC paste |
| | Ex. 51 | PC | PC | PC | AgC paste | AgC paste |
| | Comparative Ex. 8 | PC | PC | PC | AgC paste | AgC paste |
| | Comparative Ex. 9 | PC | PC | PC | AgC paste | AgC paste |
| | Comparative Ex. 10 | PC | PC | PC | AgC paste | AgC paste |
| | Comparative Ex. 11 | PC | PC | PC | AgC paste | AgC paste |
| | Comparative Ex. 12 | PC | PC | PC | AgC paste | AgC paste |
| | Comparative Ex. 13 | PC | PC | PC | AgC paste | AgC paste |
| | Comparative Ex. 14 | PC | PC | PC | AgC paste | AgC paste |

TABLE 16

| | Adhesive type | | Radio wave absorbing performance | Humidity resistance test - 1 | | | Humidity resistance test - 2 | Water resistance test Treated in water of 80° C. | | | Adhesive force 180-degree peel strength | Processability test |
|---|---|---|---|---|---|---|---|---|---|---|---|---|
| | Curing method | Main component | 5.6 GHz Good/poor | 85° C.-85% RH | | | 85° C.-95% RH | | | | N/25 mm | Drilling |
| | | | | 24 h | 1000 h | 2000 h | 250 h | 24 h | 250 h | 500 h | | Peel or not |
| Ex. 42 | Light curing adhesive | Acrylic-based | ○ | ○ | ○ | ○ | ○ | ○ | ○ | Δ | 86.4 | ○ |
| Ex. 43 | Light curing adhesive | Acrylic-based | ○ | ○ | ○ | ○ | ○ | ○ | ○ | x | 15.0 (reflecting layer) | ○ |
| Ex. 44 | Light curing adhesive | Acrylic-based | ○ | ○ | ○ | ○ | ○ | ○ | ○ | Δ | 78.8 (resisting layer) | ○ |
| Ex. 45 | Light curing adhesive | Acrylic-based | ○ | ○ | ○ | ○ | ○ | ○ | ○ | Δ | 20.0 (substrate broken) | ○ |
| Ex. 46 | Light curing adhesive | Acrylic-based | ○ | ○ | ○ | Δ | x | ○ | x | x | 63.0 | ○ |
| Ex. 47 | Light curing adhesive | Acrylic-based | ○ | ○ | ○ | Δ | x | ○ | x | x | 12.0 (reflecting layer) | ○ |
| Ex. 48 | Light curing adhesive | Acrylic-based | ○ | ○ | ○ | Δ | x | ○ | x | x | 56.0 (resisting layer) | ○ |
| Ex. 49 | Light curing adhesive | Acrylic-based | ○ | ○ | ○ | Δ | x | ○ | x | x | 20.0 (substrate broken) | ○ |
| Ex. 50 | Light curing adhesive | Acrylic-based | ○ | ○ | Δ | x | x | ○ | x | x | 77.7 | ○ |

TABLE 16-continued

| | Adhesive type | | Radio wave absorbing performance 5.6 GHz Good/poor | Humidity resistance test - 1 85° C.-85% RH | | | Humidity resistance test - 2 85° C.-95% RH 250 h | Water resistance test Treated in water of 80° C. | | | Adhesive force 180-degree peel strength N/25 mm | Processability test Drilling Peel or not |
|---|---|---|---|---|---|---|---|---|---|---|---|---|
| | Curing method | Main component | | 24 h | 1000 h | 2000 h | | 24 h | 250 h | 500 h | | |
| Ex. 51 | Light curing adhesive | Acrylic-based | ○ | ○ | Δ | x | x | ○ | x | x | 18.0 | ○ |
| Comparative Ex. 8 | Light curing adhesive | Acrylic-based | ○ | x | x | x | x | x | x | x | 1.1 | x |
| Comparative Ex. 9 | Hotmelt-type adhesive | EVA-based | ○ | x | x | x | x | x | x | x | 7.1 | ○ |
| Comparative Ex. 10 | Hotmelt-type adhesive | Polyamide-based | ○ | ○ | x | x | x | x | x | x | 2.3 | x |
| Comparative Ex. 11 | Hotmelt-type adhesive | Polyurethane-based | ○ | x | x | x | x | x | x | x | 91.7 | ○ |
| Comparative Ex. 12 | Hotmelt-type adhesive | Polyester-based | ○ | x | x | x | x | x | x | x | 107.3 | ○ |
| Comparative Ex. 13 | Hotmelt-type adhesive | Polyolefin-based | ○ | ○ | x | x | x | x | x | x | 2.5 | x |
| Comparative Ex. 14 | Pressure-sensitive adhesive | Acrylic-based | ○ | ○ | x | x | x | x | x | x | 5.8 | x |

Hereinafter, specific embodiments and effects of a photocurable adhesive according to still another embodiment of the present invention will be specifically described by way of examples and comparative examples. The present invention is not limited to these specific embodiments or examples in any way. The evaluation results described in the examples and the comparative examples were obtained by the following tests.

(Humidity Resistance Test-1)

A sample was put into a constant temperature and humidity chamber of 85° C. and 85% RH and cooled back to room temperature after being treated for a predetermined time period (24 hours, 1000 hours, 2000 hours). The transparency was visually evaluated.

[Visual Evaluation]
○: Good transparency, no change
Δ: Slightly cloudy, visible
x: Cloudy, not visible (Humidity Resistance Test-2)

A sample was put into a constant temperature and humidity chamber of 85° C. and 95% RH and cooled back to room temperature after being treated for 200 hours. The transparency was visually evaluated.

[Visual Evaluation]
○: Good transparency, no change
Δ: Slightly cloudy, visible
x: Cloudy, not visible (Water Resistance Test)

A sample was put into a warm bath of 80° C. and cooled back to room temperature after being treated for a predetermined time period (24 hours, 500 hours). The transparency was visually evaluated.

[Visual Evaluation]
○: Good transparency, no change
Δ: Slightly cloudy, visible
x: Cloudy, not visible (Adhesive Force Test)

The adhesive force of a sample was measured in conformity to the T-peel strength test (JIS K6854-3). Specifically, a PC sheet (thickness: 0.5 mm) and a PC sheet (thickness: 0.5 mm) or a PET film (thickness: 100 μm) as a layer to be attached were bonded together with each of various adhesive compositions to produce a test piece having a width of 25 mm and a length of 200 mm. The peel strength [N/25 mm width] was measured by a tensile tester at a peeling rate of 10 mm/min.

(Processability Test)

A PC sheet (thickness: 0.5 mm) and a PC sheet (thickness: 0.5 mm) or a PET film (thickness: 100 μm) as a layer to be attached were bonded together with each of various adhesive compositions to produce a test piece having a width of 25 mm and a length of 200 mm. Four holes having a diameter of 13.5 mm were made by a table-top drilling machine, and the processing state was visually evaluated.

[Visual Evaluation]
○: The processed surface is not peeled.
Δ: The processed surface is slightly peeled.
x: The processed surface is peeled.

(Method for Preparing an Adhesive)

The components of a (meth)acrylate monomer, a (meth)acrylate oligomer, an acrylamide derivative, a silane compound, an organic phosphorus compound, a photoinitiator and the like were put into a container at each of compositions shown in Table 17, and mixed and heated at 60° C. for 1 hour. Thus, a desired adhesive composition was obtained. The components of the adhesive composition which were used are as follows.

[Components of the Adhesive Composition]

Urethane (meth)acrylate-based polymerizable oligomer: dicyclohexylmethanediisocyanate-derived alicyclic hydrocarbon compound-containing urethane (meth)acrylate-based oligomer (Meth)acrylate-based polymerizable monomer: isobornyl acrylate (produced by Osaka Organic Chemical Industry Ltd.)

Acrylamide derivative: dimethylacrylamide (produced by Kabushiki Kaisha Kojinsha)

Silane compound (3-(2,3-epoxypropoxy)propyl)trimethoxysilane (produced by Shin-Etsu Chemical Co., Ltd.)

Organic phosphorus compound: acrylate phosphate (produced by Nippon Kayaku Co., Ltd.)

Photoinitiator: Irgacure 651 (trade name; produced by Ciba Specialty Chemicals)

(Method for Producing a Photo-Curable Adhesive Sample)

Each of various adhesive compositions was applied on a PC sheet (thickness: 0.5 mm) by a bar coater, and a PC sheet (thickness: 0.5 mm) or a PET film (thickness: 100 μm) was provided thereon by a laminator while being defoamed. This sample was irradiated with a high pressure mercury lamp (500 W) for 90 seconds and was sufficiently cured at a radiation amount of 1 J/cm$^2$. The resultant substance was kept still in a constant temperature and humidity chamber (23° C., 50% RH) for 24 hours and then cut into a piece having a width of 25 mm and a length of 200 mm. This was used as a sample.

[Layers to be Attached]

PC sheet: Polycarbonate sheet (thickness: 0.5 mm) produced by MGC Filsheet Co., Ltd.

PET film: Easily adhesive polyethylene terephthalate (thickness: 100 μm) produced by Toyobo Co., Ltd.

(Method for Producing a Hotmelt-Type Adhesive Sample)

A hotmelt-type adhesive sheet was sandwiched between PC sheets (thickness: 0.5 mm) and pressed at 135° C. for 5 minutes. The resultant substance was kept still in a constant temperature and humidity chamber (23° C., 50% RH) for 24 hours and then cut into a piece having a width of 25 mm and a length of 200 mm. This was used as a sample.

[Hotmelt (HM)-Type Adhesive]

Ethylene vinyl acetate (EVA)-based HM-type adhesive: Elphan OH-501 produced by Nihon Matai, Co., Ltd.

Polyamide-based HM-type adhesive: Elphan NT-120 produced by Nihon Matai, Co., Ltd.

Polyurethane-based HM-type adhesive: Kurangile S-1700 produced by Kurabo Industries, Ltd.

Polyester-based HM-type adhesive: Kuranbetter G-6 produced by Kurabo Industries, Ltd.

Polyolefin-based HM-type adhesive: Kuranbetter A-1510 produced by Kurabo Industries, Ltd.

(Method for Producing a Pressure-Sensitive Adhesive Sample)

A pressure-sensitive adhesive sheet was sandwiched between PC sheets (thickness: 0.5 mm) and pressed for 5 minutes. The resultant substance was kept still in a constant temperature and humidity chamber (23° C., 50% RH) for 24 hours and then cut into a piece having a width of 25 mm and a length of 200 mm. This was used as a sample.

[Pressure-Sensitive Adhesive]

Acrylic-based pressure-sensitive adhesive sheet: CS-9621 produced by Nitto Denko Corporation

Example 52

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the method for preparing an adhesive. Using the obtained adhesive composition, a PC laminate body sample was produced in accordance with the method for producing a sample.

As a result of performing various evaluations, the following was found. The sample had an adhesive force of 96.0 N. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 500 hours, which means that the transparency was good.

Example 53

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organic phosphorus compound, and 4.0% by weight of photoinitiator were put into a container, and an adhesive composition was prepared in accordance with the method for preparing an adhesive. Using the obtained adhesive composition, a PET laminate body sample was produced in accordance with the method for producing a sample.

As a result of performing various evaluations, the following was found. The sample had a maximum adhesive force of 20.0 N, at which the PET film was broken. In the processability test, peeling did not occur. In the humidity resistance tests-1 and -2, the sample did not become cloudy after being treated respectively for 2000 hours and 250 hours, which is a good result. In the water resistance test also, the sample did not become cloudy after 500 hours, which means that the transparency was good.

Example 54

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the method for preparing an adhesive. Using the obtained adhesive composition, a PC laminate body sample was produced in accordance with the method for producing a sample.

As a result of performing various evaluations, the following was found. The sample had an adhesive force of 70.0 N. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after being treated for 24 hours.

Example 55

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the method for preparing an adhesive. Using the obtained adhesive composition, a PET laminate body sample was produced in accordance with the method for producing a sample.

As a result of performing various evaluations, the following was found. The sample had a maximum adhesive force of 20.0 N, at which the PET film was broken. In the processability test, peeling did not occur. In the humidity resistance test-1, the sample became slightly cloudy after being treated for 2000 hours, which is a good result. In the humidity resistance test-2, the sample became cloudy after being treated for 250 hours; but in the water resistance test, the sample did not become cloudy after being treated for 24 hours.

Example 56

32.1% by weight of urethane (meth)acrylate-based polymerizable oligomer, 42.9% by weight of (meth)acrylate-based polymerizable monomer, 20.0% by weight of acrylamide derivative, 1.0% by weight of organic phosphorus compound, and 4.0% by weight of photoinitiator were put into a container, and an adhesive composition was prepared in accordance with the method for preparing an adhesive. Using the obtained adhesive composition, a PC laminate body sample was produced in accordance with the method for producing a sample.

As a result of performing various evaluations, the following was found. The sample had an adhesive force of 86.3 N. In the processability test, peeling did not occur. In the humidity resistance test-1, the sample became slightly cloudy after being treated for 1000 hours, which is a good result. In the humidity resistance test-2, the sample became cloudy after being treated for 250 hours; but in the water resistance test, the sample did not become cloudy after being treated for 24 hours.

Comparative Example 15

41.1% by weight of urethane (meth)acrylate-based polymerizable oligomer, 54.9% by weight of (meth)acrylate-based polymerizable monomer, and 4.0% by weight of photoinitiator were put into a container, and an adhesive composition was prepared in accordance with the method for preparing an adhesive. Using the obtained adhesive composition, a PC laminate body sample was produced in accordance with the method for producing a sample.

As a result of performing various evaluations, the following was found. The sample had an adhesive force of 1.2 N. In the processability test, peeling occurred. In the humidity resistance test-1, the sample became cloudy after being treated for 24 hours. In the humidity resistance test-2, the sample became cloudy after being treated for 250 hours. In the water resistance test also, the sample became cloudy after being treated for 24 hours.

Comparative Example 16

An ethylene vinyl acetate (EVA)-based hotmelt-type adhesive was sandwiched between PC sheets to produce a PC laminate body sample in accordance with the method for producing a hotmelt-type adhesive sample.

As a result of performing various evaluations, the following was found. The sample had an adhesive force of 7.9 N. In the processability test, peeling did not occur. In the humidity resistance test-1, the sample became cloudy after being treated for 24 hours. In the humidity resistance test-2, the sample became cloudy after being treated for 250 hours. In the water resistance test also, the sample became cloudy after being treated for 24 hours.

Comparative Example 17

A polyamide-based hotmelt-type adhesive was sandwiched between PC sheets to produce a PC laminate body sample in accordance with the method for producing a hot-melt-type adhesive sample.

As a result of performing various evaluations, the following was found. The sample had an adhesive force of 2.6 N. In the processability test, the processed surface was peeled. In the humidity resistance test-1, the sample became cloudy after being treated for 1000 hours. In the humidity resistance test-2, the sample became cloudy after being treated for 250 hours. In the water resistance test also, the sample became cloudy after being treated for 24 hours.

Comparative Example 18

A polyurethane-based hotmelt-type adhesive was sandwiched between PC sheets to produce a PC laminate body sample in accordance with the method for producing a hot-melt-type adhesive sample.

As a result of performing various evaluations, the following was found. The sample had an adhesive force of 101.9 N. In the processability test, peeling did not occur. In the humidity resistance test-1, the sample became cloudy after being treated for 24 hours. In the humidity resistance test-2, the sample became cloudy after being treated for 250 hours. In the water resistance test also, the sample became cloudy after being treated for 24 hours.

Comparative Example 19

A polyester-based hotmelt-type adhesive was sandwiched between PC sheets to produce a PC laminate body sample in accordance with the method for producing a hotmelt-type adhesive sample.

As a result of performing various evaluations, the following was found. The sample had an adhesive force of 119.2 N. In the processability test, peeling did not occur. In the humidity resistance test-1, the sample became cloudy after being treated for 24 hours. In the humidity resistance test-2, the sample became cloudy after being treated for 250 hours. In the water resistance test also, the sample became cloudy after being treated for 24 hours.

Comparative Example 20

A polyolefin-based hotmelt-type adhesive was sandwiched between PC sheets to produce a PC laminate body sample in accordance with the method for producing a hotmelt-type adhesive sample.

As a result of performing various evaluations, the following was found. The sample had an adhesive force of 2.8 N. In the processability test, the processed surface was peeled. In the humidity resistance test-1, the sample became cloudy after being treated for 1000 hours. In the humidity resistance test-2, the sample became cloudy after being treated for 250 hours. In the water resistance test also, the sample became cloudy after being treated for 24 hours.

Comparative Example 21

An acrylic-based pressure-sensitive adhesive sheet was sandwiched between PC sheets to produce a PC laminate body sample in accordance with the method for producing a pressure-sensitive adhesive sample.

As a result of performing various evaluations, the following was found. The sample had an adhesive force of 6.4 N. In the processability test, the processed surface was peeled. In the humidity resistance test-1, the sample became cloudy after being treated for 1000 hours. In the humidity resistance test-2, the sample became cloudy after being treated for 250 hours. In the water resistance test also, the sample became cloudy after being treated for 24 hours.

The structures and measurement results of the samples in Examples 52 through 56 and Comparative Examples 15 through 21 are shown in Tables 17 and 18.

TABLE 17

| | Adhesive type | | | Composition of (meth)acrylate adhesive (% by weight) | | | | | |
|---|---|---|---|---|---|---|---|---|---|
| | Curing method | Main component | Layer to be attached | Urethane (meth)acrylate polymerizable oligomer | (Meth)acrylate polymerizable monomer | Acrylamide derivative | Silane compound | Organic phosphorus compound | Photo-initiator |
| Ex. 52 | Light curing adhesive | Acrylic-based | PC | 30.0 | 40.0 | 20.0 | 5.0 | 1.0 | 4.0 |
| Ex. 53 | Light curing adhesive | Acrylic-based | Easily adhesive PET | 30.0 | 40.0 | 20.0 | 5.0 | 1.0 | 4.0 |
| Ex. 54 | Light curing adhesive | Acrylic-based | PC | 30.4 | 40.6 | 20.0 | 5.0 | | 4.0 |
| Ex. 55 | Light curing adhesive | Acrylic-based | Easily adhesive PET | 30.4 | 40.6 | 20.0 | 5.0 | | 4.0 |
| Ex. 56 | Light curing adhesive | Acrylic-based | PC | 32.1 | 42.9 | 20.0 | | 1.0 | 4.0 |
| Comparative Ex. 15 | Light curing adhesive | Acrylic-based | PC | 41.1 | 54.9 | | | | 4.0 |
| Comparative Ex. 16 | Hotmelt-type adhesive | EVA-based | PC | | | | | | |
| Comparative Ex. 17 | Hotmelt-type adhesive | Polyamide-based | PC | | | | | | |
| Comparative Ex. 18 | Hotmelt-type adhesive | Polyurethane-based | PC | | | | | | |
| Comparative Ex. 19 | Hotmelt-type adhesive | Polyester-based | PC | | | | | | |
| Comparative Ex. 20 | Hotmelt-type adhesive | Polyolefin-based | PC | | | | | | |
| Comparative Ex. 21 | Pressure-sensitive adhesive | Acrylic-based | PC | | | | | | |

TABLE 18

| | Adhesive type | | Layer to be attached | Humidity resistance test - 1 85° C.-85% RH | | | Humidity resistance test - 2 85° C.-95% RH | Water resistance test Treated in water of 80° C. | | Adhesive force T-peel strength | Processability test |
|---|---|---|---|---|---|---|---|---|---|---|---|
| | Curing method | Main component | | 24 h | 1000 h | 2000 h | 250 h | 24 h | 500 h | N/25 mm | Ø13.5 drill Peel or not |
| Ex. 52 | Light curing adhesive | Acrylic-based | PC | ○ | ○ | ○ | ○ | ○ | ○ | 96.0 | ○ |
| Ex. 53 | Light curing adhesive | Acrylic-based | Easily adhesive PET | ○ | ○ | ○ | ○ | ○ | ○ | 20 (substrate broken) | ○ |
| Ex. 54 | Light curing adhesive | Acrylic-based | PC | ○ | ○ | Δ | x | ○ | x | 70.0 | ○ |
| Ex. 55 | Light curing adhesive | Acrylic-based | Easily adhesive PET | ○ | ○ | Δ | x | ○ | x | 20 (substrate broken) | ○ |
| Ex. 56 | Light curing adhesive | Acrylic-based | PC | ○ | Δ | x | x | ○ | x | 86.3 | ○ |
| Comparative Ex. 15 | Light curing adhesive | Acrylic-based | PC | x | x | x | x | x | x | 1.2 | x |
| Comparative Ex. 16 | Hotmelt-type adhesive | EVA-based | PC | x | x | x | x | x | x | 7.9 | ○ |
| Comparative Ex. 17 | Hotmelt-type adhesive | Polyamide-based | PC | ○ | x | x | x | x | x | 2.6 | x |
| Comparative Ex. 18 | Hotmelt-type adhesive | Polyurethane-based | PC | x | x | x | x | x | x | 101.9 | ○ |
| Comparative Ex. 19 | Hotmelt-type adhesive | Polyester-based | PC | x | x | x | x | x | x | 119.2 | ○ |
| Comparative Ex. 20 | Hotmelt-type adhesive | Polyolefin-based | PC | ○ | x | x | x | x | x | 2.8 | x |
| Comparative Ex. 21 | Pressure-sensitive adhesive | Acrylic-based | PC | ○ | x | x | x | x | x | 6.4 | x |

INDUSTRIAL APPLICABILITY

A light-transmitting electromagnetic-shielding laminate according to a preferable embodiment of the present invention does not become cloudy in a high temperature and high humidity condition; prevents long-term deterioration such as yellowing, peeling of the laminate body, deterioration of the functionality or the like which is caused by quality deterioration due to the environment of being exposed to wind and rain or ultraviolet of sunlight for a long time; has a sufficient adhesiveness to protect the laminate body against peeling when being processed with cutting, drilling or the like; and has good transparency or visibility. Owing to these, the light-transmitting electromagnetic-shielding laminate according to the present invention is usable in a wide range of electromagnetic wave-shielding fields which require, at the same time, superb electromagnetic wave-shielding performance, superb transparency or visibility, and very high durability (humidity resistance, water resistance, weather resistance, adhesive force, processability). For example, the light-transmitting electromagnetic-shielding laminate according to the present invention is usable for the following applications which need to be highly durable: car navigation systems usable in vehicles, mobile phones, mobile information terminals, and mobile game devices, as well as liquid crystal displays and plasma displays for advertisement, and displays of vending machines and ticket machines which are used outdoors.

A light-transmitting radio wave absorber according to a preferable embodiment of the present invention does not become cloudy in a high temperature and high humidity condition; prevents long-term deterioration such as yellowing, peeling of the laminate body, deterioration of the functionality or the like which is caused by quality deterioration due to the environment of being exposed to wind and rain or ultraviolet of sunlight for a long time; has a sufficient adhesiveness to protect the laminate body against peeling when being processed with cutting, drilling or the like; and has good transparency or visibility. Owing to these, the light-transmitting radio wave absorber according to the present invention is usable in a wide range of fields using radio wave communication systems at sites which require, at the same time, superb radio wave absorbing performance, photo-transmittance and weather resistance. For example, the light-transmitting radio wave absorber according to the present invention is usable in freeway toll gates, gas stations, first food stores, and car parks which require good visibility and weather resistance, as well as airports, train stations, hospitals, and offices which require good scenic views and lighting.

An adhesive composition according to a preferable embodiment of the present invention does not become cloudy in a high temperature and high humidity condition; prevents long-term deterioration such as yellowing, peeling of the laminate body, deterioration of the functionality or the like which is caused by quality deterioration due to the environment of being exposed to wind and rain or ultraviolet of sunlight for a long time; has a sufficient adhesiveness to protect the laminate body against peeling when being processed with cutting, drilling or the like; and has good transparency or visibility. Owing to these, the adhesive composition according to the present invention is usable in a wide range of fields which require, at the same time, superb transparency or visibility and very high durability (humidity resistance, water resistance, weather resistance, adhesive force, processability). For example, the adhesive composition according to the present invention is usable for the following applications which need to be highly durable: car navigation systems usable in vehicles, mobile phones, mobile game devices, DVDs, and Blue-ray discs, as well as carports, light-transmitting resin sound-proof walls, materials for windows with security equipment, and light-transmitting radio wave absorbing laminate bodies which are used outdoors.

The invention claimed is:

1. A light-transmitting electromagnetic-shielding laminate, wherein two or more layers including an electromagnetic wave-shielding layer are laminated by a (meth)acrylate-based adhesive composition comprising a (meth)acrylate monomer, a (meth)acrylate oligomer, and at least one selected from the group consisting of an acrylamide derivative, an epoxy-functional silane compound and an organic phosphorus compound.

2. The light-transmitting electromagnetic-shielding laminate according to claim 1, wherein the acrylamide derivative is alkylacrylamide and/or alkylmethacrylamide.

3. The light-transmitting electromagnetic-shielding laminate according to claim 1, wherein the organic phosphorus compound is an acrylate phosphate compound.

4. The light-transmitting electromagnetic-shielding laminate according to claim 1, wherein the (meth)acrylate oligomer is at least one (meth)acrylate oligomer selected from urethane (meth)acrylate oligomer, polyester (meth)acrylate oligomer, epoxy (meth)acrylate oligomer, and polyol(meth)acrylate oligomer.

5. The light-transmitting electromagnetic-shielding laminate according to claim 1, wherein the (meth)acrylate-based adhesive composition is a solvent-free (meth)acrylate-based adhesive composition.

6. The light-transmitting electromagnetic-shielding laminate according to claim 1, wherein the (meth)acrylate-based adhesive composition is a photo-curable (meth)acrylate-based adhesive composition which is curable by visible light, ultraviolet (UV) or electron beam (EB).

7. The light-transmitting electromagnetic-shielding laminate according to claim 1, wherein the (meth)acrylate-based adhesive composition is a thermosetting or hotmelt-type (meth)acrylate-based adhesive composition.

8. The light-transmitting electromagnetic-shielding laminate according to claim 1, wherein the electromagnetic wave-shielding layer is either one of a metal thin film mesh, a metal fabric mesh, a conductive fiber mesh, and a conductive printing mesh.

9. The light-transmitting electromagnetic-shielding laminate according to claim 8, wherein a base substrate of each of the metal thin film mesh and the conductive printing mesh contains either one light-transmitting organic polymer material among a polycarbonate resin, a polyethylene terephthalate resin, and a polyester resin.

10. The light-transmitting electromagnetic-shielding laminate according to claim 1, which has, on one or both of surfaces thereof, a cover film containing at least one of an antioxidant, an ultraviolet absorber, and a photostabilizer.

11. The light-transmitting electromagnetic-shielding laminate according to claim 1, which contains light-transmitting glass or a light-transmitting organic polymer material.

12. The light-transmitting electromagnetic-shielding laminate according to claim 11, wherein the light-transmitting organic polymer material contains at least one selected from a polycarbonate resin, a polyethylene terephthalate resin, and a polyester resin.

13. A shielding material for a display, comprising the light-transmitting electromagnetic-shielding laminate according to claim 1.

* * * * *